United States Patent
Miyake et al.

(10) Patent No.: US 10,541,539 B1
(45) Date of Patent: Jan. 21, 2020

(54) CONVERTER, INVERTER, AC MOTOR DRIVING APPARATUS, AND AIR CONDITIONER USING THE SAME

(71) Applicant: Samsung Electronics Co., Ltd., Gyeonggi-do (KR)

(72) Inventors: Hiroyuki Miyake, Kanagawa (JP); Seisaku Oosako, Kanagawa (JP); Masaki Ono, Kanagawa (JP); Yasuyuki Yamada, Kanagawa (JP); Yuichi Takeda, Kanagawa (JP)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/524,994

(22) PCT Filed: Aug. 18, 2015

(86) PCT No.: PCT/KR2015/008607
§ 371 (c)(1),
(2) Date: Dec. 6, 2018

(87) PCT Pub. No.: WO2016/072597
PCT Pub. Date: May 12, 2016

(30) Foreign Application Priority Data

Nov. 5, 2014  (JP) ................................ 2014-225251
Nov. 28, 2014 (JP) ................................ 2014-240830
(Continued)

(51) Int. Cl.
*H02M 1/32* (2007.01)
*H02J 5/00* (2016.01)

(52) U.S. Cl.
CPC ................. *H02J 5/00* (2013.01); *H02M 1/32* (2013.01)

(58) Field of Classification Search
CPC ............ H02M 1/32; H02M 5/40; H02M 5/45; H02M 5/4505; H02M 5/451; H02M 7/125;
(Continued)

(56) References Cited

U.S. PATENT DOCUMENTS 5,270,913 A * 12/1993 Limpaecher .............. H02J 3/18
363/140
6,194,885 B1 * 2/2001 Oshima ............... H02M 1/4225
323/285
(Continued)

FOREIGN PATENT DOCUMENTS

| JP | 2012147571 A | 8/2012 |
| JP | 2014017990 A | 1/2014 |
| KR | 20120018406 A | 3/2012 |

OTHER PUBLICATIONS

Foreign Communication From a Related Counterpart Application, PCT Application No. PCT/KR2015/008607, International Search Report dated Nov. 30, 2015, 3 pages.
(Continued)

*Primary Examiner* — Adolf D Berhane

(57) ABSTRACT

A converter includes a converter circuit including a rectifying section to rectify an alternating current (AC) voltage and a smoothing section to smooth a direct current (DC) voltage rectified by the rectifying section, a diagnostic device configured to diagnose an abnormality of the converter circuit, an inrush current preventing section configured to prevent inrush current from being supplied to the smoothing section, and a switching section configured to supply the AC voltage to the converter circuit through a path different from a voltage supply path of the inrush current preventing section, wherein the diagnostic device determines an abnormal
(Continued)

region of the converter circuit by controlling the inrush current preventing section and the switching section.

18 Claims, 29 Drawing Sheets

(30) Foreign Application Priority Data

| Nov. 28, 2014 | (JP) | ................................. 2014-240831 |
|---|---|---|
| Dec. 9, 2014 | (JP) | ................................. 2014-248610 |
| Dec. 11, 2014 | (JP) | ................................. 2014-250589 |
| Dec. 11, 2014 | (JP) | ................................. 2014-250590 |
| Feb. 10, 2015 | (JP) | ................................. 2015-024489 |
| Jul. 17, 2015 | (KR) | ......................... 10-2015-0101463 |

(58) Field of Classification Search
CPC ...... G01R 19/22; G01R 19/165; G01R 31/34; G01R 31/36; G01R 31/327; G01R 31/28; G01R 31/08

See application file for complete search history.

(56) References Cited

U.S. PATENT DOCUMENTS

| 6,356,426 | B1* | 3/2002 | Dougherty | ............. | H02H 3/006 |
|---|---|---|---|---|---|
| | | | | | 361/102 |
| 2005/0231146 | A1* | 10/2005 | De Frutos | ................. | H02P 7/06 |
| | | | | | 318/400.23 |
| 2007/0170910 | A1* | 7/2007 | Chang | ...................... | H01C 1/16 |
| | | | | | 333/172 |
| 2007/0241616 | A1* | 10/2007 | Lai | .......................... | H02J 9/062 |
| | | | | | 307/66 |
| 2012/0063178 | A1* | 3/2012 | Fujita | ................... | H02M 5/4585 |
| | | | | | 363/37 |
| 2014/0079960 | A1* | 3/2014 | Yun | .......................... | H02J 7/34 |
| | | | | | 429/7 |
| 2014/0354054 | A1* | 12/2014 | Katou | ....................... | H02J 1/00 |
| | | | | | 307/43 |
| 2016/0380571 | A1* | 12/2016 | Yoshida | ............... | H02H 7/1216 |
| | | | | | 318/504 |
| 2017/0310208 | A1* | 10/2017 | Bae | .......................... | H02P 1/04 |
| 2018/0309402 | A1* | 10/2018 | Yoshida | .................. | H02P 27/06 |
| 2018/0328999 | A1* | 11/2018 | Tashima | ................. | G01R 31/42 |

OTHER PUBLICATIONS

Foreign Communication From a Related Counterpart Application, PCT Application No. PCT/KR2015/008607, Partial Translation of the International Search Report dated Nov. 30, 2015, 2 pages.

Foreign Communication From a Related Counterpart Application, PCT Application No. PCT/KR2015/008607, Written Opinion dated Nov. 30, 2015, 5 pages.

* cited by examiner (A)

(B)

| Vu | Vv | Vw | DISCONNECTION REGION |
|---|---|---|---|
| H | H | H | NO |
| H | H | L | EXTERNAL W PHASE |
| L | H | H | EXTERNAL V PHASE |
| L | H | L | EXTERNAL U PHASE OR EXTERNAL V AND W PHASE |
| L | L | L | INTERNAL U PHASE |

CONVERTER, INVERTER, AC MOTOR DRIVING APPARATUS, AND AIR CONDITIONER USING THE SAME

CROSS-REFERENCE TO RELATED APPLICATIONS

The present application relates to and claims the benefit 35 U.S.C. § 365 to International Patent Application No. PCT/KR2015/008607, filed on Aug. 18, 2015 entitled "CONVERTER, INVERTER, DEVICE FOR DRIVING ALTERNATING CURRENT MOTOR, AND AIR CONDITION USING SAME," which claims priority to Korean Patent Application filed on Jul. 17, 2015 in the Korean Intellectual Property Office and assigned Serial No. 10-2015-0101463, Japanese Patent Application filed on Feb. 10, 2015 in the Japanese Patent Office and assigned Serial No. 2015-024489, Japanese Patent Application filed on Dec. 11, 2014 in the Japanese Patent Office and assigned Serial No. 2014-250589, Japanese Patent Application filed on Dec. 11, 2014 in the Japanese Patent Office and assigned Serial No. 2014-250590, Japanese Patent Application filed on Dec. 9, 2014 in the Japanese Patent Office and assigned Serial No. 2014-248610, Japanese Patent Application filed on Nov. 28, 2014 in the Japanese Patent Office and assigned Serial No. 2014-240831, Japanese Patent Application filed on Nov. 28, 2014 in the Japanese Patent Office and assigned Serial No. 2014-240830, and Japanese Patent Application filed on Nov. 5, 2014 in the Japanese Patent Office and assigned Serial No. 2014-225251, each of which are incorporated herein by reference into the present disclosure as if fully set forth herein.

TECHNICAL FIELD

Disclosed are a converter having a fault diagnosis function, an inverter, an alternating current (AC) motor driving apparatus, and an air conditioner using the same.

BACKGROUND ART

A conventional alternating current (AC) motor driving apparatus has a converter circuit for converting alternating current (AC) into direct current (DC), and an inverter circuit for converting DC into AC. The converter circuit includes a rectifying section for rectifying an AC voltage and a smoothing section (for example, a DC link capacitor) for smoothing a DC voltage rectified by the rectifying section.

In order to diagnose a fault of the smoothing section of the converter circuit, a diagnostic method using an output of an inverter circuit has been considered as in Patent Document 1.

However, in the diagnostic method, when another part of the converter circuit has a fault, a fault diagnosis may be wrongly occur due to failure to obtain a normal output from the inverter circuit.

PRIOR ART LITERATURE

Patent Literature

[Patent Document 1] Japanese Unexamined Patent Publication No. 2014-11952

DISCLOSURE

Technical Problem

The disclosed embodiments aim to determine abnormal regions of a converter and an inverter and accurately identify an abnormal region of an AC motor driving apparatus by using the converter, the inverter, the AC motor driving apparatus, and an air conditioner.

Technical Solution

According to an aspect of the present invention, there is provided a converter including: a converter circuit including a rectifying section to rectify an alternating current (AC) voltage and a smoothing section to smooth a direct current (DC) voltage rectified by the rectifying section; a diagnostic device configured to diagnose an abnormality of the converter circuit, an inrush current preventing section configured to prevent inrush current from being supplied to the smoothing section; and a switching section configured to supply the AC voltage to the converter circuit through a path different from a voltage supply path of the inrush current preventing section, wherein the diagnostic device determines an abnormal region of the converter circuit by controlling the inrush current preventing section and the switching section.

The converter may further include: an AC voltage detecting section configured to detect the AC voltage; and a DC voltage detecting section configured to detect the DC voltage, wherein the diagnostic device may determine the abnormal region of the converter circuit based on the AC voltage or the DC voltage.

The diagnostic device may turn off the inrush current preventing section and turn off the switching section, and may determine an abnormality of the DC voltage detecting section based on the DC voltage.

The diagnostic device may turn on the inrush current preventing section and turn off the switching section, and may determine the abnormal region of the converter circuit based on the DC voltage and the AC voltage.

The diagnostic device may turn off the inrush current preventing section and turn on the switching section, and may determine the abnormal region of the converter circuit.

The diagnostic device may discharge the smoothing section for a predetermined time by controlling the inrush current preventing section and the switching section, and may determine an abnormality of the smoothing section depending on whether a DC voltage detected by the DC voltage detecting section is lower than a predetermined reference value.

The converter circuit may further include a reactor installed between the rectifying section and the smoothing section, wherein the diagnostic device may perform a voltage drop on a DC voltage charged in the smoothing section, and diagnose an abnormality of the reactor by comparing a DC voltage detected by the DC voltage detecting section before the voltage drop, a DC voltage detected by the DC voltage detecting section after the voltage drop, and a DC voltage obtained after the reactor is electrically connected by turning on the switching section.

The converter circuit may further include an AC voltage phase detecting section configured to detect a phase of the AC voltage, and a DC voltage detecting section configured to detect the DC voltage, wherein the diagnostic device may determine the abnormal region of the converter circuit based on an AC voltage output pattern detected by the AC voltage phase detecting section and a DC voltage detected by the DC voltage detecting section.

The converter may further include: a power input section configured to input an AC voltage; a coil installed between the power input section and the smoothing section; a AC voltage detecting section configured to detect the AC voltage input by the power input section; and a DC voltage detecting section configured to measure the DC voltage which is smoothed by the smoothing section, wherein the diagnostic device may control the power input section and the inrush current preventing section, and diagnose a normality, a short-circuit fault, or a disconnection of the coil by using the AC voltage detected by the AC voltage detecting section or the DC voltage detected by the DC voltage detecting section.

According to another aspect of the present invention, there is provided an inverter including: an inverter output section including a plurality of upper switch elements and a plurality of lower switch elements serially connected to the plurality of upper switch elements, respectively; a plurality of terminals connected to respective connection points of the upper switch element and the lower switch elements and to which an external load is connected; and a disconnection determining section configured to, when the plurality of lower switch elements are turned off and one of the plurality of upper switch elements is turned on, determine whether the inverter output section or the external load is disconnected based on a voltage of each of the terminals.

According to another aspect of the present invention, there is provided an inverter including: an inverter circuit including an upper switch element and a lower switch element connected in series to the upper switch element, the inverter circuit connected to an alternating current (AC) motor; and a diagnostic device configured to determine an abnormality of the inverter circuit by controlling turn-on and turn-off of the upper switch element and the lower switch element.

The inverter may further include: a bootstrap circuit which is charged by turning on the lower switch element and drives the upper switch element; and a capacitor voltage detecting section configured to detect a voltage charged in a capacitor of the bootstrap circuit, wherein the diagnostic device may diagnose an abnormality of the inverter circuit, an abnormality of the AC motor, or an abnormality of the connection by using the voltage detected by the capacitor voltage detecting section.

The inverter may further include a current detecting section configured to detect current flowing through the inverter circuit, wherein the diagnostic device may turn on or turn off the upper switch element and the lower switch element, and diagnose a short-circuit fault of the AC motor or a short-circuit fault of the connection based on current obtained from the current detecting section and diagnose an open-circuit fault of each of the switch elements based on a measurement result pattern of the current detected by the current detecting section.

According to another aspect of the present invention, there is provided an alternating current (AC) motor driving apparatus including: a converter circuit configured to convert an AC voltage output by an AC power supply to a direct current (DC) voltage; an inverter circuit configured to convert the DC voltage output from the converter circuit to an AC voltage by using a switch element, the inverter circuit connected to an AC motor; and a diagnostic device configured to diagnose an abnormality of the converter circuit, an abnormality of the inverter circuit, an abnormality of the AC motor, or an abnormality of the connection, wherein the diagnostic device diagnoses an abnormality of the converter circuit, an open-circuit fault of the switch element of the inverter circuit, and an abnormality of the AC motor or the connection.

According to another aspect of the present invention, there is provided an air conditioner including: a converter circuit including a rectifying section configured to rectify an alternating current (AC) voltage and a smoothing section configured to smooth a direct voltage (DC) voltage rectified by the rectifying section; a diagnostic device configured to diagnose an abnormality of the converter circuit; an inrush current preventing section configured to prevent an inrush current from being supplied into the smoothing section; and a switching section configured to supply the AC voltage to the converter circuit through a path different from a voltage supply path of the inrush current preventing section, wherein the diagnostic device determines an abnormal region of the converter circuit by controlling the inrush current preventing section and the switching section.

Advantageous Effects

According to the above-described aspects of the present invention, the use of the converter, the inverter, the AC motor driving apparatus and the air conditioner according to various aspects as described above enables abnormal regions of the converter, the inverter, and the AC motor driving apparatus to be diagnosed by utilizing the existing circuit configuration without using any other device.

BEST MODE FOR INVENTION

Hereinafter, a converter according to the first embodiment will be described with reference to the drawings.

Figure 1:
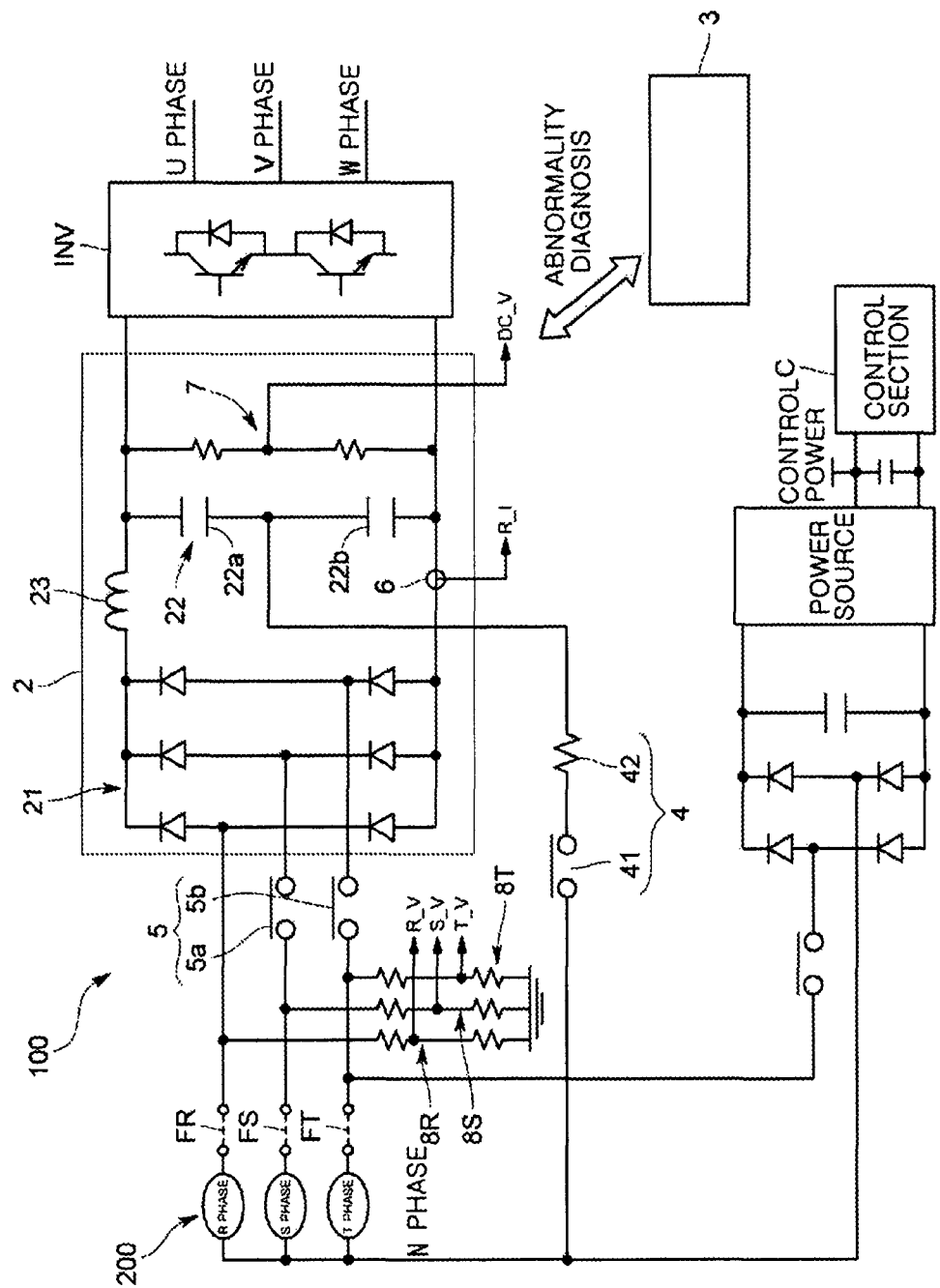
FIG. 1 is a control schematic diagram illustrating a converter according to the first embodiment
Figure 2:
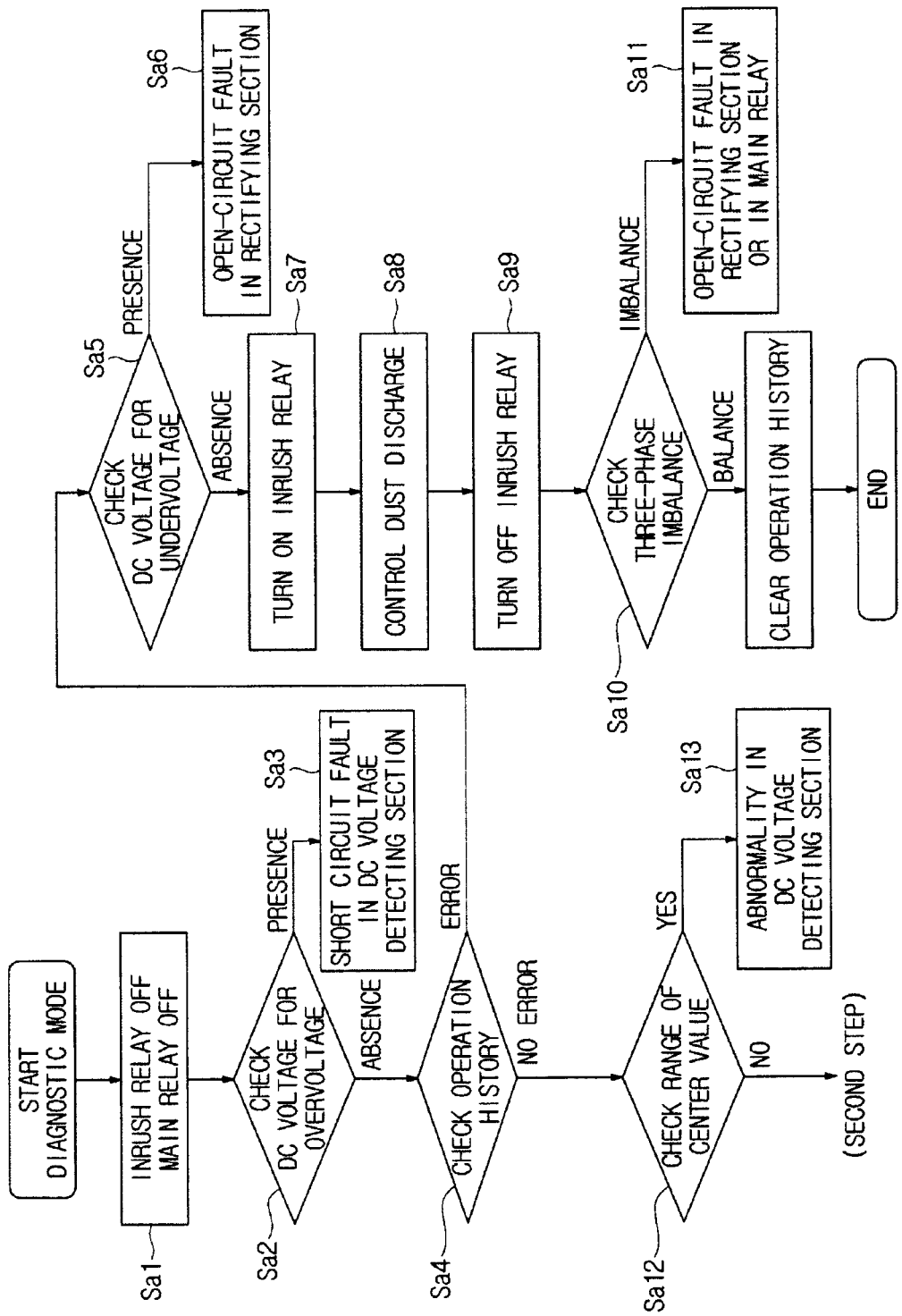
FIG. 2 is a flowchart showing a first step operation of the converter according to the first embodiment.
Figure 3:
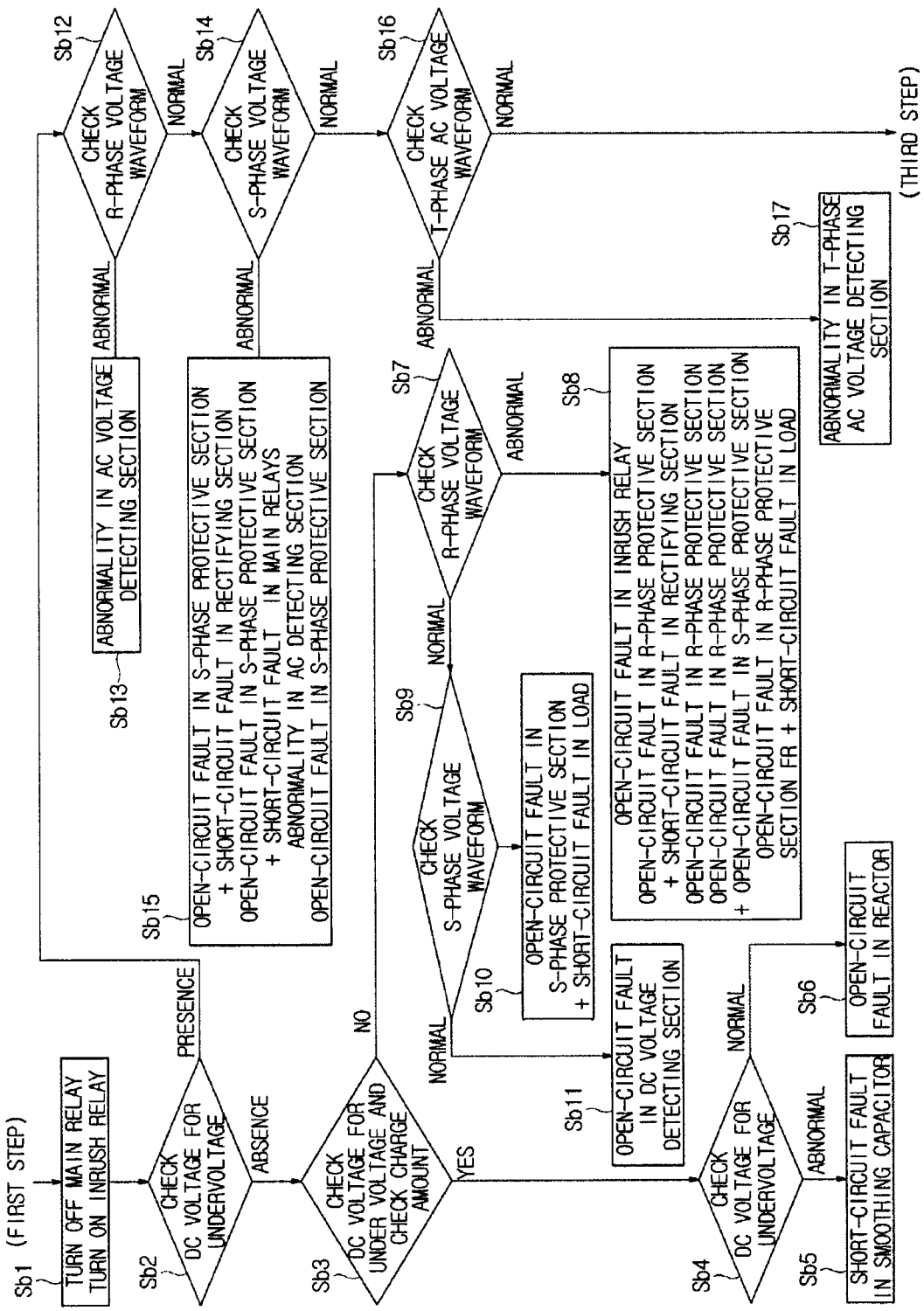
FIG. 3 is a flowchart showing a second step operation of the converter according to the first embodiment.
Figure 4:
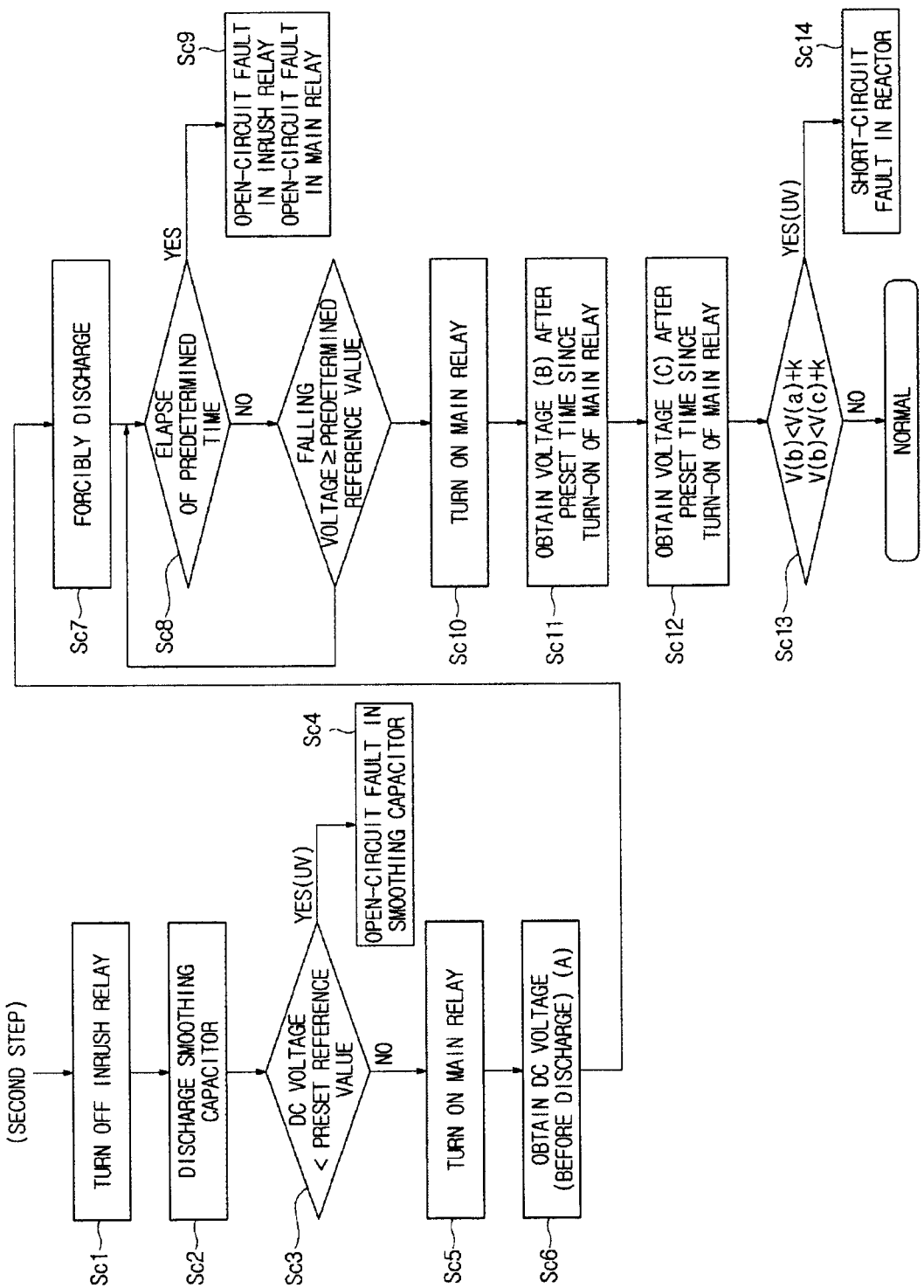
FIG. 4 is a flowchart showing a third step operation of the converter according to the first embodiment.

FIG. 1 is a control schematic diagram illustrating a converter according to the first embodiment, FIG. 2 is a flowchart showing a first step operation of the converter according to the first embodiment, FIG. 3 is a flowchart showing a second step operation of the converter according to the first embodiment, and FIG. 4 is a flowchart showing a third step operation of the converter according to the first embodiment.

The converter 100 according to the first embodiment is used in an AC motor driving apparatus that is configured to supply three-phase AC voltages (U phase, V phase, W phase) to a three phase AC electric motor, for example, a three phase motor, and drive the motor. Referring to FIG. 1, the converter 100 converts three-phase AC voltages (a R phase, a S phase, and a T phase) output from a three-phase AC power supply 200 (including a R phase power supply, a S phase power supply, and a T phase power supply) into a DC voltage, and supplies the DC voltage to an inverter circuit INV.

In detail, the converter 100 according to the first embodiment includes a converter circuit 2 to convert three-phase AC voltages of the three-phase AC power source 200 into a DC voltage and a diagnostic device 3 to diagnose an abnormality of the converter circuit 2.

The converter circuit 2 includes a rectifying section 21 to rectify the three-phase AC voltage and a smoothing section 22 to smooth a DC voltage rectified by the rectifying section 21.

The rectifying section 21 is a three-phase full-bridge diode circuit.

The smoothing section 22 is a smoothing coil capacitor connected between output terminals of the rectifying section 21. The smoothing section 22 may be implemented as two smoothing coil capacitors 22a and 22b connected in series between the output terminals of the rectifying section 21.

The converter 100 further includes an inrush current preventing section 4 to prevent an inrush current from being supplied into the smoothing coil capacitors 22a and 22b and a switching section 5 to supply an AC voltage through a path different from a voltage supply path of the inrush current preventing section 4.

The inrush current preventing section 4 includes an inrush relay 41 and a resistor 42. The inrush current preventing section 4 has one end connected to a neutral phase (N phase) of the three-phase AC power supply 200, and the other end connected to a connection point of the smoothing coil capacitors 22a and 22b.

The inrush relay 41 may be a mechanical switch element, such as an electronic relay. As the inrush relay 41 is turned on, the R-phase AC voltage is rectified to a DC voltage by the rectifying section 21 and is applied to the smoothing coil capacitors 22a and 22b so that the smoothing coil capacitors 22a and 22b are charged.

The switching section 5 includes main relays 5a and 5b provided between an input terminal of the rectifying section 21 and the three-phase AC power supply 200 for inputting the three-phase AC voltages to the converter circuit 2. In detail, the main relays 5a and 5b are mechanical switch elements, for example, electromagnetic relays provided on the input terminals of the rectifying section 21 in the S phase and the T phase of the three phases.

The converter 100 configured as such is provided with a reactor 23 between the rectifying section 21 and the smoothing coil capacitor 22a, and an output current detecting section 6 is provided between the rectifying section 21 and the smoothing coil capacitor 22b. Further, on output sides of the smoothing coil capacitors 22a and 22b, a DC voltage detecting section 7 for detecting a DC voltage applied to the smoothing coil capacitors 22a and 22b is provided.

On the input side of the switching section 5, AC voltage detecting sections 8R, 8S and 8T for detecting the three-phase AC voltages inputted to the converter circuit 2 for each phase are provided.

The R-phase AC voltage is an AC voltage to charge the smoothing coil capacitors 22a and 22b, and the T-phase AC voltage is an AC voltage to control the inrush current preventing section 4 and the switching section 5 or to be supplied to a control section C that controls a driving circuit of the inverter circuit INV. The S phase AC voltage is an AC voltage other than the AC voltage for charging the smoothing coil capacitors 22a and 22b and supplying the voltage required for the control section C. Between the connection point of the AC voltage detecting sections 8R, 8S and 8T and the AC power supply 200, protective sections (fuses, etc., FR, FS, FT) are provided to protect individual faults caused by an overcurrent by physical cutting.

The diagnostic device 3 controls the inrush current preventing section 4 and the switching section 5, and determines an abnormal region of the converter circuit 2 based on AC voltages obtained from the AC voltage detecting sections 8R, 8S, and 8T and a measurement result pattern of a DC voltage obtained from the DC voltage detecting section 7.

In detail, the diagnostic device 3 may determine an abnormal region of the converter circuit 2 by performing a first step i) turning off the inrush current preventing section 4 and turning off the switching section 5 to perform an abnormality diagnosis, a second step ii) turning on the inrush current preventing section 4 and turning off the switching section 5 to perform an abnormality diagnosis; and a third step iii) turning off the inrush current preventing section 4 and turning on the switching section 5 to perform an abnormality diagnosis.

Hereinafter, each step will be described.

<First Step>

Referring to FIG. 2, upon entering a diagnosis mode, the diagnostic device 3 turns off the inrush current preventing section 4 and the switching section 5 to cut off the AC voltage flowing into the rectifying section 21 (Sa1). In this state, the diagnostic device 3 determines whether a DC voltage VDC obtained by the DC voltage detecting section 7 is equal to or higher than a preset upper limit value (Sa2: checking the DC voltage for overvoltage). The preset upper limit value refers to a first reference value that is previously determined in accordance with the system.

When the DC voltage VDC obtained by the DC voltage detecting section 7 is equal to or higher than the preset upper limit value, the diagnostic device 3 determines that a short circuit fault has occurred in a voltage dividing resistor constituting the DC voltage detecting section 7 (Sa3).

On the other hand, when the DC voltage VDC obtained by the DC voltage detecting section 7 is lower than the preset upper limit value, an operation history of the converter circuit 2 is checked (Sa4). When a DC current obtained by the output current detecting section 6 in the operation history is equal to or greater than a preset upper limit value that is previously determined, the diagnostic device 3 diagnoses that there is an abnormality in the rectifying section 21 or the switching section 5 by using the waveform of the DC current. In detail, the diagnostic device 3 determines that an open-circuit fault has occurred in a bridge diode or the main relay 5a or 5b of the rectifying section 21 when a pulse drop in a DC current waveform is detected.

Also, the diagnostic device 3 determines if there is a region where the DC voltage VDC obtained by the DC voltage detecting section 7 is lower than a preset lower limit value when it is diagnosed that an abnormality exists in the operation history (Sa5; Checking the DC voltage for undervoltage). Here, the preset lower limit value refers to a second reference value that is previously determined in accordance with the system.

When the DC voltage VDC obtained by the DC voltage detecting section 7 has a region lower than the preset lower limit value, the diagnostic device 3 determines that an open-circuit fault has occurred in a R-phase bridge diode of the rectifying section 21 (Sa6).

On the other hand, when the DC voltage VDC obtained by the DC voltage detecting section 7 has no region lower than the preset lower limit value, the diagnostic device 3 turns on the inrush relay 41 (Sa7), and alternates between turning on and off the main relays 5a and 5b several times in a short time (for example, ON→OFF→ON→OFF→ON) to perform a dust discharge control on the main relays 5a and 5b (Sa8) Thereafter, the diagnostic device 3 turns off the inrush relay 41 (Sa9), and checks whether a three-phase imbalance has occurred (Sa10).

When a three-phase imbalance has occurred, the diagnostic device 3 determines that an open-circuit fault has occurred in a S phase bridge diode or a T-phase bridge diode of the rectifying section 21 or in the main relay 5a or 5b (Sa11). In addition, the diagnostic device 3 clears the operation history when a three-phase imbalance has not occurred.

When it is determined that there is no abnormality in the operation history display, the diagnostic device 3 determines whether a center value of the direct current obtained by the output current detecting section 6 is within a preset range (Sa12). Here, when the center value of the direct current is out of the preset range, the diagnostic device 3 determines that an abnormality has occurred in the output current detecting section 6 (Sa13). On the other hand, when the center value of the DC current is within the preset range, the second step is performed.

As such, in the first step, the short-circuit fault of the voltage-dividing resistor constituting the DC voltage detecting section 7, the open-circuit fault of the bridge diode of the rectifying section 21, the open-circuit fault of the main relay 5a or 5b, the open-circuit fault of the bridge diode corresponding to the R phase in the rectifying section 21, the open-circuit fault of the bridge diode corresponding to the S phase or the T phase in the rectifying section 21, and the abnormality of the output current detecting section 6 may be diagnosed.

<Second Step>

Referring to FIG. 3, in the second step, the diagnostic device 3 turns on the inrush relay 41 (Sb1), and determines whether the DC voltage obtained by the DC voltage detecting section 7 has a region lower than a preset lower limit value (Sb2: determining the DC voltage for undervoltage).

When it is determined that the DC voltage has a region lower than the preset lower limit value, the diagnostic device 3 determines whether the charged amount of the smoothing coil capacitors 22a and 22b is less than a predetermined third reference value (Sb3; Checking the DC voltage for under voltage and checking the charge amount).

Here, when the amount of charge of the smoothing coil capacitors 22a and 22b is less than the preset third reference value, the diagnostic device 3 determines whether a R-phase AC voltage waveform obtained by the R-phase AC voltage detecting section 8R has an abnormality (Sb4: checking an abnormality of the R-phase voltage waveform). The determining of the abnormality of the AC voltage waveform is performed by analyzing the waveform of the AC voltage obtained by the AC voltage detecting section 8R. For example, the abnormality of the waveform of the AC voltage may be determined depending on whether the AC voltage is lower than a preset reference value.

At this time, when it is determined that the abnormality is detected in the waveform of the R-phase AC voltage (for example, when the R-phase AC voltage is lower than the preset reference value), the diagnostic device 3 determines that a short-circuit fault has occurred in the smoothing coil capacitors 22a and 22b (Sb5). The diagnostic device 3 determines that an open-circuit fault has occurred in the reactor 23 when there is no abnormality in the R-phase AC voltage waveform (for example, when the R-phase AC voltage is equal to or greater than the preset reference value) (Sb6).

On the other hand, when the amount of charge of the smoothing coil capacitors 22a, 22b is equal to or greater than the preset third reference value, the diagnostic device 3 determines whether the R-phase AC voltage waveform obtained by the R-phase AC voltage detecting section 8R has an abnormality (Sb7). Here, when an abnormality of the R-phase AC voltage waveform is detected, the diagnostic device 3 analyzes the waveform of the AC voltage of each phase obtained by the AC voltage detecting section 8R, and diagnoses the open-circuit fault of the inrush relay 41, the open-circuit fault of the R-phase protective section FR and the short-circuit fault of the R-phase bridge diode of the rectifying section 21, the open-circuit fault of the R-phase protective section FR, the open fault of the R-phase protective section FR and the S-phase protective section FS, or an open-circuit fault of the R-phase protective section FR and a short-circuit fault of the AC motor (Sb8).

When it is determined in the step Sb7 that the R-phase AC voltage waveform does not have an abnormality, the diagnostic device 3 determines whether the S-phase AC voltage waveform obtained by the S-phase AC voltage detecting section 8S has an abnormality (Sb9). When the abnormality of the S phase AC voltage waveform exists, the diagnostic device 3 determines that an open-circuit fault has occurred in the S-phase protective section FS and a short-circuit fault has occurred in the AC motor (Sb10). When it is determined that there is no abnormality in the S-phase AC voltage waveform, the diagnostic device 3 determines that an open-circuit fault has occurred in the voltage dividing resistor constituting the DC voltage detecting section 7 (Sb11).

In addition, when it is determined in step Sb2 that the direct current voltage obtained by the DC voltage detecting section 7 has no region lower than the preset lower limit value, the diagnostic device 3 determines whether an abnormality exists in the R-phase AC voltage waveform obtained by the R-phase AC voltage detecting section 8R (Sb12). When the R-phase AC voltage waveform is determined to have an abnormality, the diagnostic device 3 determines that an abnormality exists in the R-phase AC voltage detecting section 8R (Sb13).

On the other hand, when there is no abnormality in the R-phase AC voltage waveform, the diagnostic device 3 determines whether the S-phase AC voltage waveform obtained by the S-phase AC voltage detecting section 8S has an abnormality (Sb14). When the S-phase AC voltage waveform is determined to have an abnormality, the diagnostic device 3 diagnoses the open-circuit fault of the S-phase protective section FS and the short-circuit fault of the S-phase bridge diode of the rectifying section 21, the open-circuit fault of the S phase protective section FS and the open-circuit fault of the main relays 5a and 5b, the abnormality of the S-phase AC voltage detecting section 8R, or the open-circuit fault of the S-phase protective section (Sb15).

When it is determined in step Sb14 that there is no abnormality in the S-phase AC voltage waveform, the diagnostic device 3 determines whether the T-phase AC voltage waveform obtained by the T-phase AC voltage detecting section 8T has an abnormality (Sb16). When the T-phase AC voltage waveform is determined to have an abnormality, the diagnostic device 3 determines that the T-phase AC voltage detecting section 8T has an abnormality (Sb17). On the other hand, when the T-phase AC voltage waveform is not determined to have an abnormality, the third step is performed.

As such, in the second step, the short-circuit fault of the smoothing coil capacitors 22a and 22b, the open-circuit fault of the reactor 23, the open-circuit fault of the inrush relay 41, the open-circuit fault of the R-phase protective section FS, the short-circuit fault of the R-phase bridge diode of the rectifying section 21, the open-circuit fault of the S-phase protective section FS, the short-circuit fault of the AC motor, the open-circuit fault of the voltage dividing resistor constituting the DC voltage detecting section 7, an abnormality of the R-phase AC voltage detecting section 8R, the short-circuit fault of the S-phase bridge diode of the rectifying section 21, the open-circuit fault of the main relays 5a and 5b, the abnormality of the S-phase AC voltage detecting section 8S, the abnormality of the T-phase AC voltage detecting section 8T, and the like may be diagnosed.

<Third Step>

Referring to FIG. 4, upon entering the third step, the diagnostic device 3 turns off the inrush relay 41 (Sc1), and discharges the charges charged in the smoothing coil capacitors 22a and 22b for a predetermined period of time (Sc2). Then, the diagnostic device 3 determines whether the DC voltage obtained by the DC voltage detecting section 7 is lower than the preset reference value due to a voltage drop for a predetermined time (Sc3).

When the DC voltage obtained after the discharge is lower than the reference value, the diagnostic device 3 diagnoses that an open-circuit fault has occurred in the smoothing coil capacitors 22a and 22b (Sc4). On the other hand, when the DC voltage obtained after the discharge is equal to or higher than the reference value, the diagnostic device 3 turns on the main relays 5a and 5b (Sc5).

Subsequently, the diagnostic device 3 obtains the DC voltage from the DC voltage detecting section 7 (Sc6). The diagnostic device 3 turns off the main relays 5a and 5b and the inrush relay 41, and forcibly discharges the charges charged in the smoothing coil capacitors 22a and 22b to change the DC voltage through a voltage drop (Sc7).

Here, the diagnostic device 3 compares the DC voltage before the change, which is obtained in the step Sc6 of obtaining the DC voltage from the DC voltage detecting section 7, with the DC voltage after the change, which is obtained in the step Sc7 of changing the DC voltage through a voltage drop, and diagnoses an e open-circuit fault of the inrush relay 41 or the main relays 5a and 5b.

In detail, the open-circuit fault of the inrush relay 41 or the main relays 5a and 5b is determined depending on whether the falling voltage (the difference between the DC voltage before the change and the DC voltage after the change) for a preset time (a predetermined fourth reference value) is equal to or greater than a predetermined fifth reference value (Sc8). The diagnostic device 3 determines that an open-circuit fault has occurred in the inrush relay 41 or the main relays 5a and 5b when the falling voltage within the preset time (the fourth reference value) is not equal to or more than the fifth reference value (Sc9).

Also, the diagnostic device 3 disconnects a connection load and turns on the main relays 5a and 5b when the falling voltage for the preset time (the predetermined fourth reference value) is equal to or greater than the fifth reference value (Sc10). Then, the diagnostic device 3 obtains a DC voltage from the DC voltage detecting section 7 after a preset time (a predetermined sixth reference value) since the main relays 5a and 5b are turned on (Sc11). The DC voltage is a DC voltage in a transient state immediately after the reactor 23 is energized in the voltage drop state.

The diagnostic device 3 obtains a DC voltage from the DC voltage detecting section 7 after a preset time (a predetermined seventh reference value) since the step Sc11 of obtaining the DC voltage from the DC voltage detecting section 7 (Sc12). Here, the DC voltage is a DC voltage in a stable state after the reactor 23 is energized in the voltage drop state.

The diagnostic device 3 compares the DC voltage V (a) before the change, which is obtained in the step Sc6 of obtaining the DC voltage from the DC voltage detecting section 7, with the DC voltage V (b) in the transient state, which is obtained in the step Sc11 of obtaining the DC voltage from the DC voltage detecting section 7 after elapse of the sixth reference value, while comparing the DC voltage V (b) in the transient state with the DC voltage V(c) in the stable state, which is obtained in the step Sc12 of obtaining the DC voltage from the DC voltage detecting section 7 after the elapse of the seventh reference value, and determines whether a relationship V(b)<V(a)+k or a relationship V(b)<V(c)+k (where k is a normalized adjustment coefficient) is satisfied (Sc13). When the above relationship is satisfied, the diagnostic device 3 determines that a short-circuit fault has occurred in the reactor 23 (Sc14). On the other hand, when the above relationship is not satisfied, the diagnostic device 3 diagnoses that there is no abnormality. In diagnosing a short-circuit fault of the reactor 23, there is no need to satisfy both relationships of V (b)<V (a)+k and V (b)<V (c)+k (where k is a normalized adjustment coefficient). The reactor 23 may be determined to have a short-circuit fault when one of the two relationships is satisfied.

As such, in the third step, the open-circuit fault of the smoothing coil capacitors 22a and 22b, the open-circuit fault of the inrush relay 41 or the main relays 5a and 5b, and the short-circuit fault of the reactor 23 may be diagnosed.

The converter 100 according to the first embodiment described above may detect an abnormal region of the converter circuit 2 by using the AC voltage of the AC voltage detecting sections 8R, 8S, and 8T or a measurement result pattern of the DC voltage of the DC voltage detecting section 7 which is obtained by controlling the inrush current preventing section 4 and the switching section 5. As such, the abnormal region may be detected by efficiently using the circuit configuration of the conventional converter circuit 2 without using the output of the inverter circuit INV connected to the converter circuit 2.

Hereinafter, a converter according to the second embodiment will be described with reference to the drawings.

Figure 5:
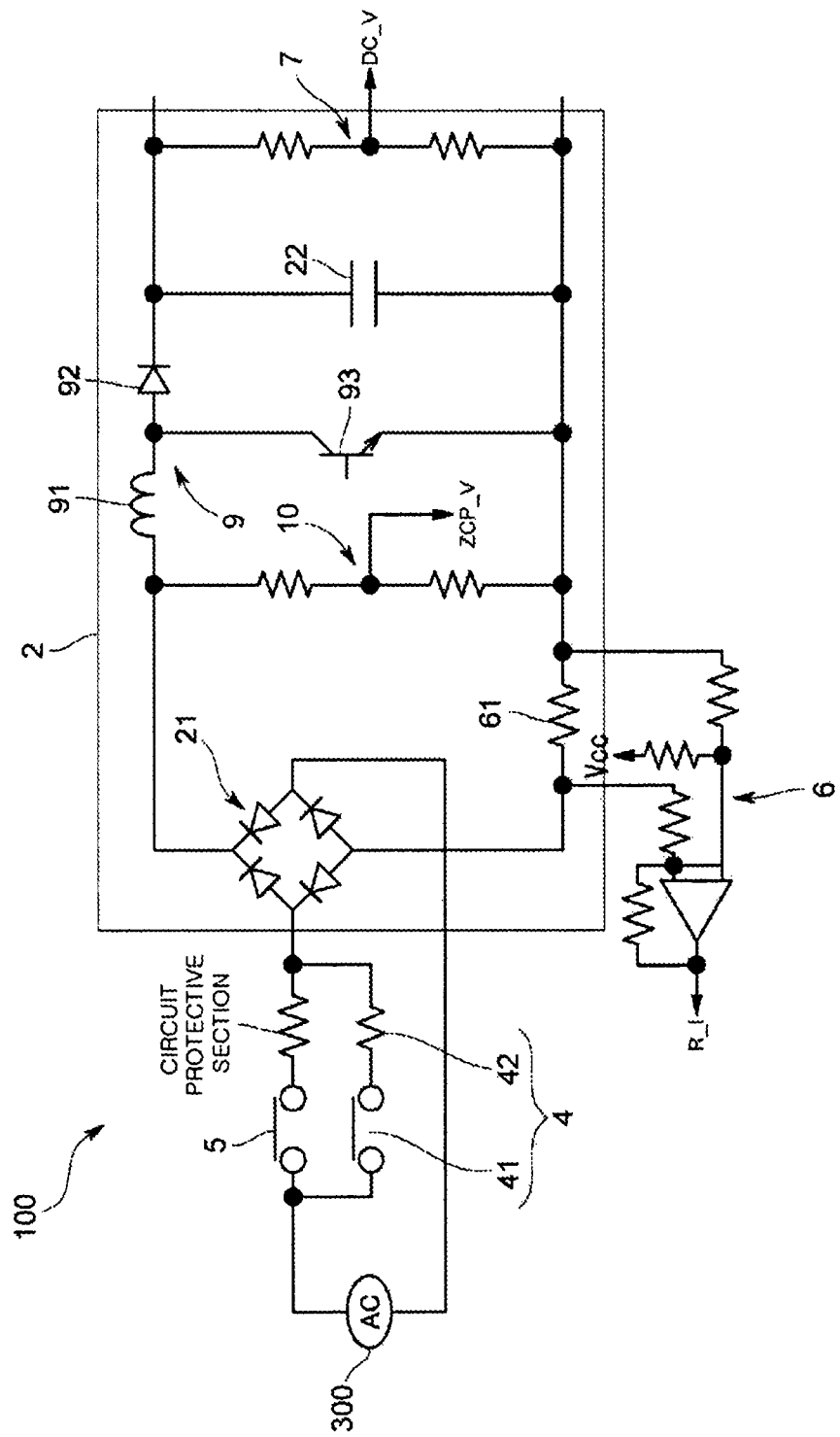
FIG. 5 is a control schematic diagram illustrating a converter according to the second embodiment.
Figure 6:
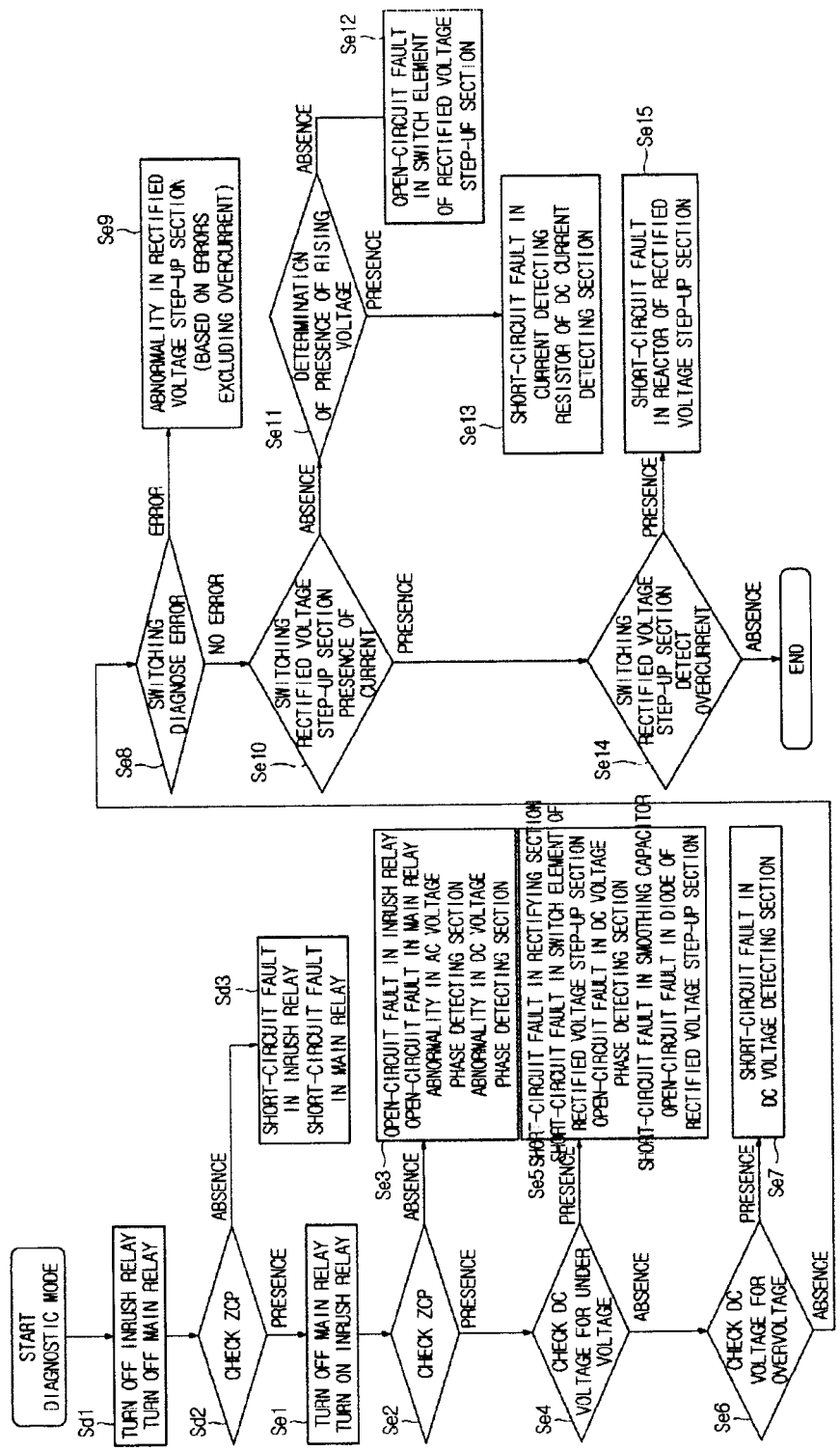
FIG. 6 is a flowchart showing another example of a diagnostic process of the converter according to the second embodiment.

FIG. 5 is a control schematic diagram illustrating a converter according to the second embodiment, and FIG. 6 is a flowchart showing another example of the diagnostic procedure of the converter according to the second embodiment.

A converter 100 according to the second embodiment is used in an AC motor driving apparatus that supplies three-phase AC voltages (a U phase, a V phase, a W phase) to a three phase AC motor, for example, a three phase motor. 5 to drive the three-phase AC motor. Referring to FIG. 5, the converter 100 converts a single-phase AC voltage of a single-phase AC power supply 300 into a DC voltage and supplies the DC voltage to an inverter circuit.

In detail, the converter 100 according to the second embodiment includes a converter circuit 2 for converting a single-phase AC voltage of the single-phase AC power supply 300 into a DC voltage and a diagnostic device 3 for diagnosing an abnormality of the converter circuit 2).

The converter circuit 2 includes a rectifying section 21 for rectifying a single-phase AC voltage and a smoothing section 22 for smoothing a DC voltage rectified by the rectifying section 21.

The rectifying section 21 is a single-phase full bridge diode circuit. The smoothing section 22 is a smoothing coil capacitor connected between output terminals of the rectifying section 21.

The converter 100 further includes an inrush current preventing section 4 for preventing an inrush current flowing into the smoothing coil capacitor 22 and a switching section 5 for supplying an AC voltage through a path different from a path of inrush current preventing section 4.

The inrush current preventing section 4 includes an inrush relay 41 and a resistor 42, and is connected in parallel to the switching section 5 and a circuit protective section (a positive temperature coefficient (PTC) thermistor), which are provided between the input side of the rectifying section 21 and the single-phase AC power supply 300. For example, the inrush relay 41 and the switching section 5 are mechanical switch elements, such as an electromagnetic relay.

The converter 100 constructed as described above is provided with an output current detecting section 6 between the rectifying section 21 and the smoothing coil capacitor 22 to detect a direct current flowing through the converter circuit 2. Between the rectifying section 21 and the smoothing coil condenser 22, a rectified voltage step-up section 9 (power factor correction: PFC) is provided to step up the DC voltage rectified by the rectifying section 21. At the output side of the smoothing coil capacitor 22, a DC voltage detecting section 7 for detecting a voltage applied to the smoothing coil capacitor 22 is provided.

An AC voltage phase detecting section 10 (a zero cross detection circuit) is provided between the rectifying section 21 and the rectified voltage step-up section 9 of the converter circuit 2, and at the input side of the switching section 5, an AC voltage detecting section (not shown) is provided to detect a single-phase AC voltage input to the converter circuit 2.

Here, the output current detecting section 6 includes a shunt resistor 61 on a negative voltage line (a low power supply line), and detects a current flowing through the shunt resistor 61.

The rectified voltage step-up section 9 includes a reactor 91 provided in a positive voltage line (a high power line), a diode 92 provided at the output side of the reactor and having an anode directed toward the reactor 91, and a switch element 93 (for example, an Insulated gate bipolar transistor: IGBT) provided between a connection point of the reactor 91 and the diode 92 and a reduction line.

The diagnostic device 3 controls the inrush current preventing section 4 and the switching section 5, and determines an abnormal region of the converter circuit 2 by using a DC voltage obtained by the DC voltage detecting section 7 or a measurement result pattern obtained by the AC voltage phase detecting section t 10.

In detail, the diagnostic device 3 may determine an abnormal region by performing a first step i) turning off the inrush current preventing section 4 and turning off the switching section 5 to perform an abnormality diagnosis, and a second step ii) turning on the inrush current preventing section 4 and turning off the switching section 5 to perform an abnormality diagnosis.

Hereinafter, each step will be described.

<First Step>

Referring to FIG. 6, upon entering a diagnosis mode, the diagnostic device 3 turns off the inrush relay 41, which is included in the inrush current preventing section 4, and the switching section 5 to cut off the AC voltage supplied into the rectifying section 21 (Sd1). In this state, the diagnostic device 3 diagnose a short-circuit fault of the switching section 5 or a short-circuit fault of the inrush relay 41 by using an output pattern of the AC voltage obtained by the AC voltage phase detecting section 10 (Sd2). In detail, when the diagnostic device 3 diagnoses that a short-circuit fault has occurred in the switching section 5 or a short-circuit fault has occurred in the inrush relay 41 when an output pulse signal of the AC voltage phase detecting section 10 is detected (Sd3). On the other hand, when the output pulse signal of the AC voltage phase detecting section 10 is not detected and the DC voltage obtainable by the DC voltage detecting section 7 is lower than a preset reference value, the diagnostic section 3 performs the second step. When the DC voltage obtained by the DC voltage detecting section 7 is equal to or higher than the preset reference value, the diagnostic device 3 may determine that a short-circuit fault has occurred in the switching section 5 or a short-circuit fault has occurred in the inrush relay 41.

As such, in the first step, the short-circuit fault of the switching section 5 and the short-circuit fault of the inrush relay 41 may be diagnosed.

<Second Step>

Referring to FIG. 6, the diagnostic device 3 turns on the inrush relay 41 (Se1), and detects the output pulse signal of the AC voltage phase detecting section 10 (Se2). That is, the diagnostic device 3 determines whether the output of the AC voltage phase detecting section 10 is 0 V or not.

When the output pulse signal of the AC voltage phase detecting section 10 is not detected (when the output of the AC voltage phase detecting section 10 is 0 V or within a preset range), the diagnostic device 3 determines that an open-circuit fault has occurred in the inrush relay 41 or in the switching section 5, or determines that an abnormality has occurred in the AC voltage phase detecting section 10 (Se3). Furthermore, when the DC voltage obtained by the DC voltage detecting section 7 is 0 V, the diagnostic section 3 may determine that a short-circuit fault has occurred in the DC voltage detecting section 7. On the other hand, when the output pulse signal of the AC voltage phase detecting section 10 is detected, the diagnostic device 3 determines whether the DC voltage obtained by the DC voltage detecting section 7 is lower than a preset lower limit value (Se4: checking the DC voltage for undervoltage). When the obtained direct current voltage is lower than the lower limit value, the diagnostic device 3 determines that a short-circuit fault has occurred in a bridge diode of the rectifying section 21, a short-circuit fault has occurred in a load connected to the converter circuit 2, a short-circuit fault has occurred in a switch element of the rectified voltage step-up section 9, an open-circuit fault has occurred in the DC voltage detecting section 7, a short-circuit fault has occurred in the smoothing coil capacitor 22, an open-circuit fault has occurred in the reactor 91, or an open-circuit fault has occurred in a diode of the rectified voltage step-up section 9 (Se5).

In the step Se4 of determining whether the DC voltage is lower than the preset lower limit value, the diagnostic device 3 determines whether the DC voltage obtained by the DC voltage detecting section 7 is equal to or higher than a preset upper limit value when the DC voltage is equal to or higher than the lower limit value (Se6). When the DC voltage is equal to or higher than the upper limit value, the diagnostic device 3 determines that a short-circuit fault has occurred in the DC voltage detecting section 7 (Se7).

On the other hand, when the DC voltage is lower than the upper limit value, the diagnostic device 3 switches the switch element of the rectified voltage step-up section 9 and checks an operation of the rectified voltage step-up section 9 (Se8). Then, the diagnostic device 3 determines that there is an abnormality in the rectified voltage step-up section 9 (for example, a short-circuit fault of the diode 92) when an error (excluding an overcurrent) has occurred in the checking of the operation of the rectified voltage step-up section 9 (Se9)). In this case, the diagnostic device 3 may determine that an open-circuit fault has occurred in the bridge diode of the rectifying section 21.

Also, the diagnostic device 3 determines whether a DC current is detected by the output current detecting section 6 in a state where the rectified voltage step-up section 9 is operated, when an error (excluding an overcurrent) has not occurred in the checking of operation of the rectified voltage step-up section 9 (Se10). Here, when the direct current is not detected, the diagnostic device 3 determines whether there is a rise in the voltage value obtained by the direct current voltage detecting section 7 before or after the operation of the rectified voltage step-up section 9 (Se11). When there is no rise in the voltage value, the diagnostic device 3 determines that an open-circuit fault has occurred in the switch element of the rectified voltage step-up section 9 (Se12). On the other hand, when there is a rise in the voltage value, the diagnostic device 3 determines that a short-circuit fault has occurred in the shunt resistor 61 of the output current detecting section 6 or a short-circuit fault has occurred in the load (Se13).

In addition, when a direct current is detected by the output current detecting section 6 in the step Se13 of determining of whether a short-circuit fault has occurred in the shunt resistor 61 of the output current detecting section 6 or in the load, the diagnosis apparatus determines whether the DC current is an overcurrent (Se14). When the DC current is an overcurrent, the diagnostic device 3 determines that a short-circuit fault has occurred in the reactor 91 (Se15). On the other hand, when the direct current is not an overcurrent, the diagnostic device 3 determines that the converter circuit 2 is normal, and terminates the diagnosis mode.

As such, in the second step, an open-circuit fault of the inrush relay 41, an open-circuit fault of the switching section 5, an abnormality of the AC voltage phase detecting section 10, a short-circuit fault of the DC voltage detecting section 7, a short-circuit fault of the bridge diode of the rectifying section 21, a short-circuit fault of the load connected to the converter circuit 2, a short-circuit fault of the switch element of the rectified voltage step-up section 9, an open-circuit fault of the DC voltage detecting section 7, a short-circuit fault of the smoothing coil capacitor 22, an open-circuit fault of the reactor 91, an open-circuit fault of the diode of the rectified voltage step-up section 9, a short-circuit fault of the DC voltage detecting section 7, an abnormality of the rectified voltage step-up section 9 (for example, a short-circuit fault of the diode 92), a short-circuit fault of the shunt resistor 61 of the output current detecting section 6, a short-circuit fault of the load, and a short-circuit fault of the reactor 91 may be diagnosed.

According to the converter 100, the abnormal region of the converter circuit 2 may be detected based on the measurement result pattern of the DC voltage of the DC voltage detecting section 7 or the output of the AC voltage phase detecting section 10 by controlling the inrush current preventing section 4 and the switching section 5. Therefore, the abnormal region may be detected by efficiently using the circuit configuration of the conventional converter circuit 2 without using the output of the inverter circuit INV connected to the converter circuit 2.

The present invention is not limited to the first and second embodiments

For example, according to the first and second embodiments, the converter circuit includes the output current detecting section for detecting the output current (DC current) output to the converter circuit. However, the converter circuit may include an input current detecting section for detecting an input current (alternating current) input to the converter circuit, and the diagnostic device may perform diagnosis by using the alternating current obtained by the input current detecting section, instead of the direct current obtained by the output current detecting section.

The three-phase power input shown in FIG. 1 and the R phase, S phase, and T phase described above are merely examples, and the connection of each phase of the input voltage is not limited thereto.

Figure 7:
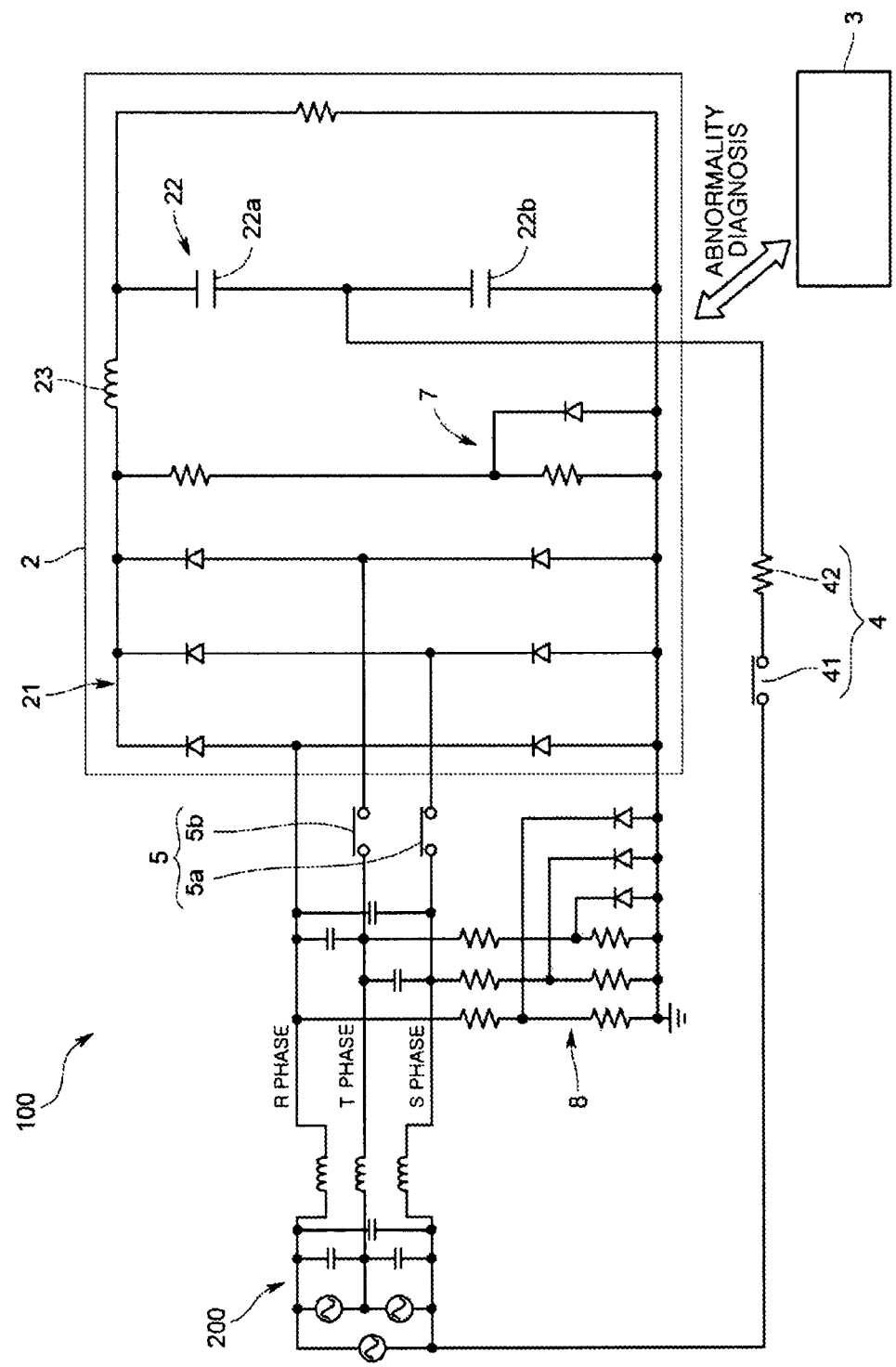
FIG. 7 is a control schematic diagram illustrating a converter according to the third embodiment.
Figure 8:
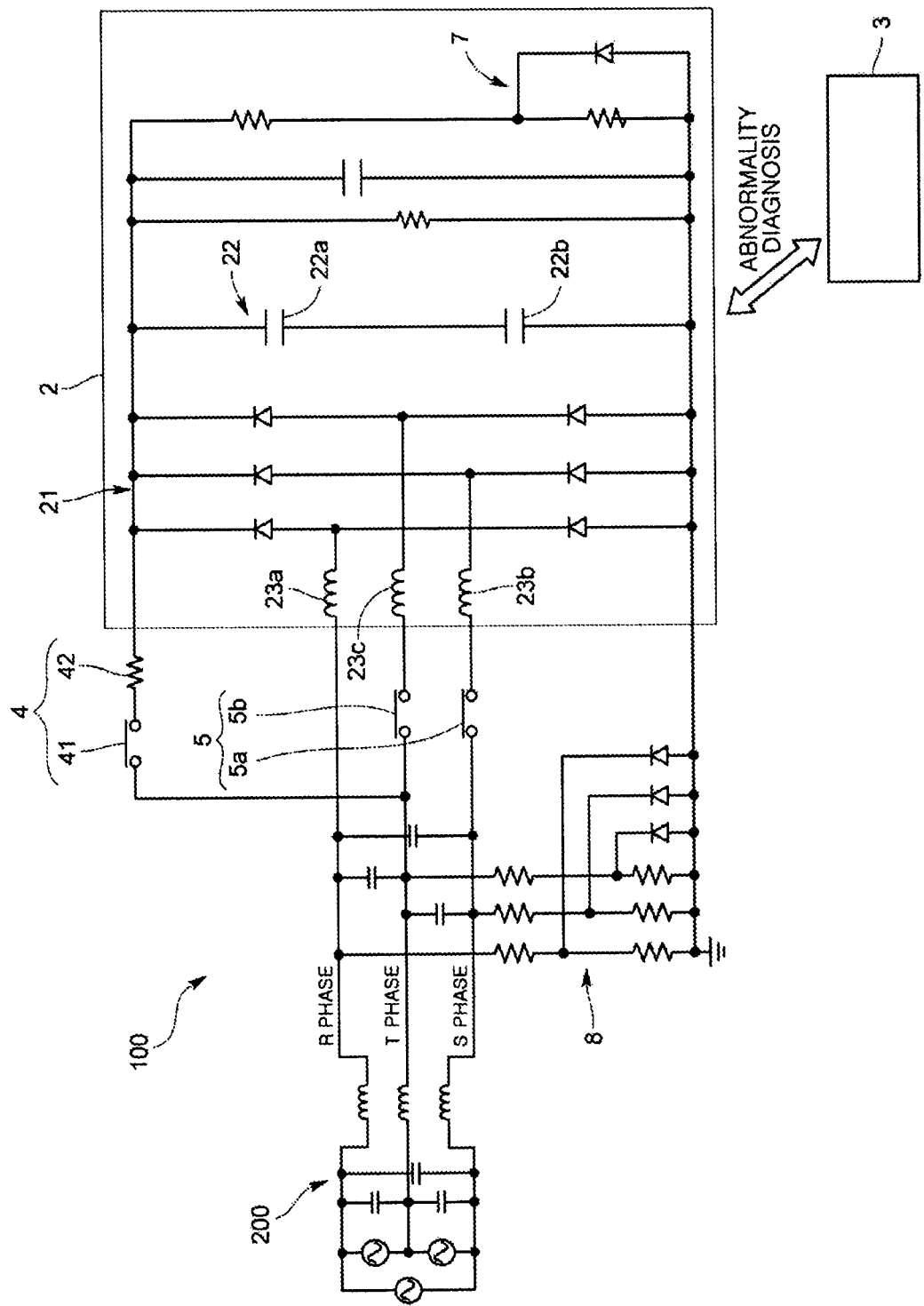
FIG. 8 is a control schematic diagram illustrating another example of the converter according to the third embodiment.

Hereinafter, a converter according to the third embodiment will be described with reference to the drawings FIG. 7 is a control schematic diagram illustrating a converter according to the third embodiment, and FIG. 8 is a control schematic diagram illustrating another example of the converter according to the third embodiment.

Referring to FIG. 7, a converter 100 according to the third embodiment includes a converter circuit 2 and a diagnostic device 3 for diagnosing an abnormality the converter circuit 2 by using an input of a three-phase four-wire AC power supply.

The converter circuit 2 includes a rectifying section 21 for rectifying a three-phase AC voltage and a smoothing section 22 for smoothing a DC voltage rectified by the rectifying section 21.

The rectifying section 21 is a three-phase full-bridge diode circuit. The smoothing section 22 is a smoothing coil capacitor connected between output terminals of the rectifying section 21. The smoothing section 22 includes two smoothing coil capacitors 22a and 22b connected in series between the output terminals.

The converter circuit 2 further includes an inrush current preventing section 4 for preventing an inrush current from flowing into the smoothing coil capacitors 22a and 22b and a switching section 5 for supplying an AC voltage through a path different from a path of the inrush current preventing section 4.

The inrush current preventing section 4 includes an inrush relay 41 and a resistor 42. One end of the inrush current preventing section 4 is connected to a neutral phase (N phase) of the three-phase AC power supply 200, and the other end of the inrush current preventing section 4 is connected to a connection point of the two smoothing coil capacitors 22a and 22b. The inrush relay 41 may be a mechanical switch element, such as an electronic relay. As the inrush relay 41 of the inrush current preventing section 4 is turned on, a R-phase AC voltage is rectified to a DC voltage by the rectification part 21 and is applied to the smoothing coil capacitor 22a and 22b, so that the smoothing coil capacitor 22a and 22b are charged.

The switching section 5 includes main relays 5a and 5b provided between the input side of the rectifying section 21 of the converter circuit 2 and the three-phase AC power supply 200 to input the three-phase AC voltages to the converter circuit 2. For example, the main relays 5a and 5b may be mechanical switch elements, such as an electromagnetic relay, provided on the input sides of the rectifying section 21 in the S phase and the T phase of the three phases.

The converter circuit 2 configured as such is provided with a reactor 23 between the rectifying section 21 and the smoothing coil capacitor 22a, and an output current detecting section (not shown) is provided between the rectifying section 21 and the smoothing coil capacitor 22b. A direct-current voltage detecting section 7 for detecting the direct-current voltage applied to the smoothing coil capacitors 22a and 22b is provided on the output side of the smoothing coil capacitors 22a and 22b. On the input side of the switching section 5, an AC voltage detecting section 8 for detecting the three-phase AC voltages inputted to the converter circuit 2 for each phase is provided.

The diagnostic device 3 controls the main relays 5a and 5b and the inrush current preventing section 4, and diagnoses a normality, a short-circuit fault, or a disconnection of a coil by using the AC voltage obtained by the AC voltage detecting section 8 or the DC voltage obtained by the DC voltage detecting section 7.

Hereinafter, the coil diagnosis function of the diagnostic device 3 and the detailed operation of the converter will be described.

The diagnostic device 3 turns on the inrush relay 41 of the inrush current preventing section 4 before operating the main relays 5a and 5b to charge the smoothing coil capacitors 22a and 22b to a proper voltage, and operates the main relays 5a and 5b.

When the three-phase four-wire AC power supply 200 shown in FIG. 7 include the smoothing section in which the smoothing coil capacitors 22a and 22b are connected in series, the inrush current preventing section 4 is provided between one phase and the neutral phase (N phase) to charge the smoothing coil capacitor 22a and the smoothing coil capacitor 22b for each half wave of a voltage. Referring to FIG. 7, the smoothing coil capacitor 22a at an upper end is charged by a current passing through the reactor 23, but the smoothing coil capacitor 22b at a lower end is charged by a current not passing through the reactor 23.

When the reactor (coil) 23 is disconnected, the DC voltage smoothed by the smoothing coil capacitors 22a and 22b during an operation of the inrush current preventing section 4 is only about 50% of the maximum value of the input AC voltage. That is, a fault mode of the reactor may be determined from a DC voltage obtained by the DC voltage detecting section 7. In this case, unless the smoothing coil capacitors 22a and 22b are connected in series, the capacitor is not charged, so that the DC voltage value becomes 0V, and the disconnection of the reactor 23 may be determined.

Hereinafter, a method of diagnosing a disconnection of the reactor (a coil) 23 will be described.

As described above, when the reactor 23 has a short-circuit fault during the operation of the inrush current preventing section 4, the charging of the smoothing coil capacitors 22a and 22b is not distinguished from the normal case. When the smoothing coil capacitors 22a and 22b are charged to a proper DC voltage, the diagnostic device 3 turns on the main relays 5a and 5b. At this time, due to the difference between the input AC voltage value and the charged DC voltage value, an inrush current flows through the smoothing coil capacitors 22a and 22b. When the voltage difference is large, a large rush current flows through the smoothing coil capacitors 22a and 22b, and when the voltage difference is small, only a small rush current flows through the smoothing coil capacitors 22a and 22b. As the inrush current causes the reactor 23 to have an inductance L, a counter electromotive force VL as shown in Equation 1 below is generated.

$$VL = L \times di/dt \qquad \text{[Equation 1]}$$

As the inrush current flows in the smoothing coil capacitors 22a and 22b, the smoothing coil capacitors 22a and 22b are immediately supplied with a DC voltage having the maximum value of the input AC voltage as a pack hold and with the counter electromotive force generated at both ends of the reactor 23 and a DC voltage larger than that in a stable state is applied to the smoothing coil capacitors 22a and 22b.

When the reactor 23 has a short-circuit fault, VL becomes almost 0 V because L≈0 in Equation 1, so that the DC voltage of the smoothing coil capacitors 22a and 22b immediately after the main relays 5a and 5b are turned on becomes almost equal to the voltage in the stable state. That is, the diagnostic device 3 may determine whether the reactor 23 is normal or short-circuited by allowing a proper inrush current to flow in the reactor 23 and detecting the DC voltage immediately thereafter.

Here, the AC power supply voltage is not varied during the diagnosis operation. Accordingly, the diagnostic device 3 compares the DC voltage (a first voltage) immediately after the supply of the inrush current with the DC voltage (a second voltage) in the stable state thereafter, confirms that the counter electromotive force (VL) is completely discharged to 0V, and diagnoses whether the reactor 23 is normal or short-circuited.

A first method of generating an appropriate inrush current includes detecting, by the detecting sections 7 and 8, the DC voltage value and the AC voltage value, respectively, during operation of the inrush current preventing section 4 when the power is supplied, and operating the main relays 5a and 5b when an appropriate potential difference occur. In this method, the AC voltage needs to be known, and the AC voltage detecting section 8 uses a method of loading the voltage from the A/D converter of the microcomputer.

A second method of generating an appropriate inrush current includes, after checking the DC voltage at a time when the smoothing coil capacitors 22a and 22b are stable, lowering the DC voltage to a desired voltage by discharging the smoothing coil capacitors 22a and 22b once by using the main relays 5a and 5, and operating the main relays 5a and 5b again to generate an appropriate potential difference.

In this case, since the DC voltage at the time of the stabilization is known, the AC voltage detecting section 8 may be a means that does not recognize the direct voltage, such as a means for monitoring an AC zero crossing. However, since the AC voltage may fluctuate during the diagnosis, it is possible to obtain a precise result by performing short-circuit diagnosis with at least two inrush currents while increasing the potential difference based on the AC zero crossing timing.

Also, even if the reactor 23 has a short-circuit fault, a counter electromotive force may be generated due to inductance of a portion where an inrush current flows, for example, a wire or a substrate pattern. Therefore, the DC voltage obtained from the DC voltage detecting section 7 after elapse of a time to sufficiently detect the voltage VL generated immediately after the input of the AC voltage and to sufficiently avoid the detection of the counter electromotive force due to the inductance of other factors is determined to the first voltage. The time to sufficiently avoid the detection of the counter electromotive force may be determined by experiment or the like.

Further, when the reactor 23 is determined to have a fault in the above-described diagnosis, the diagnostic device 3 may enable the user to view the diagnosis result through a display or the like, or notifies the user of the diagnosis result though other alarming means. As a result, a recovery to a desired performance may be achieved, and losses associated with product repair and exchange may be prevented. In addition, the diagnostic device 3 may transmit the diagnosis result to a higher-level control apparatus, such as a centralized management system, by using a communication means or the like to notify the user or a repairer of the diagnosis result.

Although the above-described converter includes the converter circuit 2 having a three-phase four-wire AC power as an input, the converter circuit 2 may include a three-phase three-wire AC power as an input as shown in FIG. 8.

In the converter circuit 2, reactors 23a, 23b, and 23c may be provided for each phase between an AC power supply 200 or main relays 5a and 5b, which are power input sections, and a rectifying section 21.

Referring to FIG. 8, a coil diagnosis function of a diagnostic device 3 of the converter circuit 2 will be described.

First, the diagnostic device 3 turns on an inrush relay 41 of an inrush current preventing section 4 and charges smoothing coil capacitors 22a and 22b from a R phase and a T phase via the inrush preventing resistance 42.

In this operation, the smoothing coil capacitors 22a and 22b are not charged when the R phase reactor 23a is disconnected. Therefore, the diagnostic device 3 diagnoses that the R-phase reactor 23a is disconnected when the DC voltage is 0V or does not rise.

Next, the diagnostic device 3 checks a desired DC voltage, turns on the main relay 5b (ON) when the AC voltage on the T phase reaches a maximum value, and simultaneously turns off the inrush relay 41 of the inrush current preventing section 4 (OFF), so that the smoothing coil capacitors 22a and 22b are charged on the R phase and the T phase.

In this operation, when the T-phase reactor 23c has a short-circuit fault, no counter electromotive force is detected. Therefore, when the counter electromotive force is not detected, the diagnostic device 3 determines that the T-phase reactor 23c has a short-circuit fault. Further, when the T-phase reactor 23c is disconnected, the smoothing coil capacitors 22a and 22b are not charged, so that the DC voltage does not rise. Therefore, the diagnostic device 3 determines that the T-phase reactor 23c is disconnected when the DC voltage does not rise.

Next, the diagnostic device 3 confirms that the DC voltage obtained by the DC voltage detecting section 7 is a stable value, and then turns off the main relay 5b.

The diagnostic device 3 turns on the main relay 5a when the S-phase AC voltage of the AC voltage detecting section 8 reaches a maximum value after the DC voltage drops to a desired voltage, to charge the capacitors 22a and 22b on the R phase and the S phase.

When the reactor 23b on the S side has a short-circuit fault, no counter electromotive force is detected. Therefore, when the counter electromotive force is not detected, the diagnostic device 3 determines that the reactor 23b on the S side has a short-circuit fault. Further, when the reactor 23b on the S phase is disconnected, the DC voltage is not increased because charging is not performed. Therefore, the diagnostic device 3 determines that the reactor 23b on the R phase is disconnected when the DC voltage does not rise.

Then, the diagnostic device 3 turns off the main relay 5a after confirming that the DC voltage obtained by the DC voltage detecting section 7 is stable.

When the R-phase AC voltage of the AC voltage detecting section 8 reaches a maximum value after the DC voltage drops to a desired voltage, the diagnostic device 3 turns on the main relay 5a or the main relay 5b, which is not determined to be disconnected, (ON), to charge the smoothing coil capacitors 22a and 22b on the R phase and S phase or the T phase.

When the R-phase reactor 23a has a short-circuit fault, no counter electromotive force is detected. In this manner, the diagnostic device 3 diagnoses that a short-circuit fault of the R-phase reactor 23a.

In this operation, short-circuit fault and disconnection of the three reactors 23a, 23b, and 23c may be diagnosed. By turning on the main relays 5a and 5b when the phase AC voltage of one of the reactors 23a, 23b and 23c to be diagnosed is the maximum such that only two phases are conducted the one of the reactors 23a, 23b, and 23c is subject to a diagnosis.

Hereinafter, an inverter according to the fourth embodiment will be described below. The reference numerals used for describing the fourth embodiment are different from those of the first to third embodiments described above.

Figure 9:
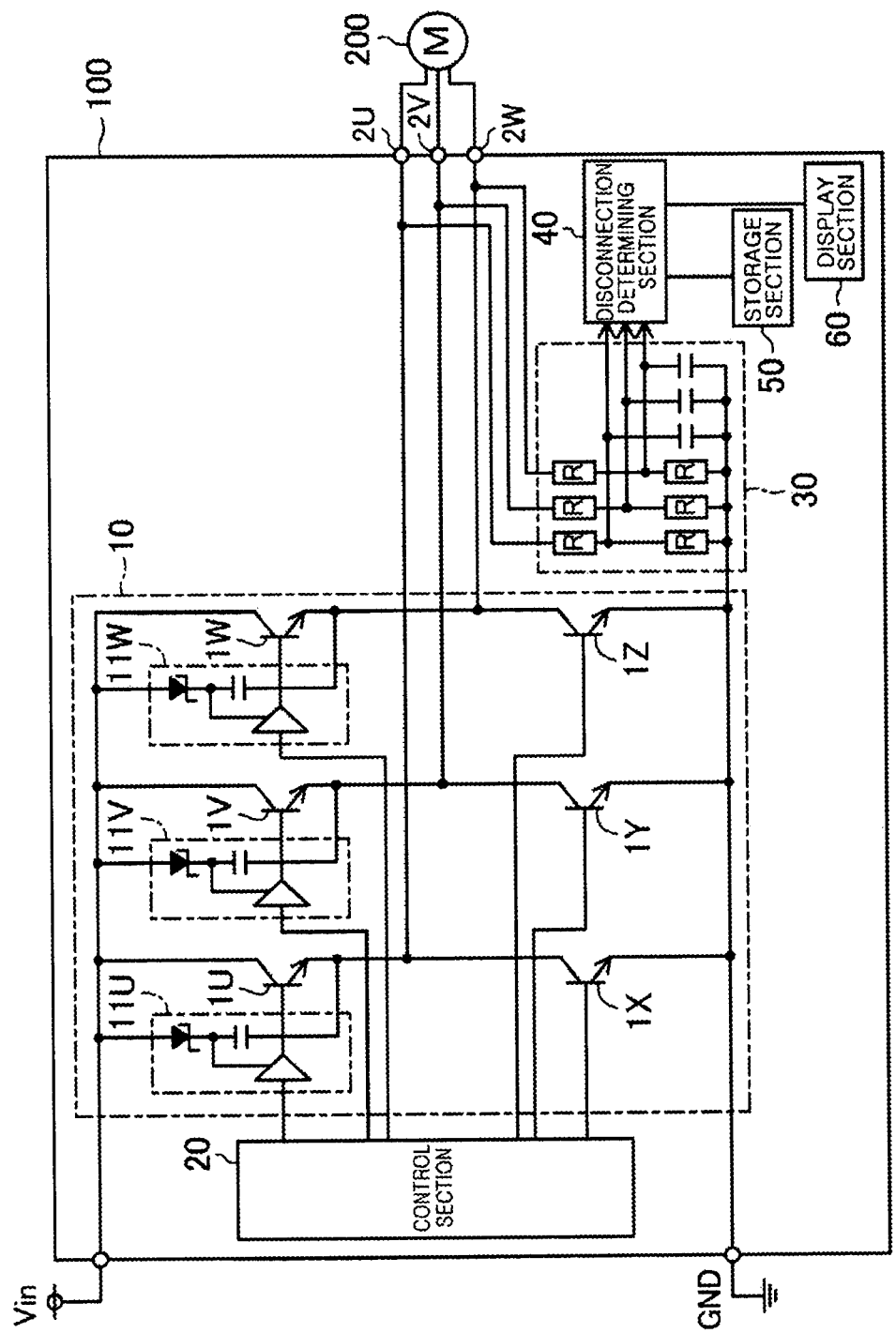
FIG. 9 is a control schematic diagram illustrating an inverter according to the fourth embodiment.

FIG. 9 is a control schematic diagram illustrating an inverter according to the fourth embodiment.

An inverter 100 according to the fourth embodiment is a device that generates three-phase AC power from DC power and supplies the three-phase AC power to an external load. The external load may be, for example, a motor 200. The motor 200 may be three AC loads having three-phase coils.

An inverter output section 10 includes upper switch elements 1U, 1V and 1W and lower switch elements 1X, 1Y and 1Z connected in series to the upper switch elements 1U, 1V and 1W, respectively. A terminal 2U is connected to a connection point of the switch elements 1U and 1X. A terminal 2V is connected to a connection point of the switch elements 1V and 1Y. A terminal 2W is connected to a connection point of the switch elements 1W and 1Z.

For example, a bipolar transaction transistor, a power Metal-Oxide-Semiconductor Field-Effect Transistor (MOS-FET), and an Insulated Gate Bipolar Transistor (IGBT) may be used as the switch elements 1U, 1V, 1W, 1X, 1Y and 1Z.

For example, an NPN bipolar transistor having a low ON-state resistance may be employed as a switch element. Thus, the current loss in the switch element may be reduced.

When the NPN bipolar transistor is also used for the upper switch elements 1U, 1V and 1W, bootstrap circuits 11U, 11V and 11W need to be connected to the switch elements 1U, 1V and 1W, respectively. The bootstrap circuits 11U, 11V and 11W cause a base voltage of the switch elements 1U, 1V and 1W to be higher than a collector voltage (DC voltage Vin input to the inverter 100) so that the upper switch elements 1U, 1V and 1W implemented using NPN bipolar transistors may be switched and controlled.

A control section 20 switches the upper switch elements 1U, 1V and 1W and the lower switch elements 1X, 1Y and 1Z of the inverter output section 10. In detail, in a normal operation mode for driving the motor 200, the control section 20 independently controls the switch elements 1U and 1X so as to prevent a through-current from flowing through the switch elements 1U and 1X. The control section 20 also switches the switch elements 1V and 1Y independently so as to prevent a through-current from flowing through the switch elements 1V and 1Y by shifting the electrical angle by 120 degrees. The control section 20 independently switches the switch elements 1W and 1Z by shifting the electrical angle by 120 degrees so as to prevent a through-current from flowing through the switch elements 1W and 1Z.

On the other hand, in the diagnostic mode for diagnosing the short-circuit fault of the inverter 100, the control section 20 turns off all the lower switch elements 1X, 1Y, and 1Z and turns on one of the upper switch elements 1U, 1V, and 1W. The operation of the control section 20 in the diagnostic mode will be described later.

A voltage detecting section 30 detects voltages of the terminals 2U, 2V, and 2W, that is, a U phase voltage, a V phase voltage, and a W phase voltage. For example, the voltage detecting section 30 includes a resistor-dividing circuit that divides each voltage of the terminals 2U, 2V, and 2W by two resistance elements. The reason for dividing each voltage of the terminals 2U, 2V, and 2W by resistances is to match an input voltage rating of a disconnection determining section 40. On the other hand, in the voltage detecting section 30, in order to smooth the detected voltage, a capacitive element may be connected to each resistor-divided point.

In the diagnosis mode, the disconnection determining section 40 performs a disconnection fault diagnosis of the inverter 100 based on the U phase detection voltage, the V phase detection voltage and the W phase detection voltage detected by the voltage detecting section 30. In more detail, the disconnection determining section 40 recognizes the U phase detection voltage, the V phase detection voltage and the W phase detection voltage detected by the voltage detecting section 30 as two values of H level or L level, and based on a combination of the two values, determines which of the inverter output section 10 and the motor 200 is disconnected, and also determines which phase is disconnected. The disconnection determining section 40 may be implemented by, for example, a microcomputer or the like.

A storage section 50 stores a determination result of the disconnection determining section 40. The contents stored in the storage section 50 may include the presence of a disconnection, and a disconnection region when a disconnection exists. The storage section 50 may be implemented using a nonvolatile memory, such as a flash memory.

A display section 60 displays the determination result of the disconnection determining section 40. The display section 60 may receive the determination result directly from the disconnection determining section 40, and display the determination result, and also may read out the determination result stored in the storage section 50 and display the determination result. The contents displayed by the display section 60 include the presence of a disconnection, and a disconnection region if there is a disconnection. The display section 60 may be implemented using an indicator, such as a Light Emitting Diode (LED), a liquid crystal display device, or the like.

In this manner, by storing the determination result of the disconnection determining section 40 in the storage section 50 and displaying the stored determination result on the display section 60, for example, upon occurrence of a fault of the inverter 100, a repair man does not need to perform a fault diagnosis again when the maintenance of the inverter 100 is performed. The inverter 100 may not be operated after the fault of the inverter 100. In this case, since the fault diagnosis may not be performed, it is useful to store the determination result of the disconnection determining section 40 is stored in the storage section 50.

On the other hand, when any one of the inverter output section 10 and the motor 200 is determined to have a disconnection by the disconnection determining section 40, the control section 20 may restrict the switching control of the switching elements 1U, 1V, 1W, 1X, 1Y and 1Z. Accordingly, the inverter 100 in a faulty state may be prevented from being operated, so that a safety may be ensured.

Next, the disconnection fault diagnosis of the inverter 100 will be described in detail with reference to the drawings. As described above, the disconnection fault diagnosis of the inverter 100 is performed by turning off all the lower switch elements 1X, 1Y, and 1Z (OFF) and turning on one of the upper switch elements 1U, 1V, and 1W (ON) of the inverter output section 10.

First Example

Figure 10:
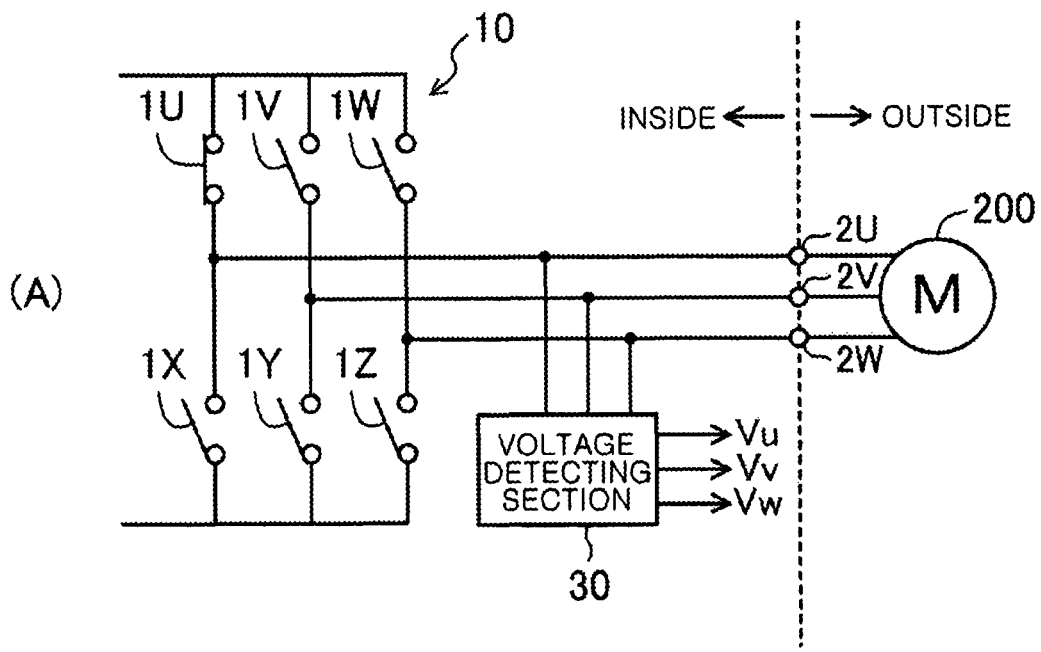
FIG. 10 is a diagram illustrating a first switching control and a table showing a disconnection determination condition in a disconnection fault diagnosis.

FIG. 10 part(A) is a diagram showing an example of a first switching control in a disconnection fault diagnosis, and FIG. 10 part(B) is a table showing disconnection determination conditions. The example illustrates a disconnection fault diagnosis when only the upper switch element 1U of the inverter output section 10 is turned on. On the other hand, in FIG. 10 part (A), each switch element is represented by a symbol that indicates turn-on/turn-off states.

When there is no disconnection in the inverter 100 and only the switch element 1U is turned on, an input DC voltage Vin of the inverter output section 10 is applied to the terminal 2U, and the U-phase detection voltage Vu output from a voltage detecting section 30 reaches a level of H. The input DC voltage Vin is also applied to the terminals 2V and 2W via a three-phase coil (not shown) of the motor 200, and a V phase detection voltage Vv and a W phase detection voltage Vw also reach a level of H. Therefore, when (Vu, Vv, Vw)=(H, H, H), the disconnection determining section 40 determines that there is no disconnection fault in the inverter 100.

The disconnection determining section 40 determines that the W phase on the side of the motor 200 (external W phase) is disconnected when (Vu, Vv, Vw)=(H, H, L). When (V, Vv, Vw)=(H, L, H), the disconnection determining section 40 determines that the V phase on the side of the motor 200 (external V phase) is disconnected. When Vu, Vv, Vw=(H, L, L), the disconnection determining section 40 determines that the U phase on the side of the motor 200 (external U phase) or the V phase and W phase on the side of the motor 200 (external V phase and external W phase) is disconnected. When Vu, Vv, Vw=(L, L, L), the disconnection determining section 40 determines that the U phase (internal U phase) of the inverter output section 10 is disconnected, that is, the switch element 1U is in the open-circuit fault state.

Other combinations of detected voltages, that is, (Vu, Vv, Vw)=(L, H, H), (Vu, Vv, Vw)=(L, H, L), and (Vu, Vv, Vw)=(L, L, H) are detection voltage patterns that are not observed in the present example.

The disconnection determining section 40 may perform the above disconnection determination a plurality of times and comprehensively perform disconnection determination based on determination results of each time. In this case, the control section 20 needs to charge the bootstrap circuit 11U by turning on the lower switch element 1X before turning on the upper switch 1U.

Second Example

Figure 11:
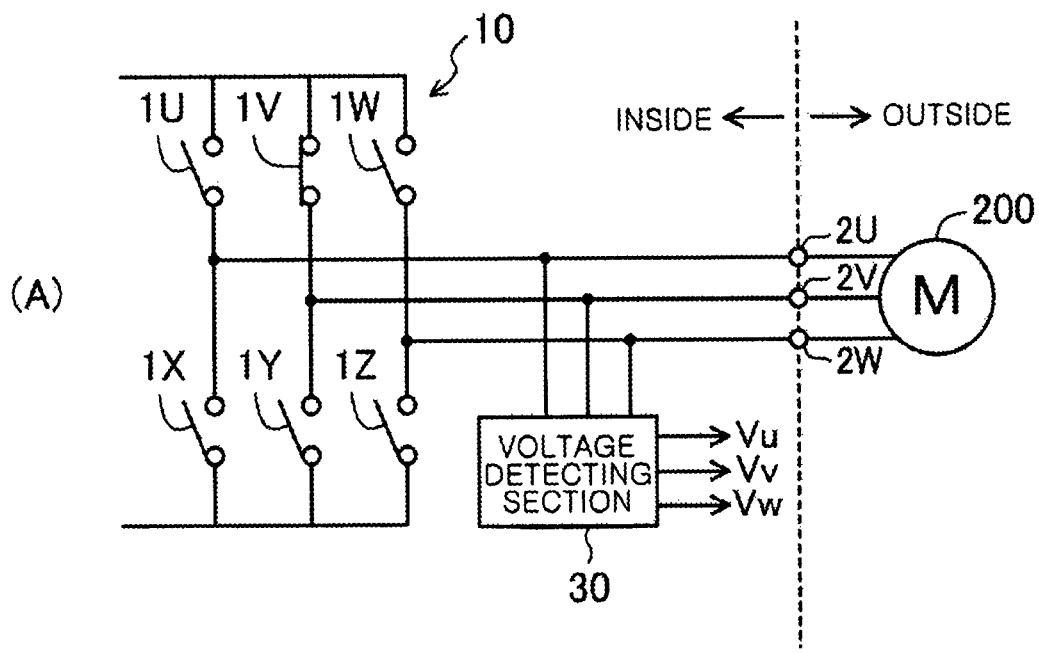
FIG. 11 is a diagram illustrating a second switching control and a table showing a disconnection determination condition in a disconnection fault diagnosis.

FIG. 11 part (A) is a schematic diagram showing a second switching control example at the time of diagnosis of a disconnection fault, and FIG. 11 part (B) is a table showing disconnection determination conditions. The present example illustrates a disconnection fault diagnosis when only the upper switch element 1V of the inverter output section 10 is turned on. On the other hand, in FIG. 11 part (A), each switch element is represented by a symbol that indicates the turn-on/turn-off (ON/OFF) states.

When the inverter 100 has no disconnection fault and only the switch element 1V is turned on, the input DC voltage Vin of the inverter output section 10 is applied to the terminal 2V, and the V-phase detection voltage Vv output from the voltage detecting section 30 reaches a level H. The input DC voltage Vin is also applied to the terminals 2U and 2W via a three-phase coil (not shown) of the motor 200, and the U phase detection voltage Vu and the W phase detection voltage Vw output from the voltage detecting section 30 reach a level of H. Therefore, when (Vu, Vv, Vw)=(H, H, H), the disconnection determining section 40 determines that there is no disconnection fault in the inverter 100.

When (Vu, Vv, Vw)=(H, H, L), the disconnection determining section 40 determines that the W phase on the side of the motor 200 (external W phase) is disconnected. When Vu, Vv, Vw=(L, H, H) the disconnection determining section 40 determines that the U phase on the side of the motor 200 (external U phase) is disconnected. When (Vu, Vv, Vw)=(L, H, L), the disconnection determining section 40 determines that the V phase on the side of the motor 200 (external V phase), or the U phase and W phase on the side of the motor 200 (external U phase and external W phase) is disconnected. When (Vu, Vv, Vw)=(L, L, L), the disconnection determining section 40 determines that the V phase (internal V phase) of the inverter output section 10 is disconnected, that is, the switch element 1V is open-circuit fault.

Other combinations of detected voltages, that is, (Vu, Vv, Vw)=(H, L, H), (Vu, Vv, Vw)=(H, L, L), (Vu, Vv, Vw)=(L, L, H) are detection voltage patterns that are not observed in the present example.

The disconnection determining section 40 may perform the above disconnection determination a plurality of times and comprehensively perform disconnection determination from the determination results of each of the above-mentioned disconnection determination results. In this case, the control section 20 needs to charge the bootstrap circuit 11V by turning on the lower switch element 1Y before turning on the upper switch element 1V.

Third Example

Figure 12:
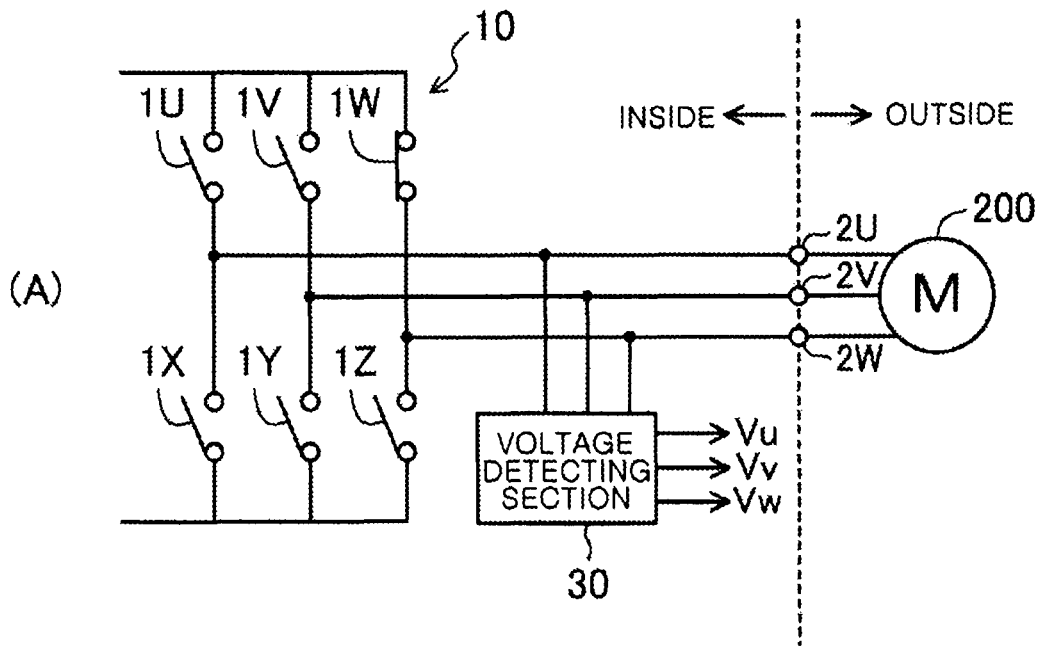
FIG. 12 is a diagram illustrating a third switching control and a table showing a disconnection determination condition in a disconnection fault diagnosis.

FIG. 12 part (A) is a schematic diagram showing a third switching control example at the time of diagnosis of a disconnection fault, and FIG. 12 part (B) is a table showing disconnection determination conditions. The example illustrates a disconnection fault diagnosis when only the upper switch element 1W of the inverter output section 10 is turned on. On the other hand, in FIG. 12 part (A), each switch element is represented by a symbol that indicates the turn-on/turn-off (ON/OFF) states.

When there is no disconnection fault in the inverter 100 and only the switch element 1W is turned on (ON), the input DC voltage Vin of the inverter output section 10 is applied to the terminal 2W and the W phase detection voltage Vw output from the voltage detecting section 30 reaches a level H. The input DC voltage Vin is also applied to the terminals 2U and 2W through a three-phase coil (not shown) of the motor 200. The U phase detection voltage Vu and the V phase detection voltage Vv output from the voltage detecting section 30 reach a level of H. Therefore, when (Vu, Vv, Vw)=(H, H, H) as shown in the disconnection determination conditions of FIG. 12 part (B), the disconnection determining section 40 determines that there is no disconnection fault of the inverter 100.

When (V, Vv, Vw)=(H, L, H), the disconnection determining section 40 determines that the V phase on the side of the motor 200 (external V phase) is disconnected. When Vu, Vv, Vw=(L, H, H), the disconnection determining section 40 determines that the U phase on the side of the motor 200 (external W-phase) is disconnected. When (Vu, Vv, Vw)=(L, L, H), the disconnection determining section 40 determines that the W phase on the side of the motor 200 (external W phase) or the U phase and V phase on the side of the motor 200 (external U phase and external V phase) is disconnected. When (Vu, Vv, Vw)=(L, L, L), the disconnection determining section 40 determines that the W phase of the inverter output section 10 (internal W phase) is disconnected, that is, the switch element 1W has an open-circuit fault.

Other combinations of detected voltages, that is, (Vu, Vv, Vw)=(H, H, L), (Vu, Vv, Vw)=(H, L, L), (Vu, Vv, Vw)=(L, H, L) is a detection voltage pattern not observed in this example.

The disconnection determining section 40 may perform the above disconnection determination a plurality of times and comprehensively perform disconnection determination from the determination results of each session. In this case, the control section 20 needs to charge the bootstrap circuit 11W by turning on the lower switch element 1Z before turning on the upper switch 1W.

On the other hand, when only one of the switch elements 1U, 1V, and 1W is on-controlled, for example, as in (Vu, Vv, Vw)=(H, L, L) corresponding to when the switch element 1U is turned on (ON), an external disconnection region may not be specified. Therefore, the disconnection fault diagnosis may be performed by sequentially turning on the switch elements 1U, 1V and 1W one by one. As a result, the disconnection region of the inverter 100 may be specified.

As described above, according to the present embodiment, the inverter 100 may identify whether the device side (the inverter 100) is disconnected or the external load (the motor 200) is disconnected, thereby eliminating the inconvenience of replacing an inverter at the time of replacing a load due to a failure to identify a faulty region.

In addition, according to the present embodiment, the disconnection fault diagnosis may be performed without flowing current to the inverter output section 10. In this case, even when one of the upper switch elements (1U, 1V and 1W) has a short-circuit fault, the diagnosis of the disconnection fault may be performed without flowing current in a safe manner, thereby preventing a secondary damage from occurring due to a diagnosis process.

Further, according to the present embodiment, since the inverter 100 performs the disconnection fault diagnosis, a false diagnosis due to human error may be prevented.

Further, according to the present embodiment, there is no need for an external device for diagnosing a disconnection fault, and a disconnection fault diagnosis service may be provided at a low cost.

On the other hand, the present invention is not limited to the configuration of the above embodiment, and various modifications are possible. For example, a detection resistor for ground fault detection of an external load may be connected to the emitters of the terminals 2U, 2V and 2W or the lower switch elements 1X, 1Y and 1Z. In such a case, the existence of a ground fault of an external load may be checked and when there is no ground fault, the above-mentioned disconnection diagnosis may be performed.

The configuration and process according to the fourth embodiment shown in FIGS. 9 to 12 are merely an example of the present invention, and are not intended to limit the present invention.

Hereinafter, an inverter according to the fifth embodiment will be described with reference to the drawings.

Figure 13:
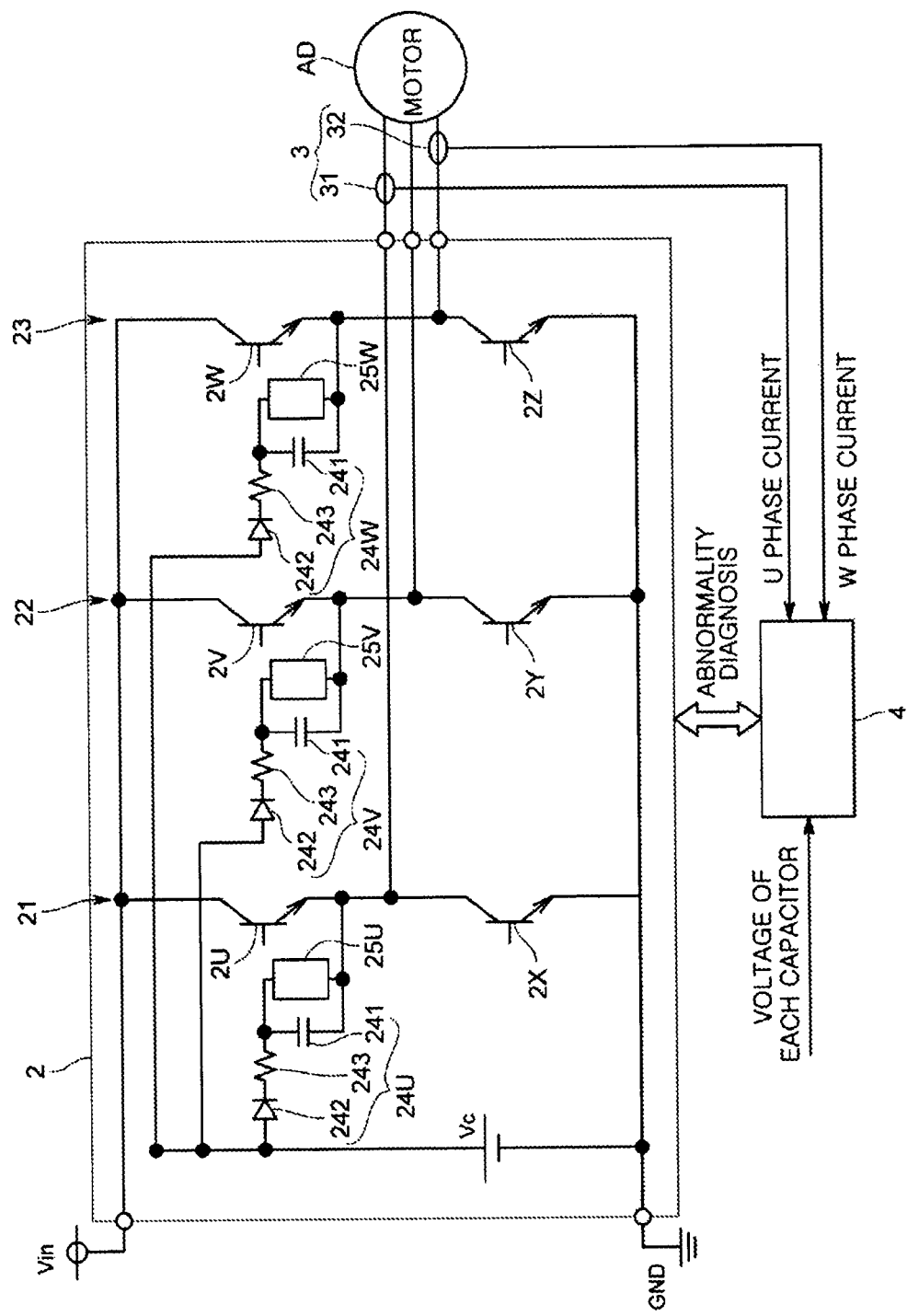
FIG. 13 is a schematic diagram illustrating the configuration of an inverter device according to the fifth embodiment
Figure 14:
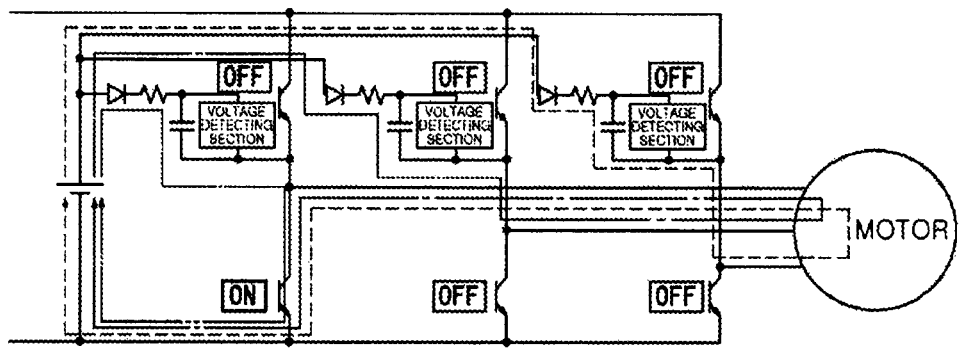
FIG. 14 is a diagram showing a result of voltage detection in a normal state according to the fifth embodiment.
Figure 14:
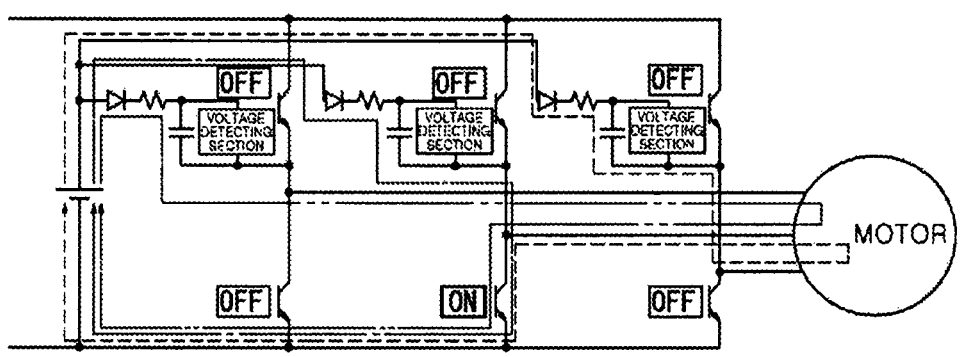
Figure 14:
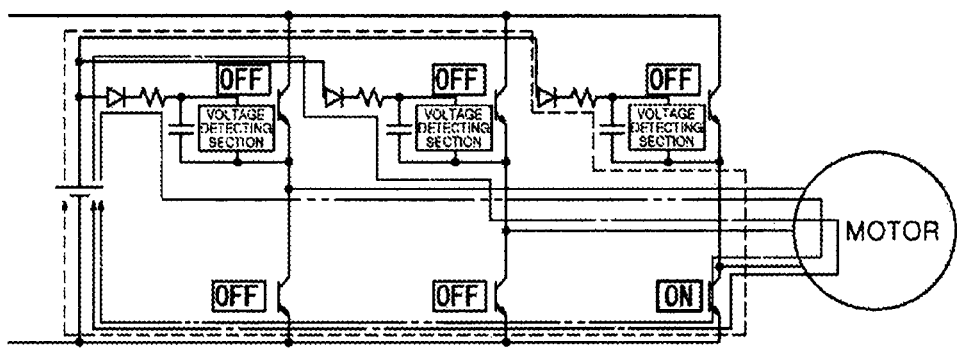
Figure 15:
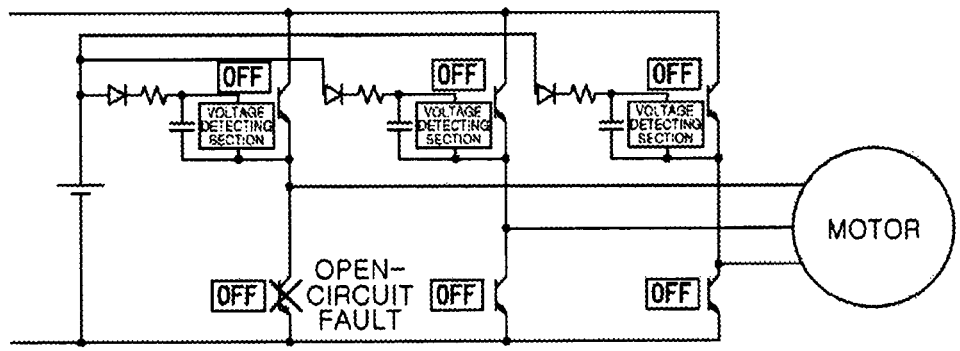
FIG. 15 is a diagram showing a result of voltage detection when a switch element 2X has an open-circuit fault in the fifth embodiment.
Figure 15:
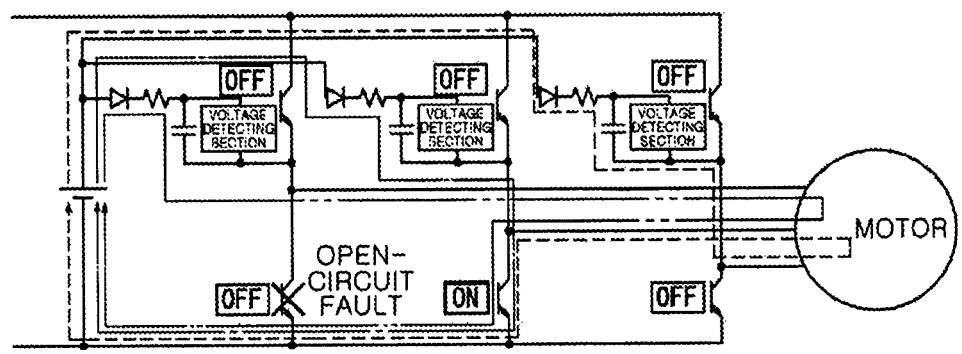
Figure 15:
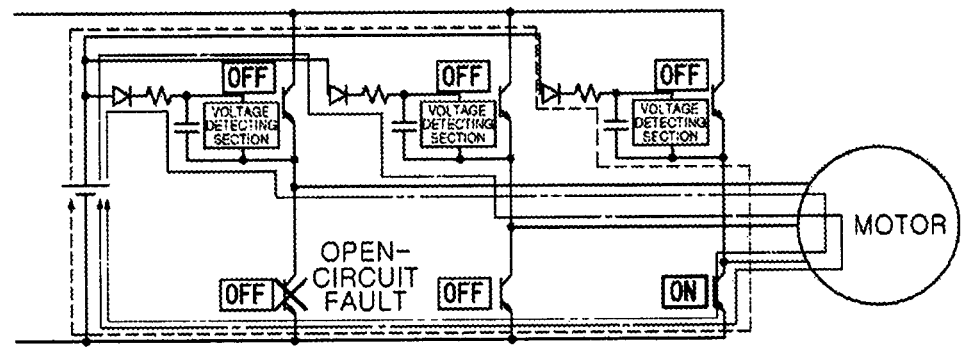
Figure 16:
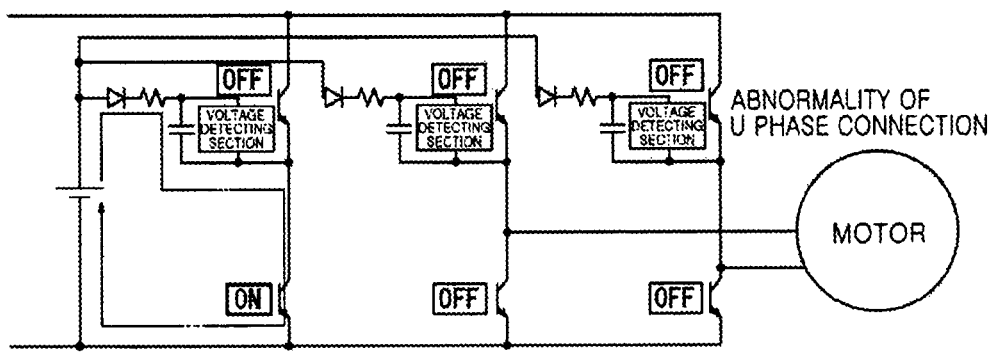
FIG. 16 is a diagram showing a result of voltage detection when a U-phase connection has an abnormality in the fifth embodiment.
Figure 16:
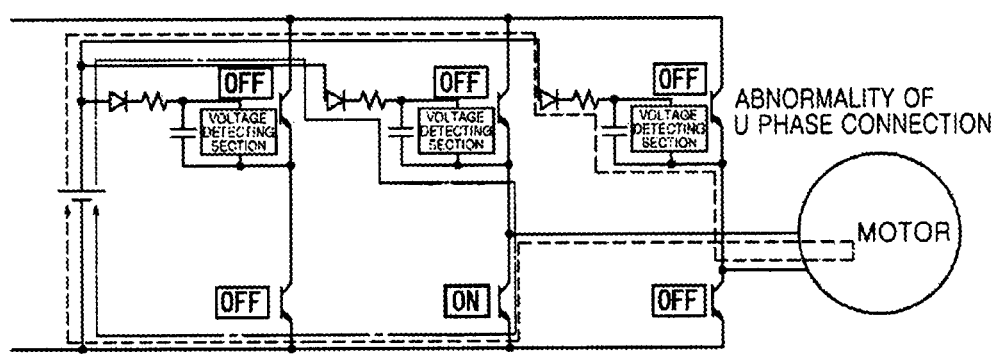
Figure 16:
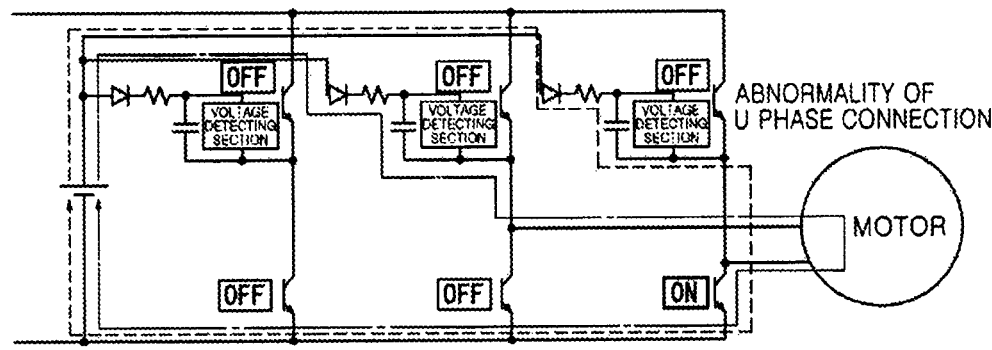
Figure 17:
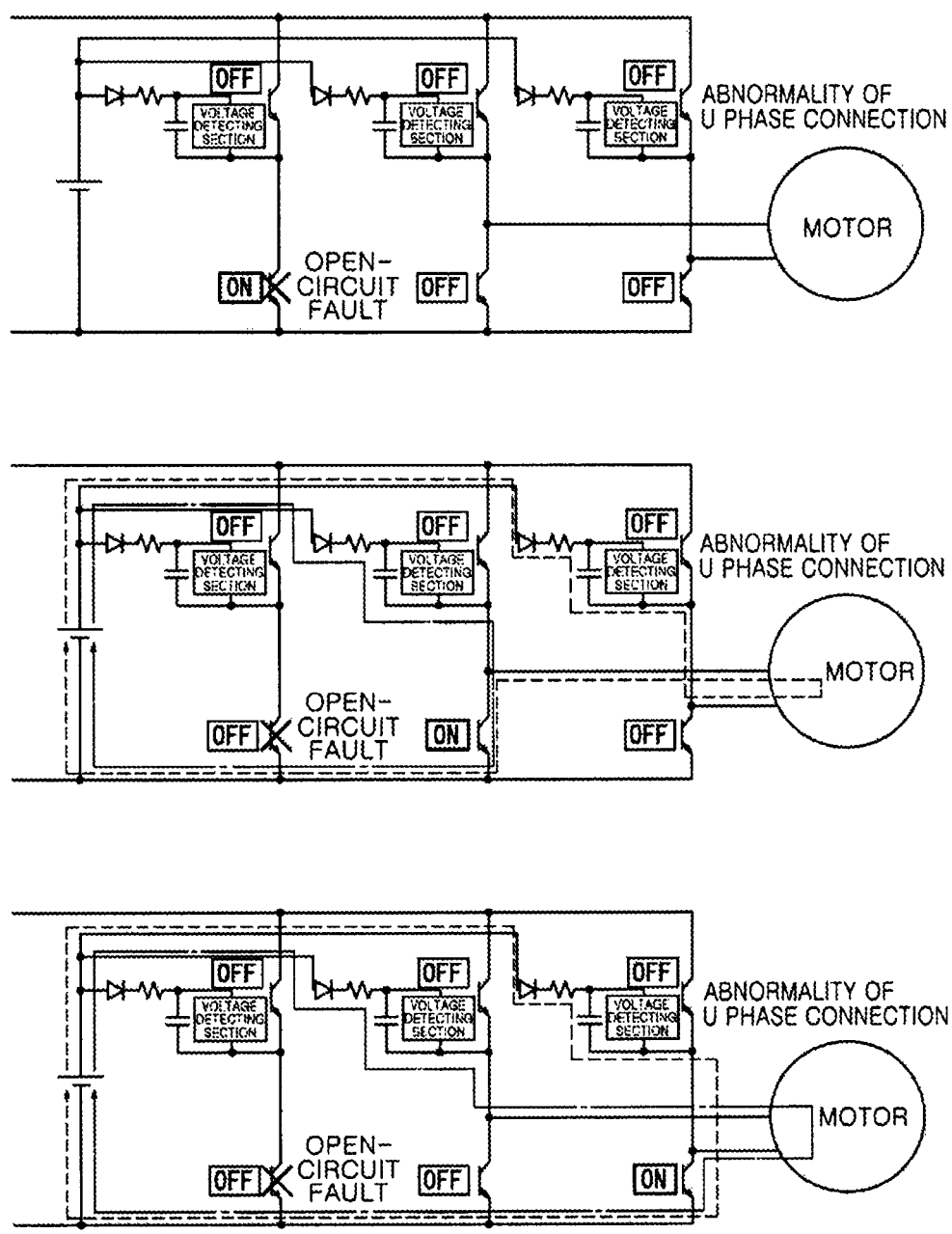
FIG. 17 is a diagram showing a result of voltage detection when a switch element 2X has an open-circuit fault and a U-phase connection connected to the switch element 2X has an abnormality in the fifth embodiment.
Figure 18:
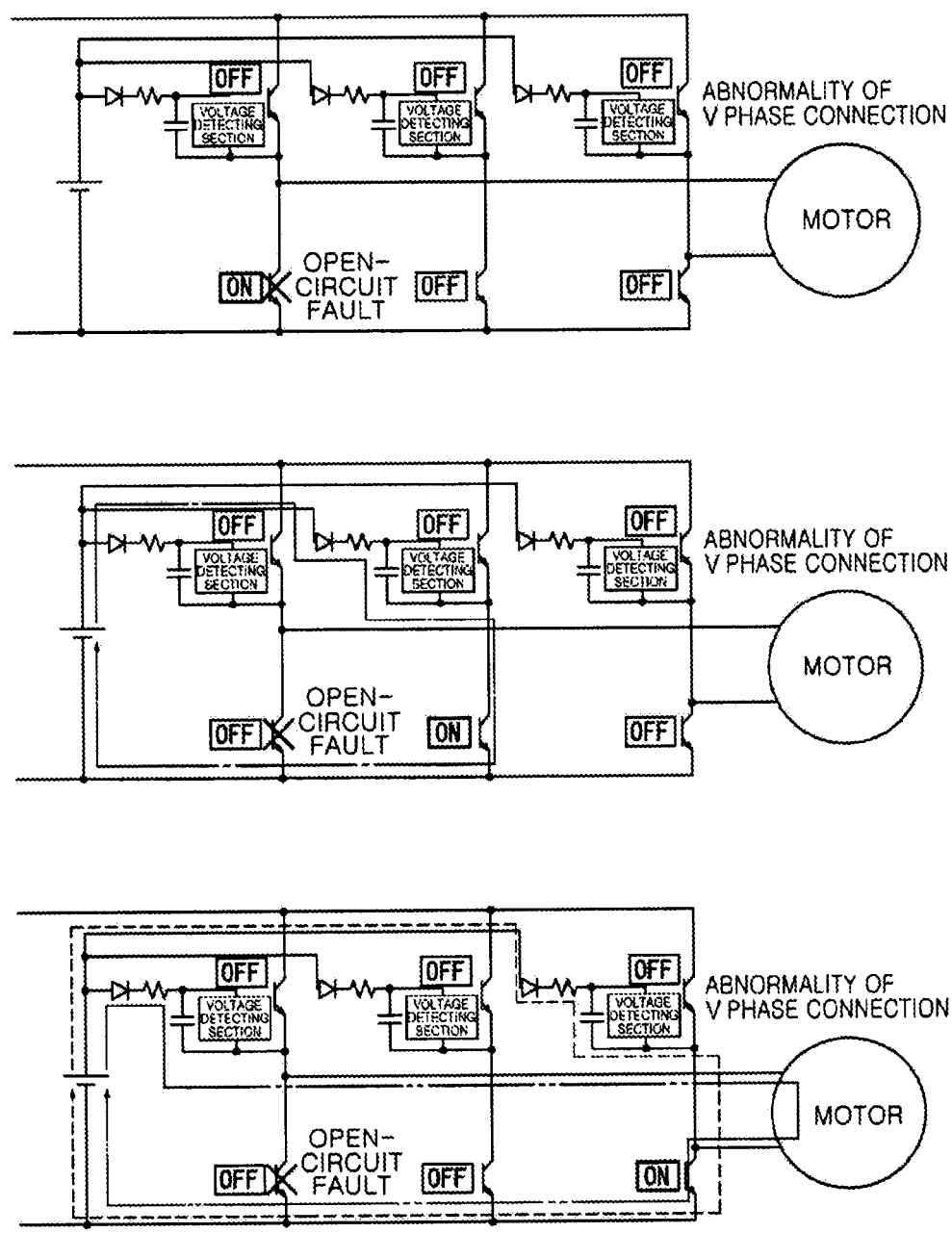
FIG. 18 is a diagram showing a result of voltage detection when a switch element 2X has an open-circuit fault and a V-phase connection connected to a switch element other than the switch element 2X has an abnormality in the fifth embodiment.

FIG. 13 is a schematic diagram illustrating the configuration of an inverter device according to the fifth embodiment. FIG. 14 is a diagram showing a result of voltage detection in a normal state according to the fifth embodiment. FIG. 15 is a diagram showing a result of voltage detection when a switch element 2X has an open-circuit fault in the fifth embodiment. FIG. 16 is a diagram showing a result of voltage detection when a U-phase connection is abnormal in the fifth embodiment. FIG. 17 is a diagram showing a result of voltage detection when a switch element 2X has an open-circuit fault and a U-phase connection connected to the switch element 2X has an abnormality in the fifth embodiment. FIG. 18 is a diagram showing a result of voltage detection according to the fifth embodiment when a switch element 2X has an open-circuit fault and a V-phase connection connected to a switch element other than the switch element 2X has an abnormality.

On the other hand, the reference numerals used in the fifth embodiment are different from those used in the first to fourth embodiments.

An inverter 100 according to the fifth embodiment supplies three-phase AC voltages (R phase, S phase, and T phase) to a three-phase AC motor AD, such as a three-phase motor, so that the three-phase AC motor AD is driven. The inverter 100 includes an inverter circuit 2 for converting a DC voltage outputted from a DC power supply or a converter circuit to three-phase AC voltages and connected to an AC motor AD, and a diagnostic device 4 for diagnosing an abnormality of the inverter circuit 2 and the AC motor AD, or connections.

The inverter circuit 2 includes three half bridge circuits (serial circuit portions) 21 to 23 including upper switch elements 2U, 2V and 2W and lower switch elements 2X, 2Y and 2Z connected in series to the upper switches 2U, 2V and 2W. The upper switch elements 2U, 2V and 2W and the lower switch elements 2X, 2Y and 2Z are, for example, insulated gate bipolar transistors (IGBTs).

The inverter circuit 2 is also provided with bootstrap circuits 24U, 24V and 24W for generating drive voltages of the upper switch elements 2U, 2V and 2W.

The bootstrap circuits 24U, 24V and 24W are provided in the three upper switch elements 2U, 2V and 2W, respectively, and have one ends thereof connected to a control power supply VC and the other ends thereof connected to connection points between the upper switch elements 2U, 2W and the lower switch elements 2X, 2Y, 2Z. In detail, the bootstrap circuits 24U, 24V, and 24W each include a capacitor 241, a diode 242, and a restriction resistor 243. In the following description, to distinguish the capacitors 241 of the bootstrap circuits 24U, 24V and 24W from each other, the capacitor of the bootstrap circuit 24U is denoted by 241U, the capacitor of the bootstrap circuit 24V is denoted by 241V, and the capacitor of the bootstrap circuit 24W is denoted by 241W.

When the lower switch elements 2X, 2Y and 2Z are turned on in the bootstrap circuits 24U, 24V and 24W structured as described above, the voltages (drive voltages) for driving the upper switch elements 2U, 2V and 2W are charged in the respective capacitors 241U, 241V, and 241W.

The bootstrap circuits 24U, 24V and 24W are provided with capacitor voltage detecting sections 25U, 25V and 25W for detecting voltages charged in the capacitors 241U, 241V and 241W.

On the other hand, the inverter circuit 2 is provided with an inverter current detecting section 3 for detecting the current flowing through the inverter circuit 2 for at least two phases or more. The inverter current detecting section 3 of the present embodiment includes a U-phase current detecting section 31 connected to a U-phase connection to detect a U-phase current and a W-phase current detecting section 32 connected to a W connection to detect a W-phase current. In addition, the inverter current detecting section 3 may include a shunt resistor connected in series to negative potential side terminal of the lower switch element 2X, 2Y, 2Z, and may detect the current flowing in the shunt resistor. In this case, the inverter current detecting section 3 may be provided in a single shunt type in which only a shunt resistor is connected to the lower switch element 2X, or in a three-shunt type in which shunt resistors are connected to the lower switch element 2X and the lower switch element 2Z.

The diagnostic device 4 includes a first step of performing an abnormality diagnosis by selectively turning on the lower switch elements 2X, 2Y and 2Z one by one, and then a second step of performing an abnormality diagnosis by turning on the upper switch elements 2U, 2V and 2W and the lower switch elements 2X, 2Y and 2Z at the same time to be short-circuited in each of the half bridge circuits 21 to 23.

Hereinafter, the diagnostic content of the diagnostic device 4 in each step will be described in detail.

<First Step>

According to the first step, the diagnostic device 4 diagnoses an open-circuit fault of the lower switch elements 2X, 2Y and 2Z and an abnormality of the AD motor or connections by selectively turning on the lower switch elements 2X, 2Y, and 2Z of the plurality of half bridge circuits 21 to 23 one by one and using measurement result patterns of capacitor voltages obtained by the capacitor voltage detecting sections 24U, 24V and 24W.

Herein, details of the diagnosis will be described.

When all of the lower switch elements 2X, 2Y and 2Z, the AC motor AD and the connections are normal and the lower switch elements 2X, 2Y and 2Z are selectively turned on one by one, as shown in FIG. 14, all of the capacitors 241U, 241V, and 241W are charged. That is, the measurement result patterns of the capacitor voltages are shown in Table 1 below. On the other hand, in the following Tables 1 to 5, "○" is indicative of charged, and "-" is indicative of not charged.

TABLE 1

| | Voltage Detection Result | | |
|---|---|---|---|
| | Left(24X) | Center(24Y) | Right(24Z) |
| Left(2X) ON | ○ | ○ | ○ |
| Center(2Y) ON | ○ | ○ | ○ |
| Right(2Z) ON | ○ | ○ | ○ |

In a case that the lower switch element 2X has an open-circuit fault and the AC motor and the connections are normal and the lower switch elements 2X, 2Y and 2Z are selectively turned on one by one, as shown in FIG. 15, any one of the capacitors 241U, 241V, and 241W is not charged when the capacitor 2X having an open-circuit fault is turned on. When the other e lower switch elements 2Y and 2Z having no open-circuit fault are turned ON, all of the capacitors 241U, 241V and 241W are charged. The measurement result patterns of the capacitor voltages are shown in Table 2 below.

TABLE 2

| | Voltage Detection Result | | |
|---|---|---|---|
| | Left(24X) | Center(24Y) | Right(24Z) |
| Left(2X) ON | — | — | — |
| Center(2Y) ON | ○ | ○ | ○ |
| Right(2Z) ON | ○ | ○ | ○ |

In a case that all of the lower switch elements 2X, 2Y and 2Z are normal and the U-phase connection is abnormal and the lower switch elements 2X, 2Y and 2Z are selectively turned on one by one, as shown in FIG. 16, when the lower switch element 2X connected to the U-phase connection is turned on, only the capacitor 241U connected to the U-phase connection is charged, and when the other lower switch elements 2Y and 2Z are turned on, the capacitors 241V and 241W connected to the V phase connection and the W phase connection are charged. The measurement result patterns of the capacitor voltages are shown in Table 3 below.

TABLE 3

| | Voltage Detection Result | | |
|---|---|---|---|
| | Left(24X) | Center(24Y) | Right(24Z) |
| Left(2X) ON | ○ | — | — |
| Center(2Y) ON | — | ○ | ○ |
| Right(2Z) ON | — | ○ | ○ |

In a case that the lower switch element 2X has an open-circuit fault, the U-phase connection connected to the lower switch element 2X having an open-circuit fault is abnormal, and the lower switch elements 2X, 2Y and 2Z are selectively turned on one by one, as shown in FIG. 17, when the lower switch element 2X is turned on, any of the capacitors 241U, 241V and 241W is not charged, and when the other lower-side switch elements 2Y and 2Z which are not failed are turned on, only the capacitors 241V and 241W connected to the normal V-phase connection and W-phase connection are charged. The measurement result patterns of the capacitor voltages are shown in Table 4 below.

TABLE 4

| | Voltage Detection Result | | |
|---|---|---|---|
| | Left(24X) | Center(24Y) | Right(24Z) |
| Left(2X) ON | — | — | — |
| Center(2Y) ON | — | ○ | ○ |
| Right(2Z) ON | — | ○ | ○ |

In a case that the lower switch element 2X has an open-circuit fault and the phase other than the U-phase connection (V-phase connection) connected to the lower switch element 2X is abnormal and the lower switch elements 2X, 2Y, and 2Z are selectively turned on one by one, as shown in FIG. 18, any of the capacitors 241U, 241V and 241W is not charged when the failed lower switch element 2X is turned on. When the lower switch element 2Y connected to the abnormal V-phase connection is turned on, only the capacitor 241V connected to the abnormal V-phase connection is charged. When the other lower switch element 2Z is turned on, the capacitors 241U and 241W connected to the U phase connection and the W phase connection, which are normal, are charged. The measurement result patterns of the capacitor voltages are shown in Table 5 below.

TABLE 5

| | Voltage Detection Result | | |
|---|---|---|---|
| | Left(24X) | Center(24Y) | Right(24Z) |
| Left(2X) ON | — | — | — |
| Center(2Y) ON | — | ○ | — |
| Right(2Z) ON | ○ | — | ○ |

Similarly, when all the fault modes are summarized, the fault of each section may be diagnosed by the combination shown in Table 6 below.

TABLE 6

| | Voltage Detection Result | | |
|---|---|---|---|
| | Left(24X) | Center(24Y) | Right(24Z) |
| Left(2X) ON | ○ | △□ | △◇ |
| Center(2Y) ON | △□ | ○ | □◇ |
| Right(2Z) ON | △□ | □◇ | ○ |

In Table 6, when a part corresponding to "○" is in error (the capacitor is not charged), it indicates that the lower switch element corresponding to the part has an open-circuit fault.

When all parts corresponding to "△" are in errors, it indicates that the U-phase connection connected to the lower switch element 2X is abnormal.

When all parts corresponding to "□" are in error, it indicates that the V-phase connection connected to the lower switch element 2Y is abnormal.

When all parts corresponding to "◇" are in error, it indicates that the W-phase connected to the lower switch element 2Z is abnormal.

Then, by using the combinations of errors in all the above-mentioned fault modes, the diagnostic device 4 compares the measurement result patterns of the capacitor voltages, which are obtained by selectively turning on the lower switch elements 2X, 2Y, and 2Z one by one, with the combinations, to diagnose an open-circuit fault of the lower switch element 2X, 2Y, 2Z and an abnormality of the AC motor or the connections. On the other hand, data indicating the combinations of errors in all the fault modes is stored in a memory of the diagnostic device.

In the first step, when a capacitor voltage equal to or greater than a predetermined value is detected by the capacitor voltage detecting sections 25U, 25V, and 25W with the lower switch elements 2X, 2Y, and 2Z in OFF states, the diagnostic device 4 diagnoses that the lower switch elements 2X, 2Y and 2Z have a short-circuit fault.

Figure 19:
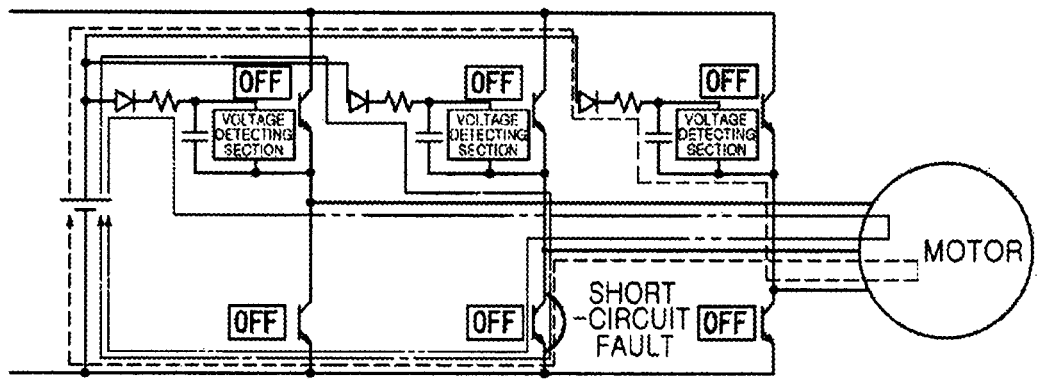
FIG. 19 is a diagram showing the current when a lower switch element 2Y has a short-circuit fault in the fifth embodiment.
Figure 20:
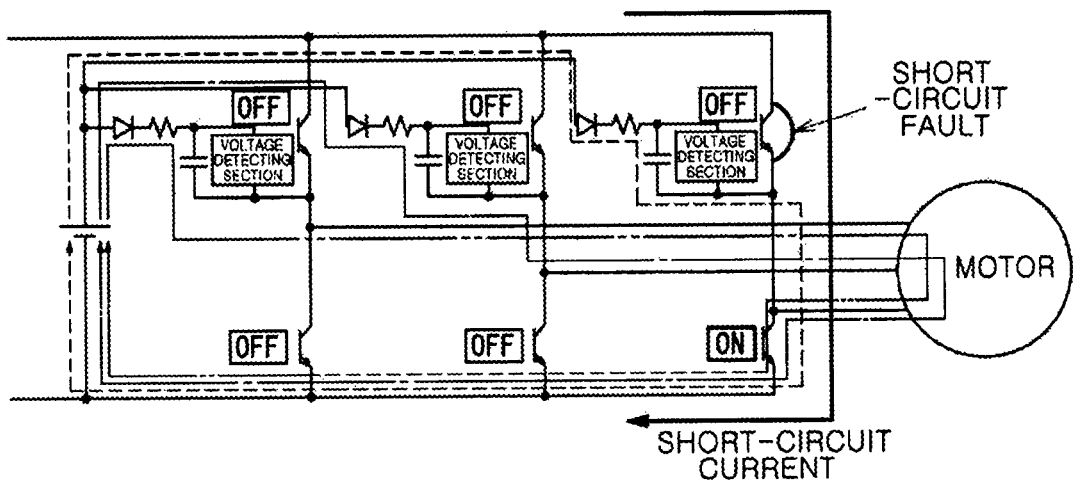
FIG. 20 is a diagram showing the current when an upper switch element 2W has a short-circuit fault in the fifth embodiment.

FIG. 19 is a diagram showing the current when the lower switch element 2Y has a short-circuit fault in the fifth embodiment, and FIG. 20 is a diagram showing the current when the upper switch element 2W has a short-circuit fault in the fifth embodiment.

Referring to FIG. 19, in a case that the lower switch element 2Y has a short-circuit fault, even when the lower switch elements 2X, 2Y, 2Z are turned off, the capacitor 241V corresponding to the upper switch element 2V connected in series to the lower switch element 2Y, which has a short-circuit fault, is charged. In this case, in a state that the lower switch elements 2X, 2Y, 2Z are turned off, a capacitor voltage equal to or greater than a predetermined value is detected by the capacitor voltage detecting section 25V. As a result, the diagnostic device 4 diagnoses that the lower switch element 2Y has a short-circuit fault.

In the first step, the when the lower switch elements 2X, 2Y, 2Z are selectively turned on one by one and a short-circuit current equal to or greater than a predetermined value is detected by the inverter current detecting section 3, the diagnostic device 4 diagnoses that the upper switch elements 2U, 2V, 2W have a short-circuit fault.

For example, as shown in FIG. 20, in a case that the upper switch element 2W has a short-circuit fault and the lower switch elements 2X, 2Y, and 2Z are selectively turned on one by one, when the lower switch element 2W is turned on, a short-circuit current flows separately from the capacitors 241U, 241V, and 241W. The short-circuit current is detected by the inverter current detecting section 3 or another short-circuit current detecting section. Thus, the upper switch element 2W is diagnosed to have a short circuit fault.

<Second Step>

Next, the second step performed after the first step will be described.

In the second step, the diagnostic device 4 short-circuits the upper switch elements 2U, 2V and 2W and the lower switch elements 2X, 2Y and 2Z at the same time for each of the half bridge circuits 21 to 23, and when no current is detected by the inverter current detecting section 3, diagnoses that the upper switch elements 2U, 2V, and 2W have an open-circuit fault.

Figure 21:
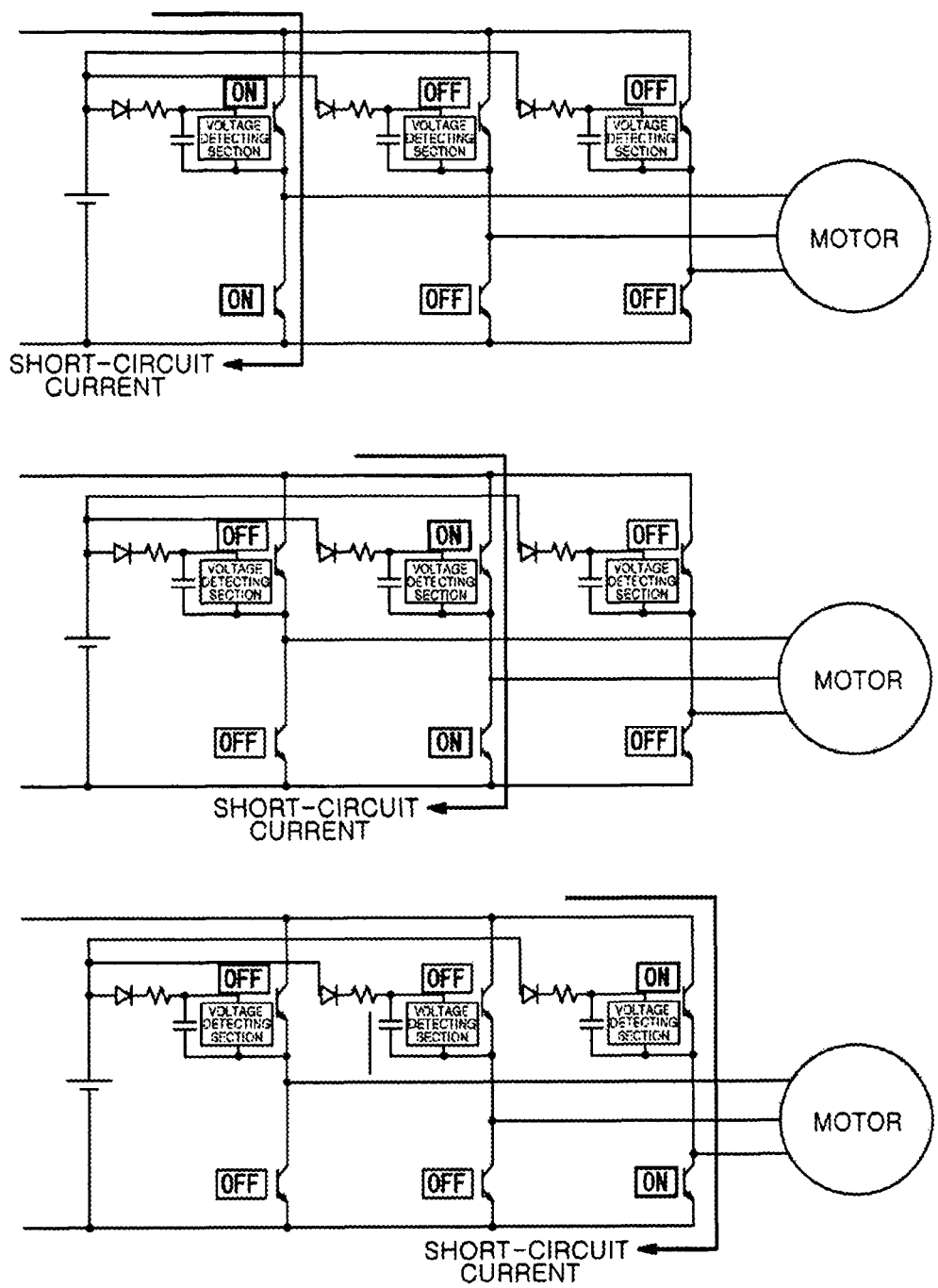
FIG. 21 is a diagram showing a method of diagnosing an open-circuit fault of an upper switch element in the fifth embodiment.
Figure 22:
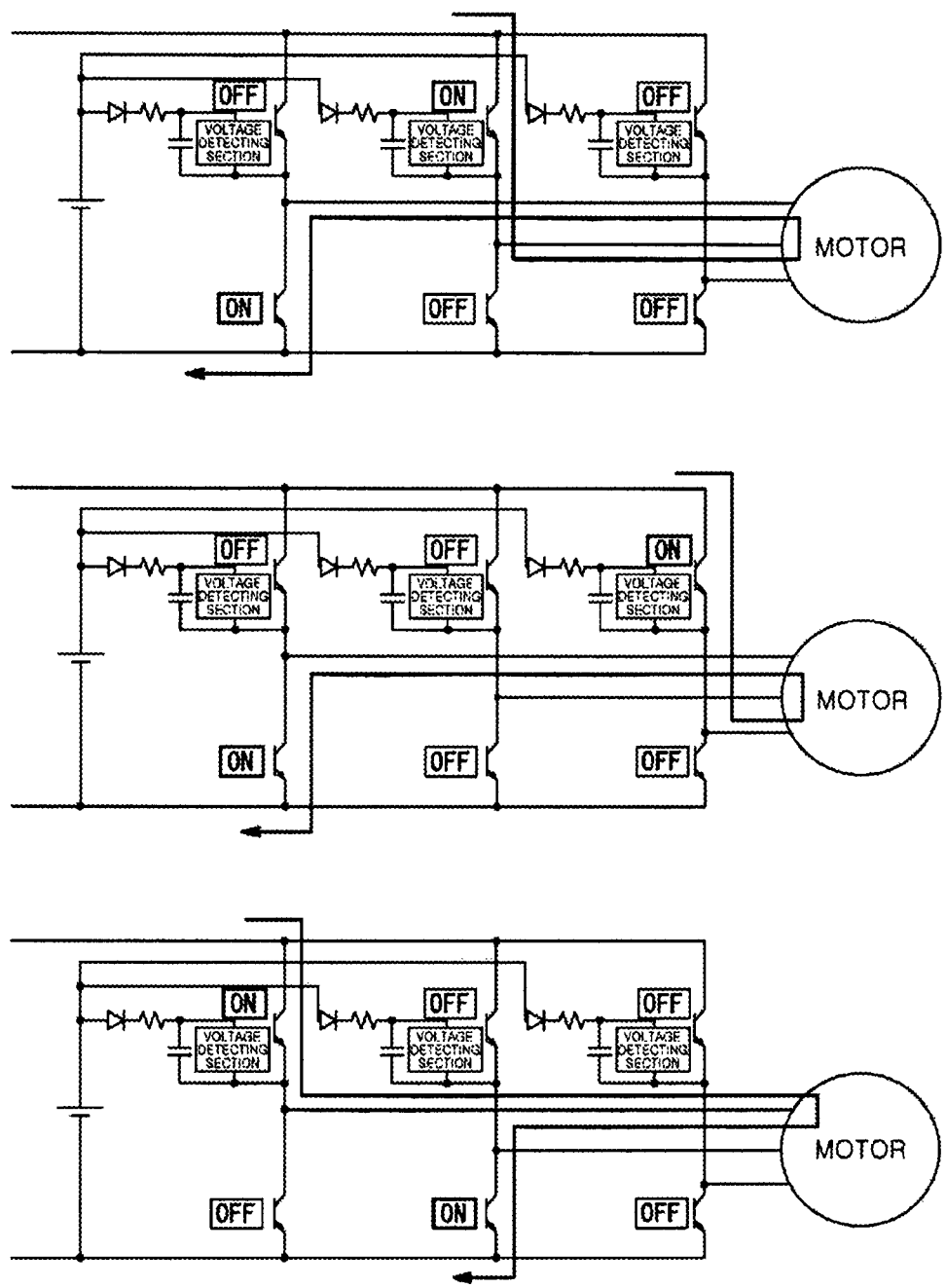
FIG. 22 is a diagram showing another method of diagnosing an open-circuit fault of an upper switch element in the fifth embodiment.

FIG. 21 is a diagram showing a method of diagnosing an open-circuit fault of the upper switch element in the fifth embodiment, and FIG. 22 is a diagram showing another method of diagnosing the open-circuit fault of the upper switch element in the fifth embodiment.

For example, as shown in FIG. 21, (1) the upper switch element 2U and the lower switch element 2X are simultaneously turned on to short-circuit the half bridge circuit 21, (2) the upper switch element 2V and the lower switch element 2Y are simultaneously turned on to short-circuit the half bridge circuit 22, and (3) the upper switch element 2W and the lower switch element 2Z are simultaneously turned on to short-circuit the half bridge circuit 23. In this case, when all the upper switch elements 2U, 2V and 2W are normal, the short-circuit current is detected by the inverter current detecting section 3 or another short-circuit current detecting section. On the other hand, for example, when the upper switch element 2U has an open-circuit fault, the short-circuit current is not detected even if the upper switch element 2U and the lower switch element 2X are turned on at the same time. Thus, the upper switch element 2U may be diagnosed as an open-circuit fault.

According to the inverter 100 constructed as described above, the diagnostic device diagnoses the abnormality of the inverter circuit and the abnormality of the AC motor or the connections by controlling ON/OFF of the upper switch elements 2U, 2V and 2W and the lower switch elements 2X, 2Y and 2Z, and using voltages obtained from the capacitor voltage detecting sections 24U and 24V. Therefore, even when a plurality of faults occur simultaneously, the region and details may be accurately diagnosed by effectively using the capacitor of the bootstrap circuit.

In detail, according to the present embodiment, based on the measurement result pattern of the capacitor voltage obtained by selectively turning on the plurality of the lower switch elements 2X, 2Y and 2Z one by one, the lower switch elements 2X, 2Y, and 2Z having an open-circuit fault are identified and an abnormal connection is identified.

Also, based on the capacitor voltage obtained in a state where the upper switch elements 2U, 2V and 2W and the lower switch elements 2X, 2Y and 2Z are turned off, the lower switch elements 2X, 2Y, 2Z having a short-circuit fault are identified. Also, based on presence of a short-circuit current generated by selectively turning on the plurality of lower switch elements 2X, 2Y and 2Z one by one, the upper switch elements 2U, 2V, and 2W having a short-circuit fault are identified.

Further, based on the presence of a short-circuit current generated by simultaneously turning on the upper switch elements 2U, 2V, and 2W and the lower switch elements 2X, 2Y, and 2Z, the upper switch elements 2U, 2V, and 2W having an open-circuit fault are identified.

On the other hand, the present invention is not limited to the fifth embodiment.

For example, in the second step of the fifth embodiment, the diagnostic device may allow the upper switch element to diagnose an open-circuit fault by performing turn on/turn off on the upper switch elements and the lower switch element of the half bridge circuits so that current flows through the AD motor, and by using current obtained by the inverter current detecting section.

For example, as shown in FIG. 22, (1) the upper switch element 2V and the lower switch element 2X are simultaneously turned on to flow current in the AC motor AD, (2) the upper switch element 2W and the lower switch element 2U are simultaneously turned on to flow current in the AC motor AD, and (3) the upper switch element 2U and the lower switch element 2Y are simultaneously turned on to flow current in AC motor AD. In this case, when all of the upper switch elements 2U, 2V and 2W are normal, the current obtained by the inverter current detecting section 3 has a normal value. On the other hand, for example, when the upper switch element 2U has an open-circuit fault, current does not flow in the AC motor AD even if the upper switch element 2U and the lower switch element 2Y are turned on at the same time. Thus, the upper switch element 2U may be diagnosed as an open-circuit fault.

Further, in addition to the first and second steps, the fifth embodiment may further include, after the second step, a third step in which the diagnostic device diagnoses an abnormality of the AC motor or the connections by controlling ON/OFF of the upper switch elements and the lower switch elements of the plurality of half bridge circuits to flow current in the AC motor, and using current obtained from the inverter current detecting section.

Hereinafter, an inverter according to the sixth embodiment will be described with reference to the drawings.

Figure 23:
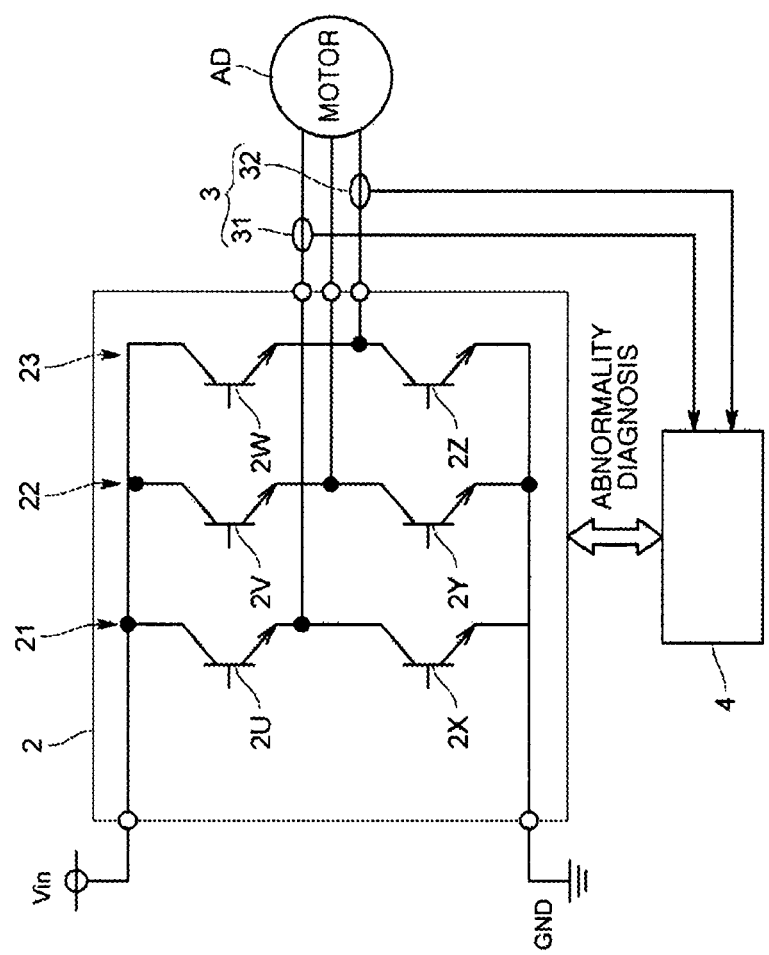
FIG. 23 is a schematic diagram illustrating a configuration of an inverter device according to the sixth embodiment.

FIG. 23 is a schematic diagram showing a configuration of an inverter device according to the sixth embodiment.

Figure 24:
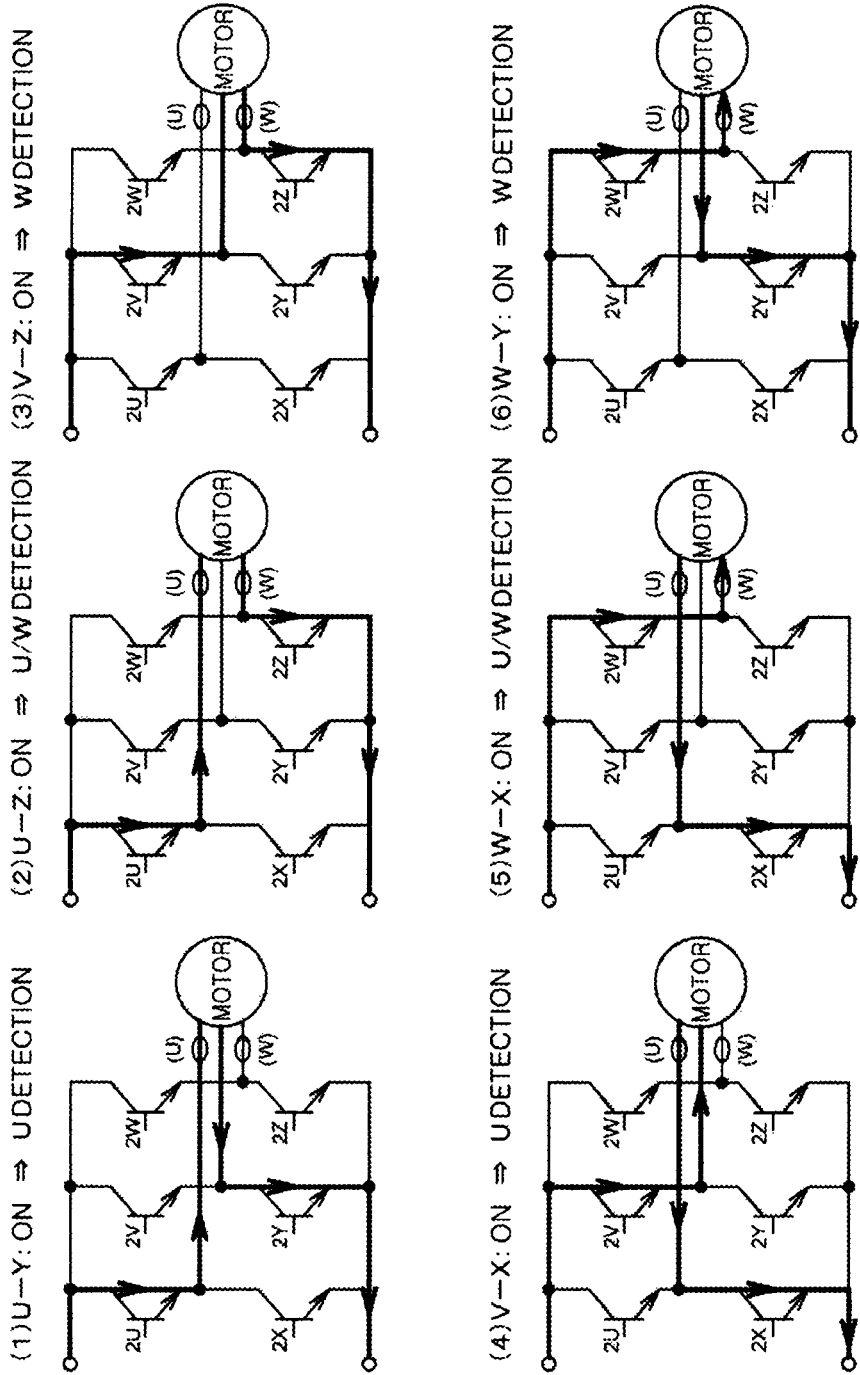
FIG. 24 is a diagram showing a control pattern of each switch element according to the sixth embodiment.

FIG. 24 is a diagram showing a control pattern of each switch element according to the sixth embodiment.

On the other hand, the reference numerals used in the sixth embodiment are different from those used in the first to fourth embodiments.

An inverter 100 according to the sixth embodiment supplies three-phase AC voltages (R phase, S phase, and T phase to a three-phase AC motor AD, such as a three-phase motor. The inverter 100 includes an inverter circuit 2 connected to the AC motor AD and converting a DC voltage outputted from a DC power supply or a converter circuit to three-phase AC voltages and a diagnostic device 4 for diagnosing an abnormality of the inverter circuit 2 and the AC motor AD, or connections.

The inverter circuit 2 includes three half bridge circuits (serial circuit portions) 21 to 23 including upper switch elements 2U, 2V and 2W connected in series and lower switch elements 2X, 2Y and 2Z. The upper switch elements 2U, 2V and 2W and the lower switch elements 2X, 2Y and 2Z are, for example, insulated gate bipolar transistors (IGBTs).

On the other hand, the inverter circuit 2 configured as described above is provided with an inverter current detecting section 3 for detecting the current flowing through the inverter circuit 2 for at least two phases or more. The inverter current detecting section 3 of the present embodiment includes a U-phase current detecting section 31 for detecting a U-phase current and a W-phase current detecting section 32 for detecting a W-phase current. In addition, the inverter current detecting section 3 may include a shunt resistor connected in series to negative terminals of the lower switch element 2X, 2Y, and 2Z, and may detect the current flowing through the shunt resistor. In this case, the inverter current detecting section 3 may be provided in a single shunt type in which a common shunt resistor is connected to the negative sides of the three lower switch elements 2X, 2Y, 2Z, or in a three shunt type in which shunt resistors are respectively connected to the negative sides of the three lower switch elements 2X, 2Y, and 2Z, The diagnostic device 4 diagnoses the abnormality of the inverter circuit 2 by controlling ON/OFF of the upper switch elements 2U, 2V and 2W and the lower switch elements 2X, 2Y and 2Z of the inverter circuit 2.

In detail, the diagnostic device 4 diagnoses an open-circuit fault of the upper switch elements 2U, 2V, and 2W and the lower switch elements 2X, 2Y, and 2Z in the half bridge circuits 21 to 23 by performing the ON/OFF control of the upper switch elements 2U, 2V and 2W and the lower switch elements 2X, 2Y and 2Z in a pattern in which the AC motor (three-phase motor) AD rotates forward, and using the current obtained from the inverter current detecting section.

The on/off patterns in which the AC motor (three-phase motor) AD rotates in the forward direction for the diagnosis of an open-circuit fault of the switch elements 2U, 2V, 2W, 2X, 2Y and 2Z are described as (1)-(6) below.

(1) The upper switch element 2U and the lower switch element 2Y are turned on and the other switch elements 2V, 2W, 2X, and 2Z are turned off.

In this case, U-phase current and V-phase current flow through the inverter circuit 2 and the AC motor AD. Then, the U-phase current is detected by the U-phase current detecting section 31.

(2) The upper switch element 2U and the lower switch element 2Z are turned on, and the other switch elements 2V, 2W, 2X, and 2Y are turned off.

In this case, U-phase current and W-phase current flow through the inverter circuit 2 and the AC motor AD. Then, the U-phase current is detected by the U-phase current detecting section 31, and the W-phase current is detected by the W-phase current detecting section 32.

(3) The upper switch element 2V and the lower switch element 2Z are turned on and the other switch elements 2U, 2W, 2X and 2Y are turned off.

In this case, V-phase current and W-phase current flow through the inverter circuit 2 and the AC motor AD. Then, the W-phase current is detected by the W-phase current detecting section 32.

(4) The upper switch element 2V and the lower switch element 2X are turned on and the other switch elements 2U, 2W, 2Y and 2Z are turned off.

In this case, U-phase current and V-phase current flow through the inverter circuit 2 and AC motor AD. Then, the U-phase current is detected by the U-phase current detecting section 31.

(5) The upper switch element 2W and the lower switch element 2X are turned on and the other switch elements 2U, 2V, 2Y and 2Z are turned off.

In this case, U-phase current and W-phase current flow through the inverter circuit 2 and the AC motor AD. Then, the U-phase current is detected by the U-phase current detecting section 31, and the W-phase current is detected by the W-phase current detecting section 32.

(6) The upper switch element 2W and the lower switch element 2Y are turned on, and the other switch elements 2U, 2V, 2X and 2Z are turned off.

In this case, V-phase current and W-phase current flow through the inverter circuit 2 and the AC motor AD. Then, the W-phase current is detected by the W-phase current detecting section 32.

The above-described ON/OFF controls (1) to (6) are sequentially performed, and by detecting the phase current in each state, a switch element having a fault, among the switch elements 2U, 2V, 2W, 2X, 2Y, 2Z is identified.

For example, when the upper switch element 2U has an open-circuit fault, the current obtained by the U-phase current detecting section 31 in (1) and (2) becomes zero, and in (3) to (6), a normal current is detected.

By sequentially performing the above-mentioned ON/OFF controls of (1) to (6), the open-circuit fault diagnosis of the switch elements 2U, 2V, 2W, 2X, 2Y and 2Z is carried out, by rotating the AC motor AD in the forward rotation direction at the maximum rotation number one turn per several minutes.

According to the inverter 100 constructed as described above, the diagnostic device 4 diagnoses an abnormality of the inverter circuit 2 by controlling on/off of the upper switch elements 2U, 2V, 2W and the lower switch elements 2X, 2Y, 2Z in a pattern in which the AC motor AD rotates in a forward direction. Therefore, the abnormality of the inverter circuit 2 is diagnosed by using the current detecting section 3, which is generally used for normal operation, without damaging the AC motor AD. In this case, since a current for rotating the AC motor AD forward is supplied, a current may be supplied at a level that is not erroneously detected even in the accuracy of the current detecting section normally provided in the inverter circuit 2, thereby preventing diagnosis errors.

According to the above-mentioned ON/OFF patterns of (1) to (6), the open-circuit fault diagnosis of the switch elements 2U, 2V, 2W, 2X, 2Y, and 2Z may be performed by rotating the AC motor AD forward one turn per several minutes.

On the other hand, the present invention is not limited to the sixth embodiment.

For example, the inverter current detecting section may include a V-phase current detecting section for detecting a V-phase current in addition to a U-phase current detecting section and a W-phase current detecting section.

The ON/OFF pattern of each switch element is not limited to the above-described embodiment as long as the AC motor rotates in the forward direction.

When the diagnostic device according to the sixth embodiment is capable of diagnosing the open-circuit fault of the switch element of the inverter circuit by using another method, an open-circuit fault of the AD motor or an open-circuit fault of connection between the inverter circuit and the AD motor also may be diagnosed by using the method of the sixth embodiment.

Hereinafter, an AC motor driving apparatus using an inverter according to the seventh embodiment will be described with reference to the drawings.

Figure 25:
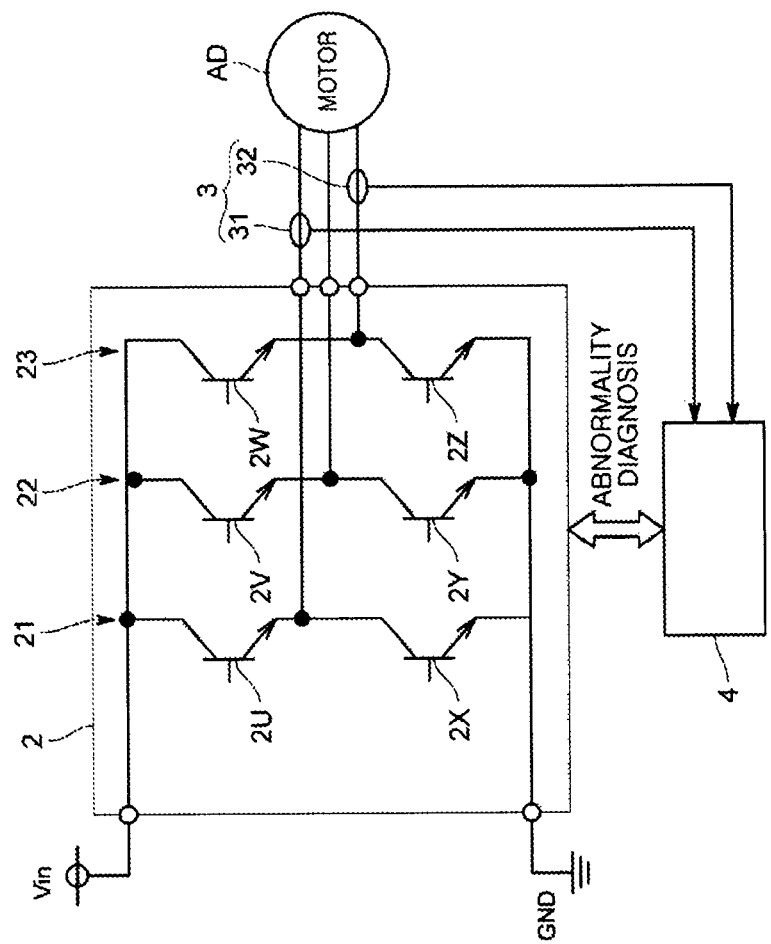
FIG. 25 is a schematic diagram illustrating a configuration of an inverter device according to the seventh embodiment.
Figure 26:
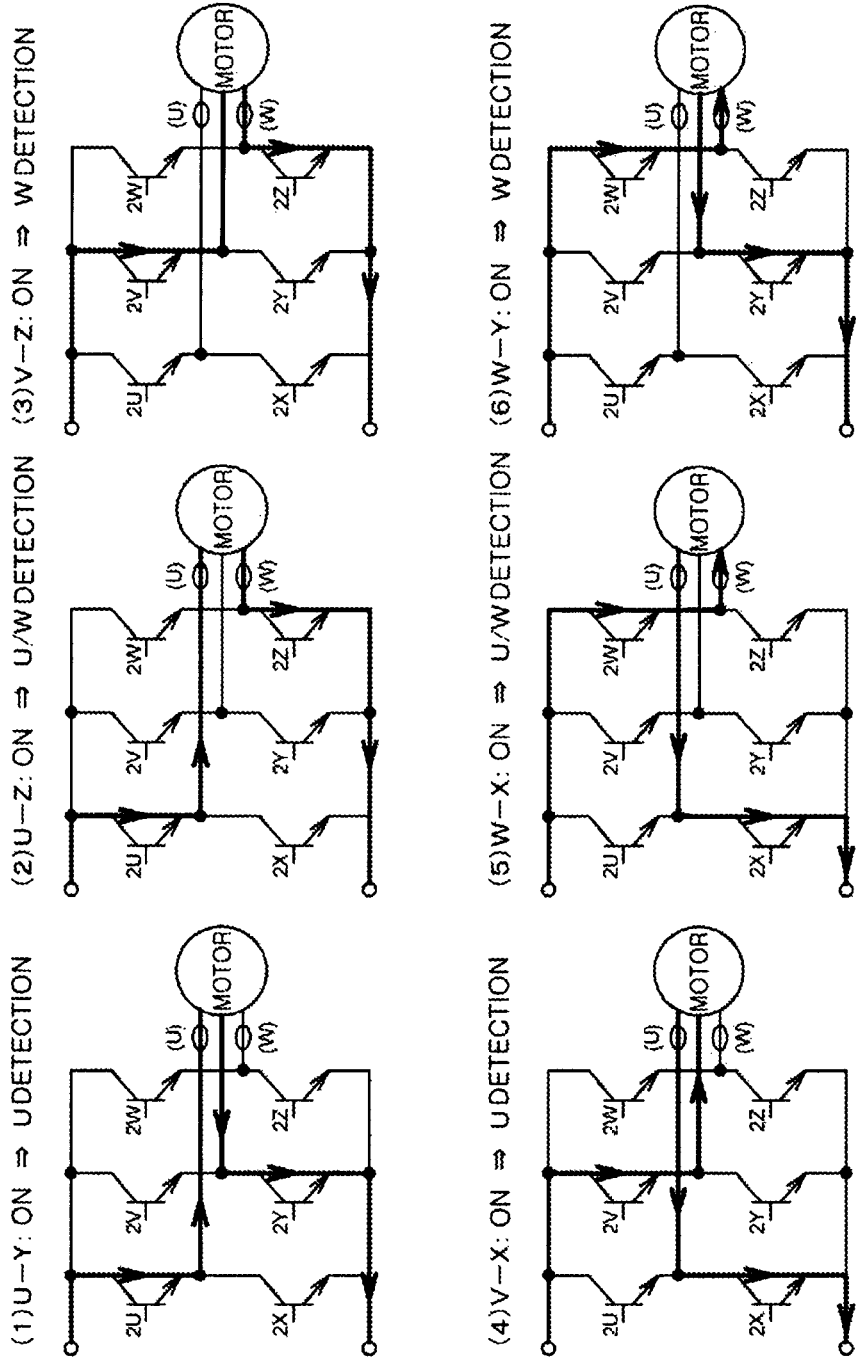
FIG. 26 is a diagram illustrating a control pattern of each switch element according to the seventh embodiment.
Figure 27:
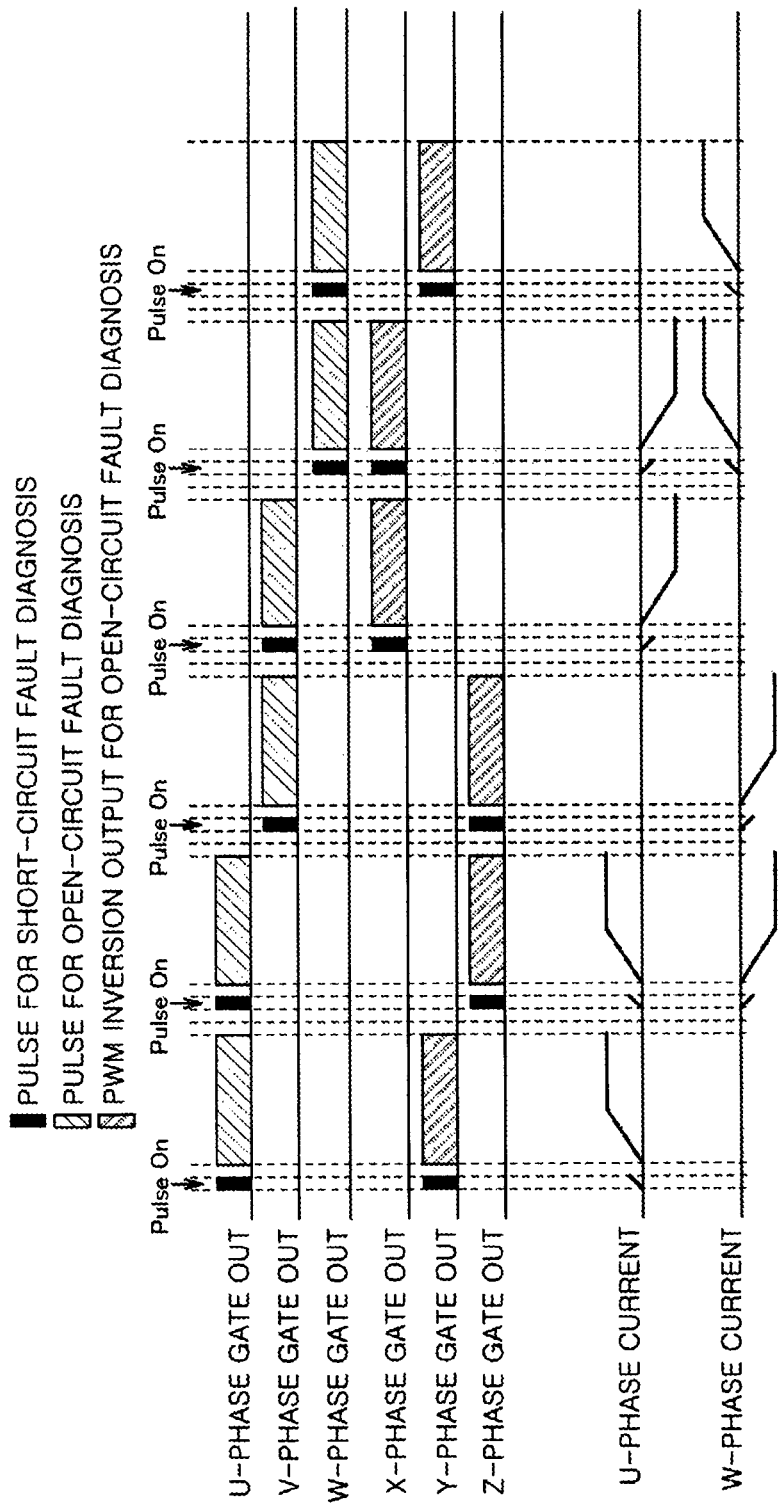
FIG. 27 is a diagram showing a pulse for short-circuit fault diagnosis and a PWM timing orronic chart for open-circuit fault diagnosis according to the seventh embodiment.

FIG. 25 is a schematic diagram showing a configuration of an inverter device according to the seventh embodiment, FIG. 26 is a diagram showing a control pattern of each switch element according to the seventh embodiment, and FIG. 27 is a diagram showing a pulse for short-circuit fault diagnostic and a PWM timing orronic chart for open-circuit fault diagnosis according to the seventh embodiment.

On the other hand, the reference numerals used in the seventh embodiment are different from those used in the first to fourth embodiments.

An inverter 100 according to the seventh embodiment supplies three-phase AC voltages (R phase, S phase, and T phase) to a three-phase AC motor AD, such as a three-phase motor. The inverter 100 includes an inverter circuit 2 connected to the AC motor AD and converting a DC voltage outputted from a DC power supply or a converter circuit to three-phase AC voltages or a diagnostic device 4 for diagnosing an abnormality of the inverter circuit 2 and the AC motor AD or connections.

The inverter circuit 2 includes three half bridge circuits (serial circuit portions) 21 to 23 including upper side switch elements 2U, 2V and 2W connected in series and lower switch elements 2X, 2Y and 2Z. The upper switch elements 2U, 2V and 2W and the lower switch elements 2X, 2Y and 2Z are, for example, insulated gate bipolar transistors (IGBTs).

On the other hand, the inverter circuit 2 configured as described above is provided with an inverter current detecting section 3 for detecting the current flowing through the inverter circuit 2 for at least two phases or more. The inverter current detecting section 3 of the present embodiment includes a U-phase current detecting section 31 for detecting a U-phase current and a W-phase current detecting section 32 for detecting a W-phase current. In addition, the inverter current detecting section 3 may include a shunt resistor connected in series to negative terminals of the lower switch element 2X, 2Y, and 2Z, and may detect the current flowing through the shunt resistor. In this case, the inverter current detecting section 3 may be provided in a single shunt type in which a common shunt resistor is connected to the negative sides of the three lower switch elements 2X, 2Y, 2Z, or in a three shunt type in which shunt resistors are respectively connected to the negative sides of the three lower switch elements 2X, 2Y, and 2Z, The diagnostic device 4 diagnoses the abnormality of the inverter circuit 2 and the abnormality of the AC motor AD or connections by controlling ON/OFF of the upper switch elements 2U, 2V and 2W and the lower switch elements 2X, 2Y and 2Z of the inverter circuit 2.

In detail, the diagnostic device 4 performs a first step of diagnosing a short-circuit fault of the AC motor AD or connections by controlling ON/OFF of the upper switch elements 2U, 2V, and 2W and the lower switch elements 2X, 2Y, and 2Z and using current obtained by the inverter current detecting section 3, and a second step of diagnosing an open-circuit fault of each of the switch elements 2U, 2V, 2W, 2X, 2Y, and 2Z by controlling the upper switch elements 2U, 2V, and 2W and the lower switch elements 2X, 2Y, and 2Z in a predetermined ON/OFF pattern and using a measurement result pattern of the current obtained by the inverter current detecting section 3.

Hereinafter, the diagnostic method in each step will be described.

In the first step, the diagnostic device 4 controls ON/OFF of the upper switch elements 2U, 2V and 2W and the lower switch elements 2X, 2Y and 2Z, to output a short pulse voltage to the AC motor AD.

Here, the pulse width of the short pulse voltage output to the AC motor AD is set so that the current value obtained by the inverter current detecting section 3 does not become a short-circuit current equal to or greater than a predetermined value unless the AC motor AD or the connection is short-circuited, and thus an overcurrent protective section installed in the inverter circuit 2 is not driven, and so that the current value obtained by the inverter current detecting section 3 becomes a short-circuit current equal to or greater than the predetermined value if the AC motor AD or the connection is short-circuited and thus the overcurrent protective section is driven.

In detail, referring to FIGS. 26 and 27, in the first step, the diagnostic device 4 outputs the short pulse voltage to the AD by controlling ON/OFF of the switch elements 2U, 2V, 2W, 2X, 2Y, and 2Z as shown in (2-1) to 02-6) below.

(1-1) The upper switch element 2U and the lower switch element 2Y are turned on to output a short pulse to the AC motor AD and the other switch elements 2V, 2W, 2X and 2Z are turned off. In this case, U-phase current and V-phase current flow through the inverter circuit 2 and the AC motor AD. Then, the U-phase current is detected by the U-phase current detecting section 31.

(1-2) The upper switch element 2U and the lower switch element 2Z are turned on to output a short pulse to the AC motor AD and the other switch elements 2V, 2W, 2X and 2Y are turned off.

In this case, U-phase current and W-phase current flow through the inverter circuit 2 and the AC motor AD. Then, the U-phase current is detected by the U-phase current detecting section 31 and the W-phase current is detected by the W-phase current detecting section 32.

(1-3) The upper switch element 2V and the lower switch element 2Z are turned on to output a short pulse to the AC motor AD and the other switch elements 2U, 2W, 2X and 2Y are turned off.

In this case, V-phase current and W-phase current flow through the inverter circuit 2 and the AC motor AD. Then, the W-phase current is detected by the W-phase current detecting section 32.

(1-4) The upper switch element 2V and the lower switch element 2X are turned on to output a short pulse to the AC motor AD, and the other switch elements 2U, 2W, 2Y, and 2Z are turned off.

In this case, U-phase current and V-phase current flow through the inverter circuit 2 and the AC motor AD. Then, the U-phase current is detected by the U-phase current detecting section 31.

(1-5) The upper switch element 2W and the lower switch element 2X are turned on to output a short pulse to the AC motor AD and the other switch elements 2U, 2V, 2Y and 2Z are turned off.

In this case, U-phase current and W-phase current flow through the inverter circuit 2 and the AC motor AD. Then, the U-phase current is detected by the U-phase current detecting section 31, and the W-phase current is detected by the W-phase current detecting section 32.

(1-6) The upper switch element 2W and the lower switch element 2Y are turned on to output a short pulse to the AC motor AD, and the other switch elements 2U, 2V, 2X, and 2Z are turned off.

In this case, V-phase current and W-phase current flow through the inverter circuit 2 and the AC motor AD. Then, the W-phase current is detected by the W-phase current detecting section 32.

By sequentially performing the short-pulse outputs of (1-1) to (1-6) and detecting the phase current in each state, a short-circuit fault phase in the AC motor (AD) or connections is identified.

For example, when the U phase of the AC motor (AD) or the connection is short-circuited, the current obtained by the U phase current detecting section 31 in (1-1), (1-2), (1-4) and (1-5) is a short-circuit current, and in (1-3) and (1-6), a normal current is detected.

On the other hand, in the second step, the diagnostic device 4 diagnoses an open-circuit fault of the upper switch elements 2U, 2V and 2W and the lower switch elements 2X, 2Y and 2Z in the half bridge circuits 21 to 23 by performing on/off control of the upper switch elements 2U, 2V and 2W and the lower switch elements 2X, 2Y and 2Z according to a pattern in which the AC motor (three-phase motor) rotates in a forward direction, and using the current obtained from the inverter current detecting section.

FIGS. 26 and 27, the ON/OFF patterns in which the AC motor (three-phase motor) AD performs the forward rotation in the open-circuit fault diagnosis of the switch elements 2U, 2V, 2W, 2X, and 2Y, are shown in (2-1) to (2-6) below.

(2-1) The upper switch element 2U and the lower switch element 2Y are turned on/off by a PWM control, and the other switch elements 2V, 2W, 2X, and 2Z are turned off.

In this case, U-phase current and V-phase current flow through the inverter circuit 2 and the AC motor AD. Then, the U-phase current is detected by the U-phase current detecting section 31.

(2-2) The upper switch element 2U and the lower switch element 2Z are turned on/off by a PWM control, and the other switch elements 2V, 2W, 2X, and 2Y are turned off.

In this case, U-phase current and W-phase current flow through the inverter circuit 2 and the AC motor AD. Then, the U-phase current is detected by the U-phase current detecting section 31, and the W-phase current is detected by the W-phase current detecting section 32.

(2-3) The upper switch element 2V and the lower switch element 2Z are turned on/off by a PWM control, and the other switch elements 2U, 2W, 2X, and 2Y are turned off.

In this case, V-phase current and W-phase current flow through the inverter circuit 2 and the AC motor AD. Then, the W-phase current is detected by the W-phase current detecting section 32.

(2-4) The upper switch element 2V and the lower switch element 2X are turned on/off by PWM control, and the other switch elements 2U, 2W, 2Y, and 2Z are turned off.

In this case, U-phase current and V-phase current flow through the inverter circuit 2 and the AC motor AD. Then, the U-phase current is detected by the U-phase current detecting section 31.

(2-5) The upper switch element 2W and the lower switch element 2X are turned on/off by PWM control, and the other switch elements 2U, 2V, 2Y and 2Z are turned off.

In this case, U-phase current and W-phase current flow through the inverter circuit 2 and the AC motor AD. Then, the U-phase current is detected by the U-phase current detecting section 31, and the W-phase current is detected by the W-phase current detecting section.

(2-6) The upper switch element 2W and the lower switch element 2Y are turned on/off by a PWM control, and the other switch elements 2U, 2V, 2X, and 2Z are turned off.

In this case, V-phase current and W-phase current flow through the inverter circuit 2 and the AC motor AD. Then, the W-phase current is detected by the W-phase current detecting section 32.

By sequentially performing the above-mentioned ON/OFF controls of (2-1) to (2-6) and detecting the phase current in each state, a switch element having an open-circuit fault among the switch elements 2U, 2V, 2W, 2X, 2Y, and 2Z is identified.

For example, when the upper switch element 2U has an open-circuit fault, the current obtained by the U-phase current detecting section 31 in (2-1) and (2-2) becomes zero, and in (2-3) to (2-6), a normal current is detected.

By sequentially performing the above-mentioned ON/OFF control of (2-1) to (2-6), the open-circuit fault diagnosis of the switch elements 2U, 2V, 2W, 2X, 2Y and 2Z is carried out by only rotating the AC motor AD in the forward rotation direction at the maximum rotation number one turn per several minutes.

However, as shown in FIG. 27, the diagnostic device 4 of the present embodiment performs the output of the short-pulse voltage of the first step before flowing a current between each phase (between the U-V phases, the U-W phases, and the V-W phases) in the second step. That is, the diagnostic device 4 sequentially performs the output of the short-pulse voltage of the first step and the PWM control-based switch element electric connection of the second step between each phase.

In detail, the diagnostic device 4 performs (1-1) of the first step before (2-1) of the second step, performs (1-2) of the first step before (2-2) of the second step, performs (1-3) of the first step before (2-3) of the second step, performs (1-4) of the first step before (2-4) of the second step, performs (1-5) of the first step before (2-5) of the second step, and performs (1-6) of the first step before (2-6) of the second step.

According to the inverter 100 configured as described above, the diagnostic device 4 diagnoses a short-circuit fault of the AC motor or the connection from the current obtained by outputting the short-pulse voltage to the AC motor AD. Accordingly, a short-circuit fault of a load side (the AC motor AD or the connection) is diagnosed without damaging the inverter circuit 2 by using the inverter current detecting section 3 used for a normal operation.

In this case, since the pulse width of the short pulse voltage is set so that the current obtained by the inverter current detecting section 3 becomes a short-circuit current equal to or greater than a predetermined value only when the AC motor AD or the connection is short-circuited, the short-circuit fault of the AC motor AD or the connection is diagnosed by using the overcurrent protective section installed in the inverter circuit 2.

Since the diagnostic device 4 diagnoses the open-circuit fault of the switch elements 2U, 2V, 2W, 2X, 2Y, and 2Z from the measurement result pattern of the current obtained by controlling the upper switch elements 2U, 2V and 2W and the lower switch elements 2X, 2Y and 2Z with a predetermined ON/OFF pattern, an open-circuit fault of the switch elements 2U, 2V, 2W, 2X, 2Y, and 2Z of the inverter circuit 2 is diagnosed by using the inverter current detecting unit 3 used for a normal operation, without damaging the inverter circuit 2.

In this case, since a current for forward rotation of the AC electric motor AD is supplied, a current may be supplied at a level that is not erroneously detected even in the accuracy of the current detecting section normally provided in the inverter circuit 2, thereby preventing diagnosis errors. According to the above-mentioned ON/OFF patterns of (2-1) to (2-6), the open-circuit fault diagnosis of the switch elements 2U, 2V, 2W, 2X, 2Y, and 2Z may be performed by only rotating the AC motor AD forward one turn per several minutes.

On the other hand, the present invention is not limited to the seventh embodiment.

For example, the inverter current detecting section may include a V-phase current detecting section for detecting a V-phase current in addition to a U-phase current detecting section and a W-phase current detecting section.

Further, the ON/OFF pattern of each switch element in the second step is not limited to the above-described embodiment, as long as the AC motor rotates in the forward direction.

When the diagnostic device according to the seventh embodiment is capable of diagnosing the open-circuit fault of the switch element of the inverter circuit by using another method, an open-circuit fault of the AD motor, an open-circuit fault of connection between the inverter circuit and the AD motor AD, and a fault of the current detecting section also may be diagnosed by using the method of the seventh embodiment.

Hereinafter, an AC motor driving apparatus according to the eighth embodiment will be described with reference to the drawings.

Figure 28:
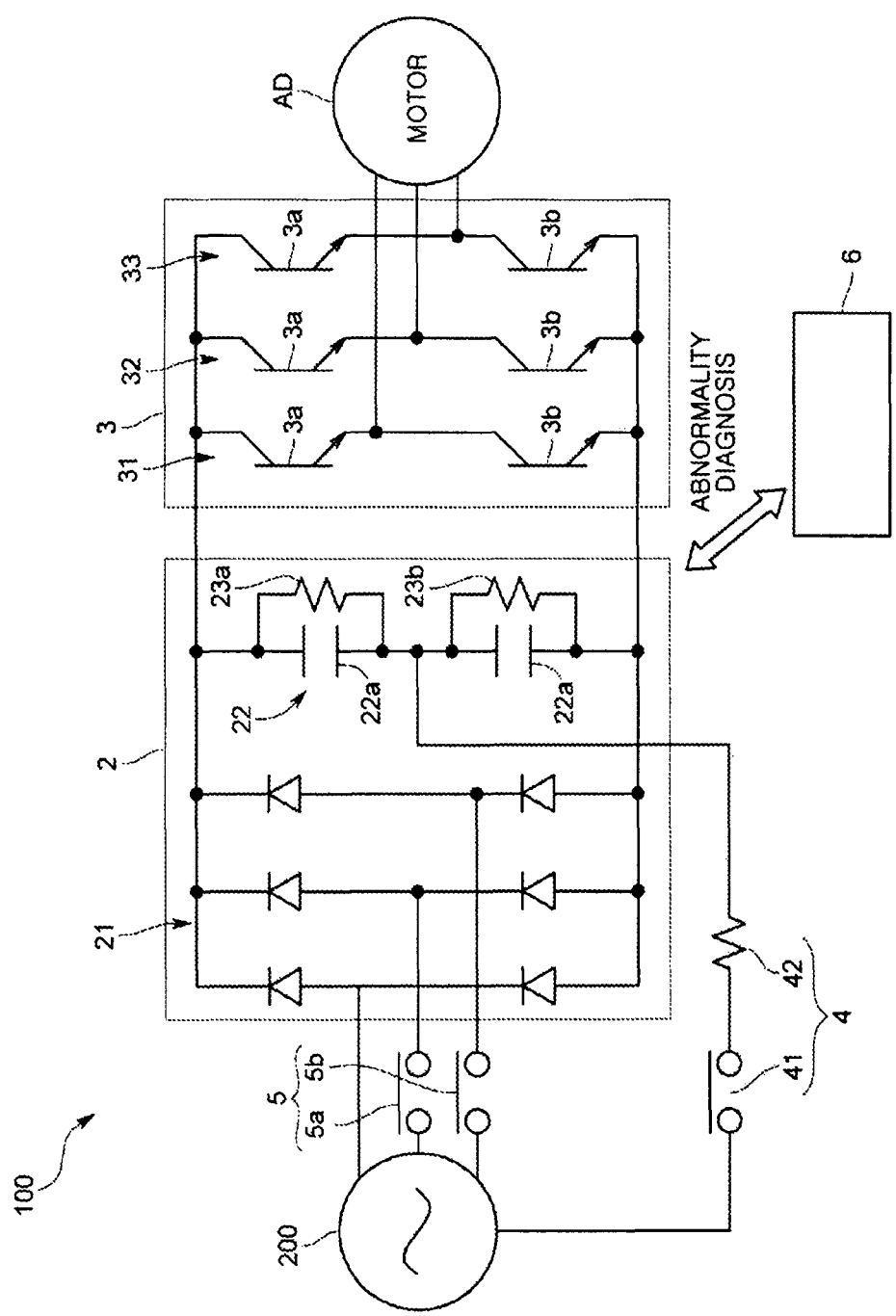
FIG. 28 is a schematic diagram illustrating a configuration of an AC motor driving apparatus according to the eighth embodiment.
Figure 29:
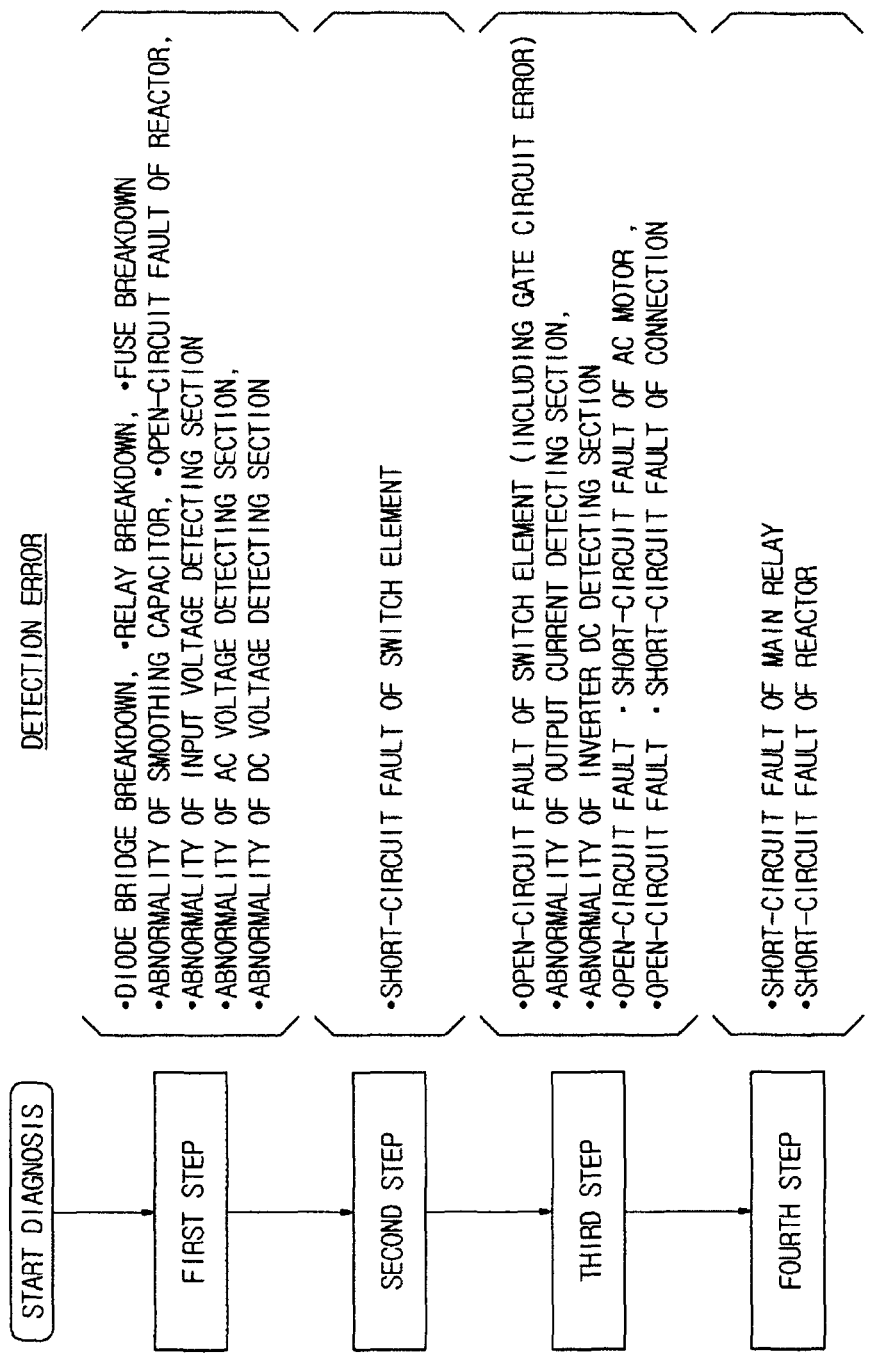
FIG. 29 is a diagram showing a diagnostic process of a diagnostic device according to the eighth embodiment. is a view for explaining a communication system according to an embodiment.

FIG. 28 is a schematic diagram showing a configuration illustrating an AC motor driving apparatus according to the eighth embodiment, and FIG. 29 is a diagram showing a diagnostic procedure of a diagnostic device according to the eighth embodiment.

On the other hand, the reference numerals used in the eighth embodiment are different from those used in the first to seventh embodiments.

An AC motor driving apparatus 100 according to the eighth embodiment supplies three-phase AC voltages (R phase, S phase, and T phase) to a three-phase AC motor AD, e.g. a three-phase motor, to drive the three-phase AC motor AD. Referring to FIG. 28, the AC motor driving apparatus 100 includes a converter circuit 2 configured to convert three-phase AC voltages from a three-phase AC power supply 200 into a direct-current voltage, an inverter circuit 3 connected to the AC motor AD and configured to convert a direct voltage to three-phase AC voltages, and a diagnostic device 6 configured to diagnose an abnormality of the inverter circuit 3 connected to the AC motor AD, the converter circuit 2, the inverter circuit 3 and the AC motor AD, or connections.

The converter circuit 2 includes a rectifying section 21 for rectifying three-phase AC voltages and a smoothing section 22 for smoothing the DC voltage rectified by the rectifying section 21. The rectifying section 21 is a three-phase full-bridge diode circuit. The smoothing section 22 is a smoothing coil capacitor connected between DC terminals, the output side of the rectifying section 21. In the present embodiment, two smoothing coil capacitors 22a and 22b connected in series are provided between the DC terminals. Reference numerals 23a and 23b denote discharging resistors for discharging the charges of the smoothing coil capacitors 22a and 22b.

The converter circuit 2 is provided with an inrush current preventing section 4 for preventing an inrush current from flowing into the smoothing coil capacitors 22a and 22b and a switching section 5 for supplying an AC voltage through a path different from a path of the inrush current preventing section 4.

The inrush current preventing section 4 includes an inrush relay 41 and a resistor 42. In this embodiment, one end of the inrush current preventing section 4 is connected to a neutral phase (N phase) of the three-phase AC power supply 200, and the other end connected to a connection point of the smoothing coil capacitors 22a and 22b. The inrush relay 41 is a mechanical switch, such as an electronic relay. The inrush current preventing section 4 turns on the inrush relay 41 so that the R phase AC voltage is rectified to A DC voltage by the rectifying section 21 and IS applied to the smoothing coil capacitors 22a and 22b so that the smoothing coil capacitors 22a and 22b are charged.

The switching section 5 includes main relays 5a and 5b provided between an input terminal of the rectifying section 21 and the three-phase AC power supply 200 to input the three-phase AC voltages to the converter circuit 2. In detail, the main relays 5a and 5b are mechanical switch elements, for example, electromagnetic relays provided on the input sides of the rectifying section 21 in the S phase and the T phase of the three phases. By controlling on/off of the main relays 5*a* and 5*b*, three-phase AC voltages are supplied to the three-phase AC motor AD.

On the other hand, the converter circuit 2 is provided with an AC voltage detecting section (not shown) for detecting the three-phase AC voltages inputted to the converter circuit 2 for each phase. The converter circuit 2 is also provided with a DC voltage detecting section (not shown) for detecting a DC voltage applied to the smoothing section 22.

The inverter circuit 3 includes three half bridge circuits 31 to 33 each including an upper switch element 3*a* and a lower switch element 3*b*. The upper switch elements 3*a* and the lower switch elements 3*b* each are, for example, insulated gate bipolar transistors (IGBTs).

On the other hand, the inverter circuit 3 configured as described above is provided with an inverter current detecting section (not shown) for detecting the current flowing through the inverter circuit 3 for each phase.

Referring to FIG. 29, the diagnostic device 6 according to the present embodiment includes a first step of diagnosing an abnormality of the converter circuit 2, a second step of diagnosing a short-circuit fault of the switch elements 3*a* and 3*b* of the inverter circuit 3, and a third step of diagnosing an open-circuit fault of the switch elements 3*a* and 3*b* of the inverter circuit 3, and an abnormality of the AC motor AD or the connection are sequentially performed.

Hereinafter, the control of each section of the diagnostic device 6 and details of diagnosis in each step will be described in detail with reference to FIG. 29.

<First Step>

The diagnostic device 6 diagnoses the abnormality of the converter circuit 2 by switching the path by controlling the inrush current preventing section 4 and the switching section 5.

The diagnostic device 6 is configured to, before controlling the switching section 5 and the inrush current preventing section 4, that is, in off-states of the main relays 5*a* and 5*b* and the inrush relay 41, determine whether or not an AC voltage inputted to the converter circuit 2 is normal by using an AC voltage obtained from the AC voltage detecting section.

When the AC voltage inputted to the converter circuit 2 is determined to be normal, the diagnostic device 6 turns on the inrush current preventing section 4 and turns off the switching section 5 such that the smoothing coil capacitors 22*a* and 22*b* are charged up to a predetermined first DC voltage based on the DC voltage obtained from the DC voltage detecting section.

After confirming that the DC voltage charged in the smoothing coil capacitors 22*a* and 22*b* has reached the first DC voltage, the diagnostic device 6 turns off the inrush current preventing section 4 and turns on the switching section 5 ON so that the smoothing coil capacitors 22*a* and 22*b* are further charged from the first DC voltage.

In this case, the diagnostic device 6 checks whether the DC voltage charged in the smoothing section 22 reaches a predetermined second DC voltage, based on the DC voltage obtained from the DC voltage detecting section. When the DC voltage charged in the smoothing section 22 does not reach the first DC voltage or the second DC voltage by these series of operations, it is determined that the converter circuit 2 is abnormal. In detail, the abnormality of each section of the converter circuit 2 is diagnosed from the waveform of the AC voltage obtained by the AC voltage detecting section and the DC voltage obtained by the DC voltage detecting section.

In this first step, the diagnostic device 6 is configured to detect the breakdown of the bridge diode of the rectifier circuit 21, the breakdown of the main relays 5*a* and 5*b* or the inrush relay 41, the breakdown of a fuse installed between the converter circuit 2 and the AC power supply 200, the abnormality of the smoothing coil capacitors 22*a* and 22*b*, the open-circuit fault of a reactor, which may be installed between the rectifying section 21 and the smoothing coil capacitors 22*a* and 22*b*, the abnormality of the AC voltage detecting section, and the abnormality of the DC voltage detecting section.

<Second Step>

In the second step, the diagnostic device 6 turns on one of the two switch elements 3*a* and 3*b* for each of the plurality of half bridge circuits 31 to 33 and when a short-circuit current of a predetermined value or above flows through the inverter circuit 3, diagnoses that the other one of the two switch elements 3*a* and 3*b* has a short-circuit fault.

In detail, only one of the upper switch element 3*a* and the lower switch element 3*b* of the R-phase half bridge circuit 31 is turned on, and when the DC current obtained from the inverter current detecting circuit is higher than or equal to a predetermined value, the diagnostic device 6 determines that the other one of the upper switch element 3*a* and the lower switch element 3*b* has a short-circuit fault. For the S-phase half bridge circuit 32 and the T-phase half bridge circuit 33, a short-circuit fault of the switch elements 3*a* and 3*b* is diagnosed in the same manner as the above.

<Third Step>

In the third step, the diagnostic device 6 controls ON and OFF of the switch elements 3*a* and 3*b* of the inverter circuit 3 so that an AC is supplied to the AC motor AD, and diagnose the open-circuit fault of the switch elements 3*a* and 3*b* and the abnormality of the AC motor AD or the connection by using the three-phase AC voltage applied to the AC motor AD or the three-phase AC flowing in the AC motor AD. On the other hand, the three-phase AC voltage applied to the AC motor AD is obtained from an output voltage detecting section (not shown) for detecting an output voltage of the inverter circuit 3. Further, the three-phase AC flowing in the AC motor AD is obtained from the inverter current detecting section.

In detail, when all or one of the three-phase alternating voltages applied to the AC motor AD is less than a predetermined value or the three-phase AC flowing in the AC motor AD is less than a predetermined value, the diagnostic device 6 diagnoses that the switch elements 3*a* and 3*b* of circuit 3 has an open-circuit fault, the inverter current detecting section is abnormal, the internal coil of the AC motor AD has open/short-circuit fault, and the connection has an open/short-circuit fault.

The diagnostic device 6 is configured to, after confirming that the converter circuit 2, the inverter circuit 3, the AC motor AD, and the connection are normal through the first to third steps, perform the fourth step of diagnosing an abnormality of the switching section 5 from a temporal change of the DC voltage of the smoothing coil capacitors 22*a* and 22*b* by applying current to the inverter circuit 3 and the AC motor ADAD.

In detail, the diagnostic device 6 performs forced discharge allowing the charges of the smoothing coil capacitors 22*a* and 22*b* to flow through the inverter circuit 3 and the AC motor AD, and diagnoses the abnormality of the switching section 5 from the temporal change of the DC of the smoothing coil capacitors 22*a* and 22*b* which is caused by the discharge and obtained by the DC voltage detecting section On the other hand, when the switching section 5 has a short-circuit fault, the temporal change of the DC voltage of the smoothing coil capacitors 22a and 22b is steady compared to when the switching section 5 is normal, so it may be diagnosed as a short-circuit fault.

In the case where a reactor is provided between the rectifying section 21 and the smoothing coil capacitors 22a and 22b, the diagnostic device 6 lowers the DC voltage of the smoothing coil capacitors 22a and 22b, and turns on the switching section 5 to energize the reactor. Then, the diagnostic device 6 compares the DC voltage obtained by the DC voltage detecting section after the voltage drop with the DC voltage obtained by the DC voltage detecting section when the reactor is energized, to diagnose disconnection of the reactor.

In the first to third steps described above, the diagnostic device 6 ends the fault diagnosis mode without entering the next step when an abnormality is diagnosed in any one of the steps.

According to the inverter 100 constructed as described above, the diagnostic device 6 identifies a fault region without damaging each section by sequentially performing the first step of diagnosing the abnormality of the converter circuit 2, the second step of diagnosing the short-circuit fault diagnosis of the switch elements 3a and 3b of the inverter circuit 3, and the third step of diagnosing the open-circuit fault of the switch elements 3a and 3b of the inverter circuit 3 and the abnormality of the AC motor AD or the connection.

On the other hand, the present invention is not limited to the eighth embodiment.

For example, the eighth embodiment is illustrated as including the AC voltage detecting section, but the diagnostic device 6 may be configured to estimate the AC voltage from the voltage waveform of the DC voltage rectified by the rectification section 21.

In addition, the AC motor driving apparatus 100 may include, instead of the AC voltage detecting section, a phase detecting section to detect a phase of an AC voltage such that the diagnostic device 6 estimates the AC voltage from the phase of the AC voltage obtained by the phase detecting section and a DC voltage obtained by the DC voltage detecting section.

The configurations of the first to eighth embodiments may be combined with each other.

For example, in the abnormality diagnosis of the reactor (coil) of the first embodiment, the diagnostic function of the diagnostic device of the third embodiment may be used. Further, in the abnormality diagnosis of the converter circuit of the first step of the eighth embodiment, the diagnostic function of the diagnostic device of the first and second embodiments may be used. Further, in the third step of the eighth embodiment, the diagnostic functions of the diagnostic device of the third to seventh embodiments may be used.

The converter, the inverter, and the AC motor driving apparatus according to the disclosed embodiments may be applied to an air conditioner, a compressor of a refrigerator, and the like. In detail, the converter, the inverter, and the AC motor driving apparatus according to the disclosed embodiments may be applied to supply power to a load, such as a motor used in a compressor of an air conditioner or a compressor of a refrigerator. At this time, after the converter converts (rectifies) the AC voltage supplied from the AC power supply to the DC voltage and smoothens the DC voltage, the inverter may convert the DC voltage into an AC voltage suitable for controlling the load. Accordingly, the air conditioner and the refrigerator to which the converter, the inverter, and the AC motor driving apparatus are applied may prevent the overvoltage or the overcurrent from occurring in a region to which the DC voltage is applied (a DC link).

The invention claimed is:

1. A converter comprising:
a converter circuit including:
an rectifying section configured to rectify an alternating current (AC) voltage, and
a smoothing section to smooth a direct current (DC) voltage rectified by the rectifying section;
an inrush current preventing section configured to prevent an inrush current from being supplied to the smoothing section;
a switching section configured to supply the AC voltage to the converter circuit through a path different from a voltage supply path of the inrush current preventing section; and
a diagnostic device configured to:
diagnose an abnormality of the converter circuit, and
determine an abnormal region of the converter circuit by controlling the inrush current preventing section and the switching section.

2. The converter of claim 1, further comprising:
an AC voltage detecting section configured to detect the AC voltage; and
a DC voltage detecting section configured to detect the DC voltage,
wherein the diagnostic device is further configured to determine the abnormal region of the converter circuit based on the AC voltage or the DC voltage.

3. The converter of claim 2, wherein the diagnostic device is configured to:
turn off the inrush current preventing section and turn off the switching section, and
determine an abnormality of the DC voltage detecting section based on the DC voltage.

4. The converter of claim 2, wherein the diagnostic device is configured to:
turn on the inrush current preventing section and turn off the switching section, and
determine the abnormal region of the converter circuit based on the DC voltage and the AC voltage.

5. The converter of claim 2, wherein the diagnostic device is further configured to:
turn off the inrush current preventing section and turn on the switching section, and
determine the abnormal region of the converter circuit.

6. The converter of claim 2, wherein the diagnostic device is further configured to:
discharge the smoothing section for a predetermined time by controlling the inrush current preventing section and the switching section, and
determine an abnormality of the smoothing section depending on whether a DC voltage detected by the DC voltage detecting section is lower than a predetermined reference value.

7. The converter of claim 2, wherein the converter circuit further comprises a reactor installed between the rectifying section and the smoothing section,
wherein the diagnostic device is further configured to
perform a voltage drop on a DC voltage charged in the smoothing section, and
diagnose an abnormality of the reactor by comparing:
a DC voltage detected by the DC voltage detecting section before the voltage drop,
a DC voltage detected by the DC voltage detecting section after the voltage drop, and a DC voltage obtained after the reactor is electrically connected by turning on the switching section.

8. The converter of claim 1, wherein the converter circuit further comprises:
an AC voltage phase detecting section configured to detect a phase of the AC voltage, and
a DC voltage detecting section configured to detect the DC voltage,
wherein the diagnostic device is further configured to determine the abnormal region of the converter circuit based on an AC voltage output pattern detected by the AC voltage phase detecting section and a DC voltage detected by the DC voltage detecting section.

9. The converter of claim 1, further comprising:
a power input section configured to input an AC voltage;
a coil installed between the power input section and the smoothing section;
a AC voltage detecting section configured to detect the AC voltage input by the power input section; and
a DC voltage detecting section configured to measure the DC voltage which is smoothed by the smoothing section,
wherein the diagnostic device is further configured to:
control controls the power input section and the inrush current preventing section, and
diagnose a normality, a short-circuit fault, or a disconnection of the coil by using the AC voltage detected by the AC voltage detecting section or the DC voltage detected by the DC voltage detecting section.

10. An inverter comprising:
an inverter circuit comprising an upper switch element and a lower switch element connected in series to the upper switch element, the inverter circuit connected to an alternating current (AC) motor;
a current detecting section configured to detect current flowing through the inverter circuit; and
a diagnostic device configured to:
determine an abnormality of the inverter circuit by controlling turn-on and turn-off of the upper switch element and the lower switch element,
turn on or turn off the upper switch element and the lower switch element,
diagnose a short-circuit fault of the AC motor or a short-circuit fault of connection of the inverter circuit to the AC motor based on the current obtained from the current detecting section, and
diagnose an open-circuit fault of each of the upper and lower switch elements based on a measurement result pattern of the current detected by the current detecting section.

11. The inverter of claim 10, further comprising:
a bootstrap circuit that is charged by turning on the lower switch element and configured to drive the upper switch element; and
a capacitor voltage detecting section configured to detect a voltage charged in a capacitor of the bootstrap circuit,
wherein the diagnostic device is further configured to diagnose the abnormality of the inverter circuit, an abnormality of the AC motor, or an abnormality of the connection by using the voltage detected by the capacitor voltage detecting section.

12. An alternating current (AC) motor driving apparatus comprising:
a converter circuit configured to convert an AC voltage output by an AC power supply to a direct current (DC) voltage;
an inverter circuit configured to convert a DC voltage output from the converter circuit to an AC voltage by using a switch element, the inverter circuit connected to an AC motor; and
a diagnostic device configured to diagnose an abnormality of the converter circuit, an abnormality of the inverter circuit, an open-circuit fault of the switch element of the inverter circuit, an abnormality of the AC motor, or an abnormality of a connection between the inverter circuit and the AC motor.

13. An air conditioner comprising:
a converter circuit comprising:
a rectifying section configured to rectify an alternating current (AC) voltage, and
a smoothing section configured to smooth a direct voltage (DC) voltage rectified by the rectifying section;
an inrush current preventing section configured to prevent an inrush current from being supplied into the smoothing section;
a switching section configured to supply the AC voltage to the converter circuit through a path different from a voltage supply path of the inrush current preventing section; and
a diagnostic device configured to:
diagnose an abnormality of the converter circuit, and
determine an abnormal region of the converter circuit by controlling the inrush current preventing section and the switching section.

14. The air conditioner of claim 13, further comprising:
an AC voltage detecting section configured to detect the AC voltage; and
a DC voltage detecting section configured to detect the DC voltage,
wherein the diagnostic device is further configured to determine the abnormal region of the converter circuit based on the AC voltage or the DC voltage.

15. The air conditioner of claim 14, wherein the diagnostic device is configured to:
turn off the inrush current preventing section and turn off the switching section, and
determine an abnormality of the DC voltage detecting section based on the DC voltage.

16. The air conditioner of claim 14, wherein the diagnostic device is configured to:
turn on the inrush current preventing section and turn off the switching section, and
determine the abnormal region of the converter circuit based on the DC voltage and the AC voltage.

17. The air conditioner of claim 14, wherein the diagnostic device is further configured to:
turn off the inrush current preventing section and turn on the switching section, and
determine the abnormal region of the converter circuit.

18. The air conditioner of claim 14, wherein the diagnostic device is further configured to:
discharge the smoothing section for a predetermined time by controlling the inrush current preventing section and the switching section, and
determine an abnormality of the smoothing section depending on whether a DC voltage detected by the DC voltage detecting section is lower than a predetermined reference value.

\* \* \* \* \*